(12) United States Patent
Guo et al.

(10) Patent No.: US 10,475,548 B2
(45) Date of Patent: Nov. 12, 2019

(54) ULTRA-THIN DOPED NOBLE METAL FILMS FOR OPTOELECTRONICS AND PHOTONICS APPLICATIONS

(71) Applicant: THE REGENTS OF THE UNIVERSITY OF MICHIGAN, Ann Arbor, MI (US)

(72) Inventors: Lingjie Jay Guo, Ann Arbor, MI (US); Cheng Zhang, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 15/313,927

(22) PCT Filed: May 22, 2015

(86) PCT No.: PCT/US2015/032293
§ 371 (c)(1),
(2) Date: Nov. 23, 2016

(87) PCT Pub. No.: WO2015/179834
PCT Pub. Date: Nov. 26, 2015

(65) Prior Publication Data
US 2017/0200526 A1     Jul. 13, 2017

Related U.S. Application Data

(60) Provisional application No. 62/002,569, filed on May 23, 2014, provisional application No. 62/005,169, filed on May 30, 2014.

(51) Int. Cl.
*H01B 1/02*     (2006.01)
*H01L 33/42*    (2010.01)
(Continued)

(52) U.S. Cl.
CPC ............... *H01B 1/023* (2013.01); *C22C 5/06* (2013.01); *C23C 14/185* (2013.01);
(Continued)

(58) Field of Classification Search
None
See application file for complete search history.

(56) References Cited

U.S. PATENT DOCUMENTS

| | | | |
|---|---|---|---|
| 5,667,853 | A | 9/1997 | Fukuyoshi et al. |
| 6,900,461 | B2 | 5/2005 | Inoue et al. |

(Continued)

FOREIGN PATENT DOCUMENTS

| | | |
|---|---|---|
| CN | 1665678 A | 9/2005 |
| CN | 107077906 A | 8/2017 |

(Continued)

OTHER PUBLICATIONS

Extended European Search Report dated Dec. 5, 2017 in corresponding EP Application No. 15796599.7 (7 pages).

(Continued)

Primary Examiner — Eli S Mekhlin
(74) Attorney, Agent, or Firm — Harness, Dickey & Pierce, P.L.C.

(57) ABSTRACT

Electrically conductive, thin, smooth films are provided that comprise silver (Ag) and a conductive metal, such as aluminum (Al), titanium (Ti), nickel (Ni), chromium (Cr), gold (Au), magnesium (Mg), tantalum (Ta), germanium (Ge) or combinations thereof. In other alternative variations, electrically conductive, thin, smooth films are provided that comprise gold (Au) or copper (Cu) and a conductive metal, such as aluminum (Al), titanium (Ti), nickel (Ni), chromium (Cr), gold (Au), magnesium (Mg), tantalum (Ta), germanium (Ge) or combinations thereof. Such materials have excellent electrical conductivity, may be ultra-thin, flexible, (Continued)

transparent, and have low optical loss. Assemblies incorporating such films and methods of making the films are also provided. The assemblies may be used in photovoltaic and light emitting devices with high power conversion efficiencies or optical meta-materials that exhibit high transmittance and homogeneous response, among others.

21 Claims, 34 Drawing Sheets

(51) Int. Cl.
*H01L 31/0224* (2006.01)
*H01L 51/44* (2006.01)
*H01L 31/18* (2006.01)
*C23C 14/18* (2006.01)
*C23C 14/34* (2006.01)
*C23C 14/35* (2006.01)
*C22C 5/06* (2006.01)

(52) U.S. Cl.
CPC ........ *C23C 14/3464* (2013.01); *C23C 14/351* (2013.01); *H01B 1/02* (2013.01); *H01L 31/022425* (2013.01); *H01L 31/022491* (2013.01); *H01L 31/1884* (2013.01); *H01L 33/42* (2013.01); *H01L 51/442* (2013.01); *H01L 2933/0016* (2013.01); *Y02E 10/549* (2013.01)

(56) References Cited

U.S. PATENT DOCUMENTS

| 8,728,615 | B2 | 5/2014 | Nakayama et al. | |
|---|---|---|---|---|
| 2002/0037414 | A1* | 3/2002 | Cunningham | C03C 17/36 428/412 |
| 2003/0227250 | A1 | 12/2003 | Nee | |
| 2005/0008852 | A1* | 1/2005 | Hartig | C03C 17/36 428/336 |
| 2008/0038529 | A1* | 2/2008 | Nakayama | C23C 14/08 428/220 |
| 2009/0197045 | A1* | 8/2009 | Okada | C22C 5/06 428/141 |
| 2010/0193758 | A1* | 8/2010 | Tian | B82Y 10/00 257/2 |
| 2010/0255244 | A1 | 10/2010 | Kawaguchi et al. | |
| 2011/0155244 | A1* | 6/2011 | Suh | H01L 31/022425 136/261 |
| 2012/0012174 | A1* | 1/2012 | Wu | H01L 31/02168 136/256 |
| 2013/0098422 | A1* | 4/2013 | Chan | H01L 31/0465 136/244 |

FOREIGN PATENT DOCUMENTS

| EP | 1983528 A1 | 10/2008 |
|---|---|---|
| EP | 3146528 A1 | 3/2017 |
| JP | 2009194289 A | 8/2009 |
| JP | 2016184533 A | 10/2016 |
| KR | 20170010820 A | 2/2017 |
| WO | WO-2003096080 A2 | 11/2003 |
| WO | WO-2004110947 A1 | 12/2004 |
| WO | WO-2006030762 A1 | 3/2006 |
| WO | WO-2011/017037 A2 | 2/2011 |
| WO | WO-2014021325 A1 | 2/2014 |
| WO | 2016/153034 A1 | 9/2016 |

OTHER PUBLICATIONS

Guang Yang et al, "Optical properties of aluminum silver alloy films deposited by magnetron sputtering," Journal of Alloys and Compounds vol. 547, Jan. 15, 2013, pp. 23-28.

Zhang et al. "An ultrathin, smooth, and low-Loss Al-doped Ag film and its application as a transparent electrode in organic photovoltaics." Advanced Materials, vol. 26, No. Issue 32, Jun. 18, 2014. pp. 5696-5701. http://scholar.google.com/scholar.

International Search Report and Written Opinion of International Searching Authority issued in PCT/US2015/032293, dated Sep. 3, 2015; ISA/KR.

First Office Action and Search Report for corresponding Chinese Application No. 201580037756.6 dated Jun. 5, 2018 and correspondence dated Jun. 7, 2018 from Unitalen Attorneys at Law summarizing contents, 12 pages.

Gu, Deen et al., "Ultrasmooth and Thermally Stable Silver-Based Thin Films with Subnanometer Roughness by Aluminum Doping," ACS Nano, Sep. 11, 2014, vol. 8, No. 10, pp. 10343-10351.

Zhao, Dewei et al., "High-Performance Ta2O5/Al-Doped Ag Electrode for Resonant Light Harvesting in Efficient Organic Solar Cells," Advanced Energy Materials, 2015, vol. 5, 1500768 (8 pages).

* cited by examiner

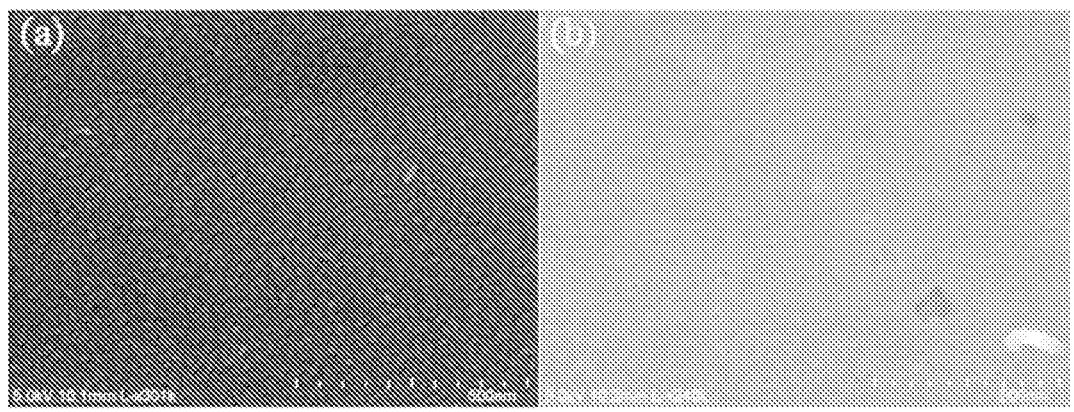
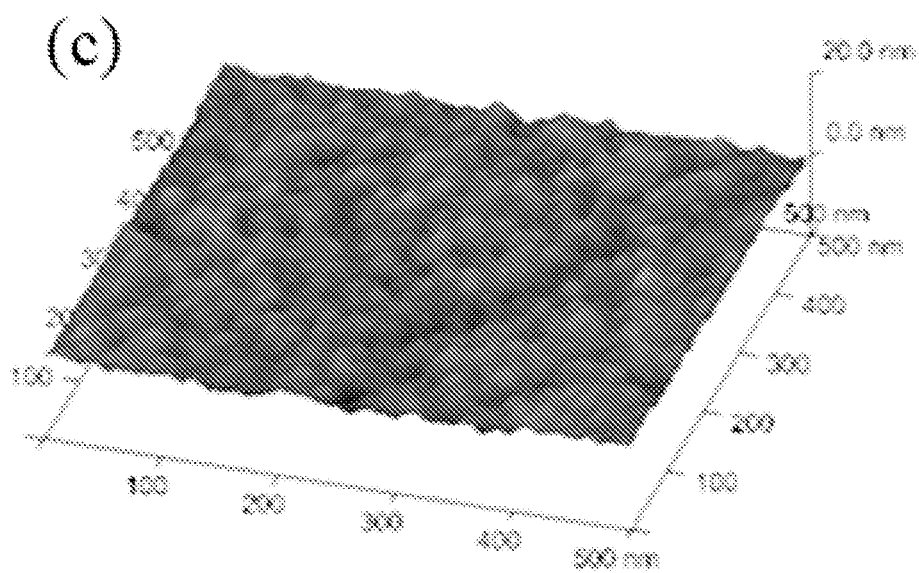
FIGS. 26(a)-26(c)

ULTRA-THIN DOPED NOBLE METAL FILMS FOR OPTOELECTRONICS AND PHOTONICS APPLICATIONS

CROSS-REFERENCE TO RELATED APPLICATIONS

This application is a National Stage of International Application No. PCT/US2015/032293, filed May 22, 2015, which claims the benefit of U.S. Provisional Application No. 62/002,569, filed on May 23, 2014 and U.S. Provisional Application No. 62/005,169, filed on May 30, 2014. The entire disclosures of each of the above applications are incorporated herein by reference.

GOVERNMENT RIGHTS

This invention is made with government support under DMR1120923 awarded by the National Science Foundation. The government has certain rights in the invention.

FIELD

The present disclosure relates to electrically conductive thin films comprising noble metals, like silver (Ag), doped with a distinct conductive metal, such as aluminum (Al), for use in various optoelectronic and photonic applications.

BACKGROUND

This section provides background information related to the present disclosure which is not necessarily prior art.

Thin metal films, such as thin noble metal films, have many applications in optoelectronics and nano-photonics. Among them, silver (Ag) is widely used due to its excellent conductivity (the highest among all metals) and low optical loss in the visible band of electromagnetic radiation. The low optical loss in the visible and near infrared (NIR) wavelength is partially due to the small free electron damping rate and the location of optical inter-band transitions in the ultraviolet (UV) wavelength range, making Ag one of the most favorable plasmonic materials. Thus, thin films of Ag have many important applications, for example, in optical metamaterials and as transparent conductors, among others.

Surface morphology and thickness of layers of silver are important for various applications. However, it has been very difficult to obtain a thin and smooth Ag film. Instead, thin films of pure Ag exhibit significant surface roughness and may be discontinuous. This is due to the inherent tendency of Ag to form three-dimensional (3D) islands during the film growth due to thermodynamics of the silver metal. Ag follows the Volmer-Weber growth mode, where the deposited Ag atoms initially form isolated islands. As the deposition continues, these islands grow and eventually connect to form a semi-continuous/conductive film. The critical thickness leading to a conductive film is defined as the percolation threshold, which is typically between about 10 nm and 20 nm. However, the roughness for such a Ag film is large, with a root-mean-squared (RMS) surface roughness value (from peaks to valleys) of about 6 nm for a 15 nm thick Ag film (in other words, the RMS surface roughness is about 40% of the overall thickness of the film). A rough surface morphology will impair the film conductivity and cause additional optical loss, even leading to non-conductive films when the islands cannot form percolation paths. Though increasing film thickness can alleviate the issue of film continuity, thick films have increased loss and homogeneity of the metamaterials are inevitably compromised.

To address the roughness issue for thin Ag films, a widely-employed approach has been to use a distinct germanium (Ge) wetting layer, usually about 1 to 2 nm thick, deposited on a substrate prior to depositing silver as a film. The presence of Ge leads to more than one order of magnitude reduction in surface roughness for thin (10-20 nm) Ag film. However, Ge is highly lossy in the visible range due to its small bandgap and therefore the transmittance of this bi-layer film is substantially reduced.

Alternatively, a mechanical pressing method has also been used to generate a smooth surface on relatively thick (e.g., at least 100 nm thick) silver films, but this technique requires a high working pressure, ultra-smooth molds, and has the potential to inflict damage on structures beneath the Ag layer. Moreover, the thickness of the silver layer can increase scattering, reduce transmissivity, and enhance loss. It would be desirable to develop methods for making electrically conductive thin films that provide the benefits of Ag, while avoiding many of the various disadvantages that have prevented widespread use in various optical and photonic applications and devices.

SUMMARY

This section provides a general summary of the disclosure, and is not a comprehensive disclosure of its full scope or all of its features.

In various aspects, the present disclosure provides new electrically conductive, smooth, thin films comprising silver (Ag). In certain variations, the electrically conductive films may comprise silver (Ag) at greater than or equal to about 80 atomic % of the total composition of the thin film and a distinct conductive metal present at greater than 0 atomic % to less than or equal to about 20 atomic % of the total composition of the thin film. In certain variations, the distinct conductive metal may comprise aluminum (Al), titanium (Ti), nickel (Ni), chromium (Cr), gold (Au), magnesium (Mg), tantalum (Ta), germanium (Ge), or combinations thereof. Such films may have a thickness of less than or equal to about 50 nm and a smooth surface.

In alternative variations, the present disclosure also contemplates new electrically conductive, smooth, thin films comprising highly conductive elements such as gold (Au) or copper (Cu). In certain variations, the electrically conductive films may comprise one of these highly conductive elements at greater than or equal to about 80 atomic % of the total composition of the thin film and a distinct conductive metal present at greater than 0 atomic % to less than or equal to about 20 atomic % of the total composition of the thin film. In certain variations, the distinct conductive metal may comprise aluminum (Al), titanium (Ti), nickel (Ni), chromium (Cr), gold (Au), magnesium (Mg), tantalum (Ta), germanium (Ge), or combinations thereof. Such films may have a thickness of less than or equal to about 50 nm and a smooth surface.

In other aspects, the present disclosure provides an assembly comprising a substrate and an electrically conductive thin film In certain variations, the electrically conductive films may comprise silver (Ag) at greater than or equal to about 80 atomic % of the total composition of the thin film and a distinct conductive metal present at greater than 0 atomic % to less than or equal to about 20 atomic % of the total composition of the thin film. In other alternative variations, the electrically conductive films may comprise gold (Au) or copper (Cu) at greater than or equal to about 80 atomic % of the total composition of the thin film and a distinct conductive metal present at greater than 0 atomic % to less than or equal to about 20 atomic % of the total composition of the thin film. The distinct conductive metal may comprise aluminum (Al), titanium (Ti), nickel (Ni), chromium (Cr), gold (Au), magnesium (Mg), tantalum (Ta), germanium (Ge), or combinations thereof. The electrically conductive thin film is disposed directly on the substrate without any wetting or buffer layers there between.

In yet other aspects, the present disclosure contemplates a method of making an electrically conductive thin film comprising co-depositing silver (Ag) and a distinct electrically conductive metal onto a substrate to form a continuous thin film. In certain variations, the distinct conductive metal may comprise aluminum (Al), titanium (Ti), nickel (Ni), chromium (Cr), gold (Au), magnesium (Mg), tantalum (Ta), germanium (Ge), or combinations thereof. The continuous thin film comprises silver (Ag) at greater than or equal to about 80 atomic % of the total composition of the thin film and greater than 0 atomic % and less than or equal to about 20 atomic % of the total composition of the thin film. The thin film optionally has a thickness of less than or equal to about 50 nm, a sheet resistance of less than or equal to about 100 Ohm/square, and a smooth surface. In alternative variations, such a method of making an electrically conductive thin film may comprise co-depositing gold (Au) or copper (Cu) (in place of silver (Ag)) with a distinct electrically conductive metal onto a substrate to form a continuous thin film in such a process.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 1(a)-1(c). FIG. 1(a) Set-up of co-deposition process for Ag and Al films according to certain embodiments of the present disclosure. FIG. 1(b) Schematic of an organic photovoltaic (OPV) device with a conventional ITO electrode. FIG. 1(c) Schematic of an organic photovoltaic (OPV) device with an ultra-thin Al-doped Ag film electrode according to certain aspects of the present disclosure.

FIGS. 2(a)-2(d). SEM images of FIG. 2(a) 9 nm pure Ag film, FIG. 2(b) 9 nm Al-doped Ag film according to certain embodiments of the present disclosure, FIG. 2(c) 100 nm pure Ag film, and FIG. 2(d) 100 nm Al-doped Ag film according to certain embodiments of the present disclosure. The insets in each figure are their corresponding tapping mode AFM images. All films are deposited on fused silica substrates. The scale bar for AFM images in FIGS. 2(a) and 2(b) is 80 nm and the scale bar in FIGS. 2(c) and 2(d) is 30 nm. The scale bar for SEM images is 500 nm. The 9 nm pure Ag film has an RMS roughness of 10.8 nm, 12 times higher than 9 nm Al-doped Ag film (0.86 nm). The 100 nm pure Ag film has an RMS roughness of 3.38 nm and $R_{max}$ of 28.3 nm, 3 times as those of 100 nm Al-doped Ag film (1.10 nm and 9.95 nm).

FIGS. 3(a)-3(b). FIG. 3(a) Transmittance spectrum of 9 nm pure Ag film. FIG. 3(b) Reflection spectra of Al-doped Ag films and Al-doped Ag/ZnO films according to certain embodiments of the present disclosure with different thickness (6, 7, 9, and 11 nm).

FIGS. 4(a)-4(d). Three-dimensional (3D) tapping-mode AFM images of Al-doped Ag films according to certain aspects of the present disclosure having thicknesses of: FIG. 4(a) 6 nm, FIG. 4(b) 7 nm, FIG. 4(c) 9 nm, and FIG. 4(d) 11 nm, showing the RMS roughness of 0.815 nm, 0.782 nm, 0.859 nm, and 1.00 nm, respectively. All films are deposited on fused silica substrates. The scan size is 500 nm×500 nm.

FIG. 5. 3D Tapping-mode AFM image of bare fused silica substrate. The scan size is 500 nm×500 nm. The RMS roughness is 0.195 nm and $R_{max}$ is 1.81 nm.

FIG. 6. XPS spectrum for a "300 W Ag and 200 W Al" sputtering combination is recorded by survey scanning. The atomic concentration of Al is determined from the peak areas of Al2p and Ag3d by their respective atomic sensitivity factors.

FIGS. 7(a)-7(b). FIG. 7(a) Schematic of ellipsometry measurement procedure for interference enhancement method. FIG. 7(b) Thickness fitting uniqueness of 6 nm Al-doped Ag film.

FIGS. 8(a)-8(d). Transmittance spectra of FIG. 8(a) Al-doped Ag films and FIG. 8(b) Al-doped Ag/ZnO films with different thickness (6, 7, 9, and 11 nm), in which ITO and ITO/ZnO films are shown as well. FIG. 8(c) ITO/ZnO (left side) and 7 nm Al-doped Ag/ZnO (right side) transparent conductors in front of a colored logo. The inset of in FIG. 8(a) compares the dependence of the imaginary part of the complex dielectric function on the wavelength for Al-doped Ag films with different thickness (6, 7, 9, and 11 nm). FIG. 8(d) Sheet resistance versus Al-doped Ag film thickness (black: Al-doped Ag film; red: Al-doped Ag/ZnO film; blue: Al-doped Ag film after annealing in $N_2$ environment).

FIGS. 9(a)-9(b). Transmittance spectra of FIG. 9(a) 7 nm Al-doped Ag films and FIG. 9(b) 7 nm Al-doped Ag/ZnO films with different Al doping concentrations (L2 Al-doped Ag, L1 Al-doped Ag, N Al-doped Ag, H1 Al-doped Ag, H2 Al-doped Ag).

FIG. 10. Comparison of optical transmittance (at 550 nm) versus sheet resistance for our work Al-doped Ag/ZnO and other reported works: carbon nanotubes (CNT), graphene, stack of ITO/Ag/ITO, stack of $MoO_3$/Ag/$MoO_3$, nickel thin films, silver nanowires (AgNW), stack of ZnO/AgNW/ZnO, and PEDOT:PSS.

FIGS. 11(a)-(b). SEM images of 9 nm Al-doped Ag films are shown in FIG. 11(a) depicting before and FIG. 11(b) depicting after annealing treatment (at 150° C. in $N_2$ environment for 15 min). Scale bars are 500 nm.

FIGS. 12(a)-12(b). FIG. 12(a) J-V characteristics of an organic photovoltaic device (OPV) incorporating a conventional ITO electrode and a comparative OPV incorporating an ultra-thin Al-doped Ag film electrode in accordance with certain aspects of the present disclosure. FIG. 12(b) shows EQEs (external quantum efficiency) of the ITO based electrode and ultra-thin Al-doped Ag based electrodes in comparative OPVs.

FIGS. 13(a)-13(d). FIG. 13(a) shows TAEs and EQEs of an OPV incorporating a conventional ITO electrode and OPV incorporating a 7 nm thick Al-doped Ag film electrode in accordance with certain aspects of the present disclosure. FIG. 13(b) shows EQE and TAE enhancements of 7 nm Al-doped Ag based OPV device over an ITO based OPV device, as well as the normalized absorption spectrum of an active layer (PBDTTT-C-T:$PC_{70}BM$) and normalized photon density of AM1.5G solar light. Simulation of the optical field intensity ($|E|^2$) distribution versus position and wavelength in FIG. 13(c) ITO based device and FIG. 13(d) 7 nm Al-doped Ag based device, where the enhanced optical field in the active layer around 800 nm is responsible for the measured EQE enhancement at the same wavelength range shown in FIG. 13(b).

FIGS. 14(a)-14(b). FIG. 14(a) Bendability test of the devices with conventional PET/ITO and PET/Al-doped Ag films as electrodes in accordance with certain aspects of the present teachings with bending times. FIG. 14(b) Sheet resistance of Al-doped Ag film versus bending times. The inset shows a photo of Al-doped Ag film on PET substrate.

FIG. 15. Dependence of the power conversion efficiency (PCE) of the device with Al-doped Ag film as electrode on the storage time.

FIG. 16. Imaginary part of permittivity at 1550 nm of an aluminum-doped silver film according to certain aspects of the present disclosure over time. The film shows stable performance after more than 3 weeks in air.

FIG. 17. Film optical property improvement with annealing of an aluminum-doped silver film according to certain aspects of the present disclosure. Loss (denoted by the imaginary part of permittivity) is significantly reduced by annealing and approaches that of bulk silver.

FIGS. 18(a)-18(d). FIG. 18(a) Exemplary metamaterial device structure with 4 periods of alternating 7 nm Al-doped Ag films and 22 nm $Ta_2O_5$ layers. FIG. 18 (b) shows measured transmittance at normal incidence, showing high and smooth response. FIG. 18(c)-18(d) show measured in-plane and out-of-plane dielectric functions. Beyond 610 nm, the structure shows hyperbolic dispersion characteristics.

FIGS. 19(a)-19(d). Representative surface morphologies by AFM for: FIG. 19(a) 15 nm pure Ag film on $SiO_2$/Si (100), FIG. 19(b) 15 nm Al-doped Ag (AA-130) film on $SiO_2$/Si(100), FIG. 19(c) 6 nm AA-130 film on $SiO_2$/Si (100), and FIG. 19(d) $SiO_2$/Si(100) substrate. The 15 nm Ag film has an RMS roughness of 6.87 nm, which is about 16 times larger than the 15 nm Al-doped Ag (AA-130) film (0.43 nm). The 6 nm AA-130 film has a RMS roughness of 0.37 nm, and the RMS roughness of a $SiO_2$/Si(100) substrate is 0.10 nm.

FIGS. 20(a)-20(b). The transmittance spectra of FIG. 20(a) pure Ag films and FIG. 20(b) Al-doped Ag (AA-130) films according to certain aspects of the present disclosure with varying thicknesses (6 nm, 8 nm, 9 nm, 10 nm, 11 nm of pure Ag films in FIGS. 20(a) and 3 nm, 4 nm, 5 nm, 6 nm of Al-doped Ag films in FIG. 20(b)).

FIG. 21. RMS roughness of Al-doped Ag films co-deposited by the different sputtering power of Al target with 200 W power of Ag target.

FIG. 22. The evolution of RMS roughness of 10 nm pure Ag film and 10 nm Al-doped Ag (AA-130) films according to certain aspects of the present disclosure with time under ambient atmosphere at room temperature.

FIGS. 23(a)-23(d). SEM micrographs (scale bars=1 μm) of FIG. 23(a) 15 nm as-deposited, and FIG. 23(b) annealed pure Ag films on $SiO_2$/Si in $N_2$ at 300° C.;

FIG. 23(c) 15 nm as-deposited, and FIG. 23(d) annealed Al-doped Ag films on $SiO_2$/Si in $N_2$ at 300° C.; The insets in FIGS. 23(c) and 23(d) are AFM images of 15 nm as-deposited and annealed Al-doped Ag films on $SiO_2$/Si with the RMS roughness of 0.43 nm and 0.45 nm, respectively.

FIGS. 24(a)-24(d). The 2D AFM images of FIG. 24(a) 3 nm pure Ag films, FIG. 24(b) 3 nm Al-doped Ag films, FIG. 24(c) 15 nm pure Ag films, and FIG. 24(d) 15 nm Al-doped Ag films on $SiO_2$/Si(100) substrates.

FIGS. 25(a)-25(b). The composition depth profiles of FIG. 25(a) 50 nm pure Ag film and FIG. 25(b) 50 nm Al-doped Ag film.

FIGS. 26(a)-26(d). FIG. 26(a) is an SEM picture of 7.5 nm Al-doped Ag film as deposited. FIG. 26(b) SEM picture of 7.5 nm Al-doped Ag after 500° C. annealing treatment for 3 minutes. FIG. 26(c) is an AFM picture of film in FIG. 26(a) with a RMS roughness of 0.773 nm. FIG. 26(d) is an AFM picture of film in FIG. 26(b) with a RMS roughness of 0.836 nm.

Figures 29A, 29B, 29C, 29D:
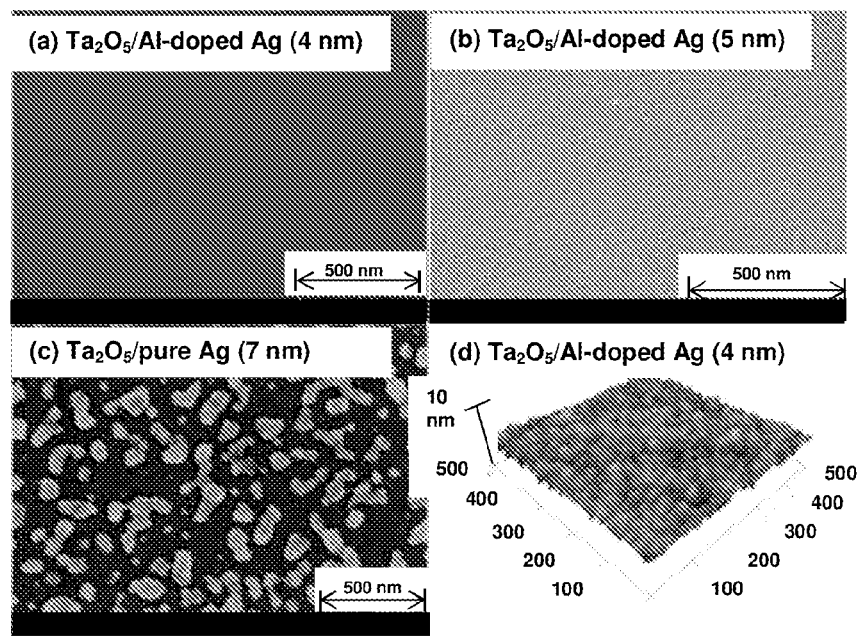

FIGS. 29(a)-29(d). SEM images of FIG. 29(a) shows $Ta_2O_5$/Al-doped Ag (4 nm thickness), FIG. 29(b) shows $Ta_2O_5$/Al-doped Ag (5 nm), FIG. 29(c) shows $Ta_2O_5$/pure Ag (7 nm), and FIG. 29(d) shows an AFM image of $Ta_2O_5$/Al-doped Ag (4 nm) with an RMS roughness of 0.76 nm. All films are deposited on fused silica substrates. The scale bar for SEM images is 500 nm. The scale bar for AFM image is 10 nm.

Figures 30A, 30B:
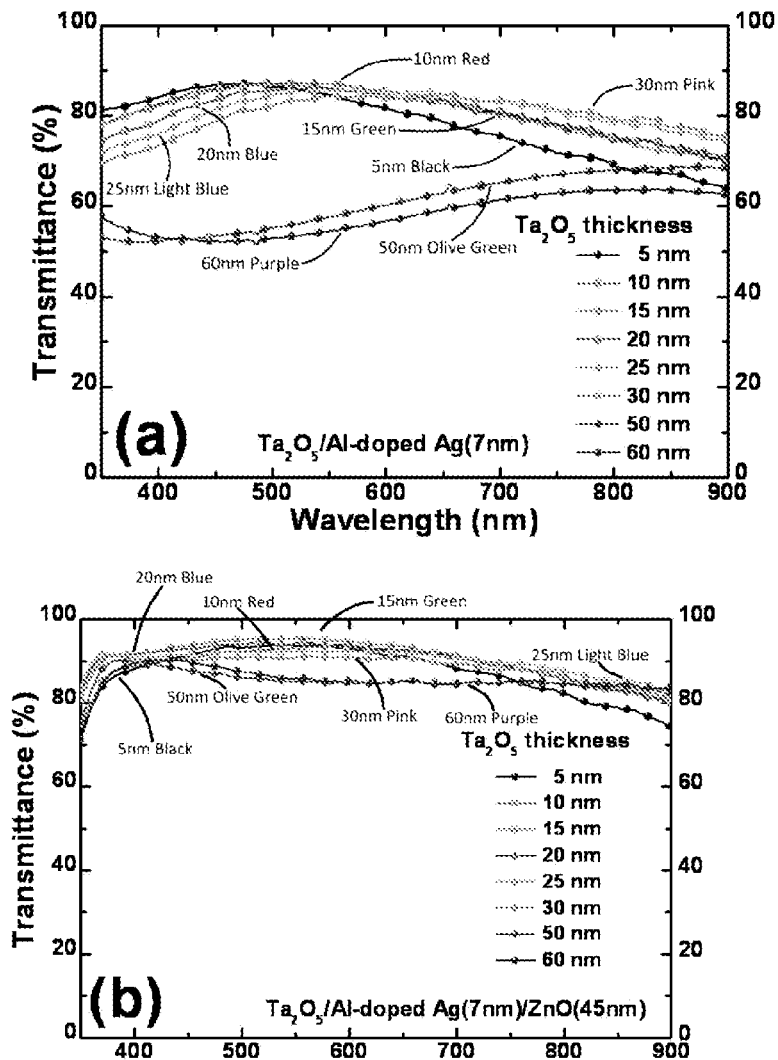
Figure 30C:
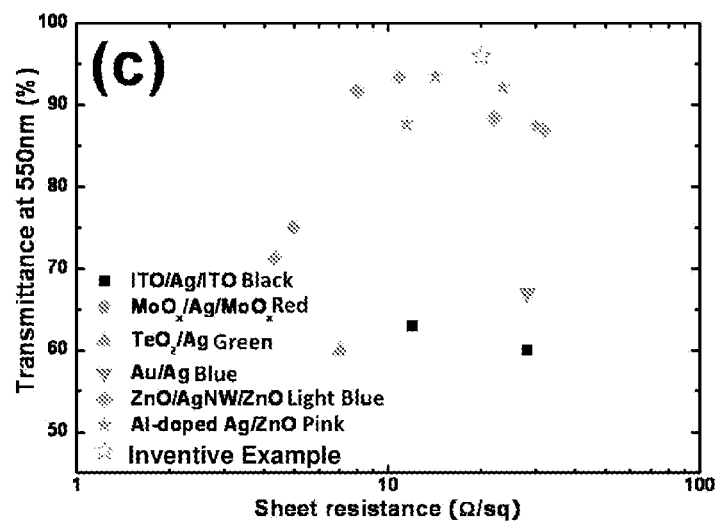
Figure 30D:
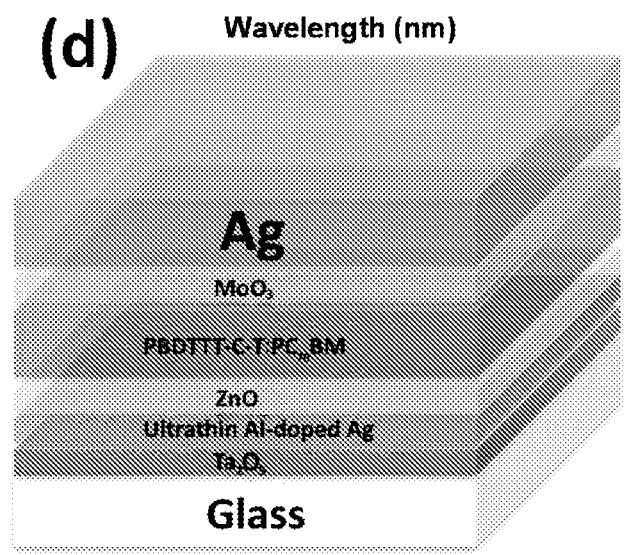

FIGS. 30(a)-30(d). Transmittance spectra of FIG. 30(a) for a stack of layers including $Ta_2O_5$ (at thicknesses of 5 nm, 10 nm, 15 nm, 20 nm, 25 nm, 30 nm, 50 nm and 60 nm)/Al-doped Ag (7 nm) and FIG. 30(b) for a stack of $Ta_2O_5$ (at thicknesses of 5 nm, 10 nm, 15 nm, 20 nm, 25 nm, 30 nm, 50 nm and 60 nm)/Al-doped Ag (7 nm)/ZnO (40 nm) with varying thicknesses of $Ta_2O_5$ layer. FIG. 30(c) shows a comparison of optical transmittance (at 550 nm) versus sheet resistance for an embodiment according to certain aspects of the present disclosure having $Ta_2O_5$/Al-doped Ag/ZnO compared with other assemblies of ITO/Ag/ITO, $MoO_3$/Ag/$MoO_3$, $TeO_2$/Ag, ZnO/AgNW/ZnO, and Al-doped Ag. Note that all selected data are based on their applications in optoelectronic devices (only cite Ag based ones). FIG. 30(d) is a schematic of an organic photovoltaic or organic solar cell (OSC) device with $Ta_2O_5$/Al-doped Ag/ZnO as electrode.

Figures 31A, 31B:
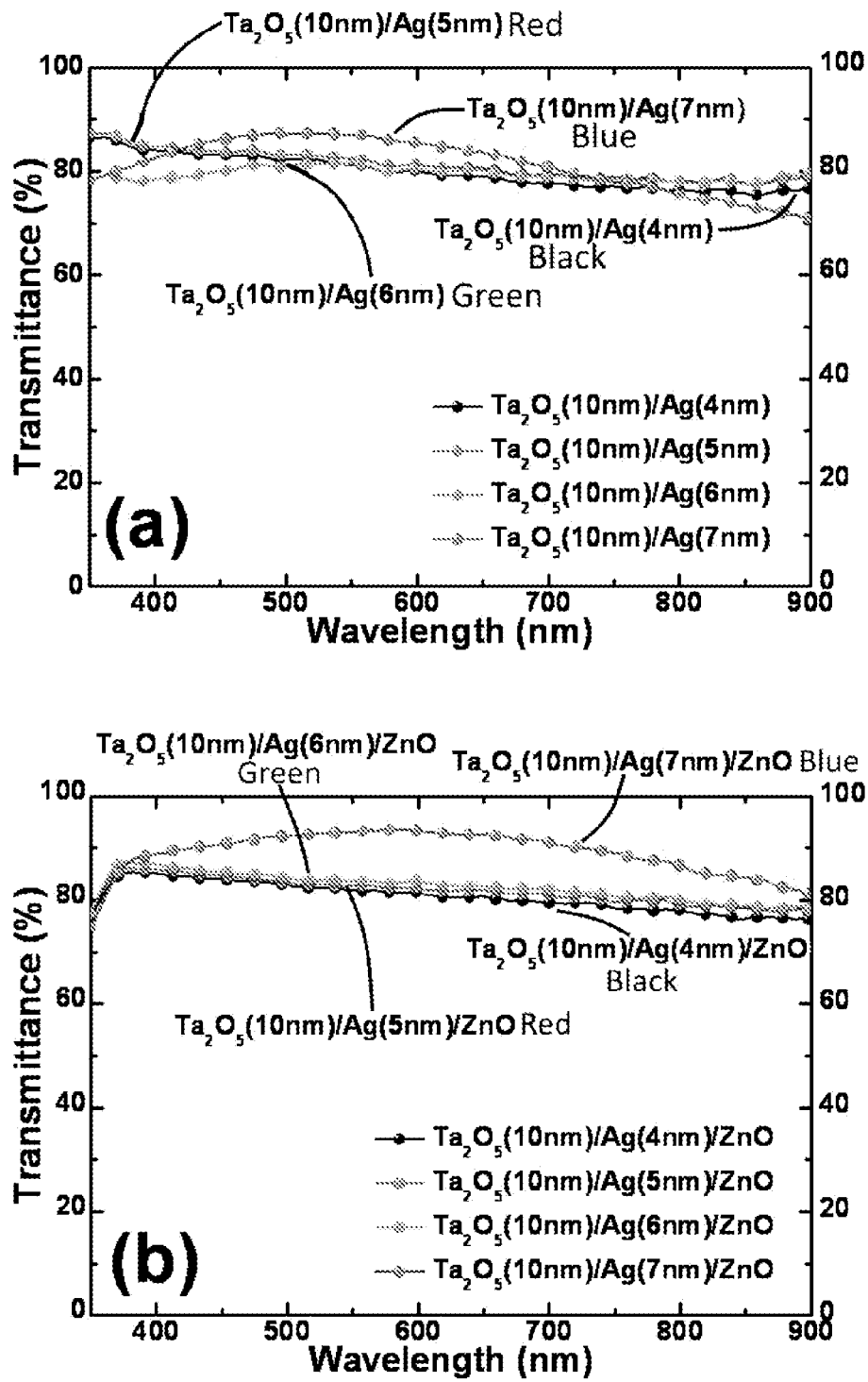

FIGS. 31(a)-31(b). Transmittance spectra is shown in FIG. 31(a) for $Ta_2O_5$/Al-doped Ag thin film conductors (having thicknesses of 4 nm, 5 nm, 6 nm, and 7 nm) according to certain aspects of the present disclosure. FIG. 31(b) shows $Ta_2O_5$/Al-doped Ag (4 nm, 5 nm, 6 nm, and 7 nm)/ZnO (45 nm) according to other aspects of the present disclosure. All films are deposited on fused silica substrates.

Figures 32A, 32B:
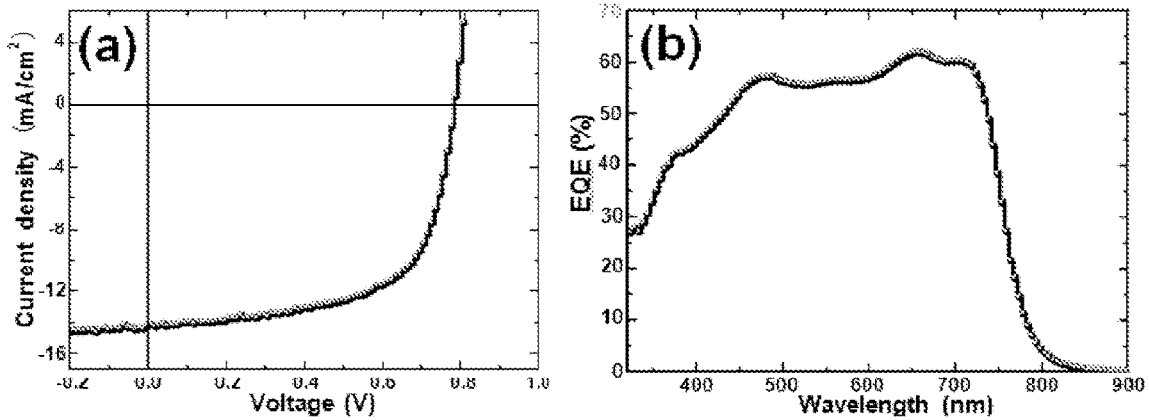

FIGS. 32(a)-32(b). FIG. 32(a) shows J-V characteristic and FIG. 32(b) shows EQE spectrum of $Ta_2O_5$/Al-doped Ag (4 nm) as an electrode based cell.

Figure 33A:
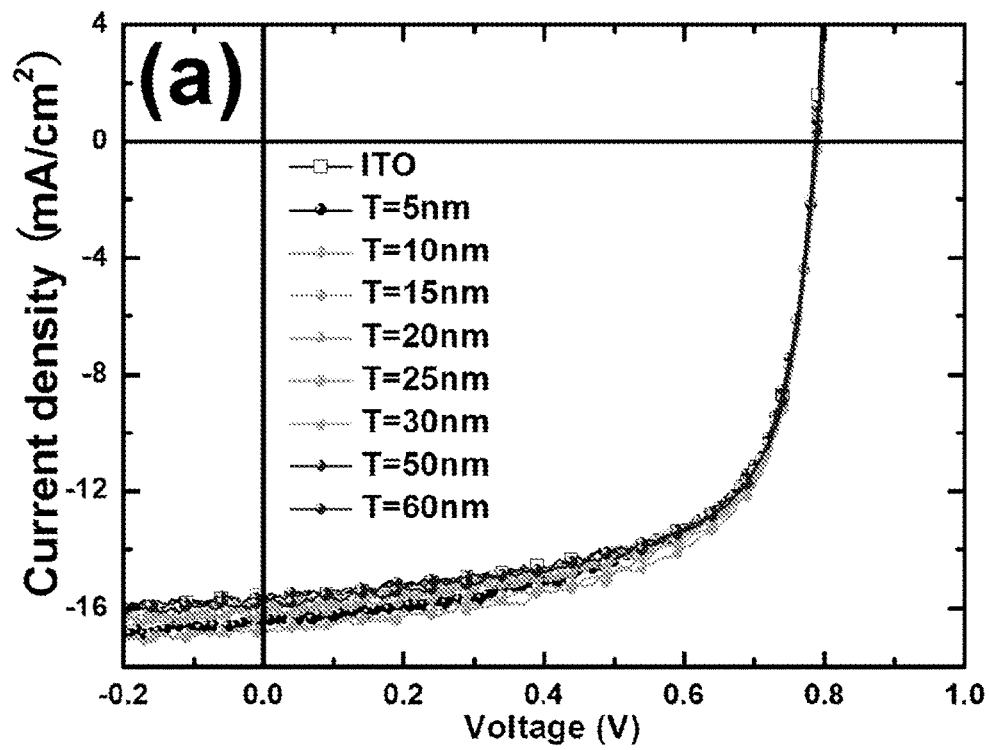
Figures 33B, 33C:
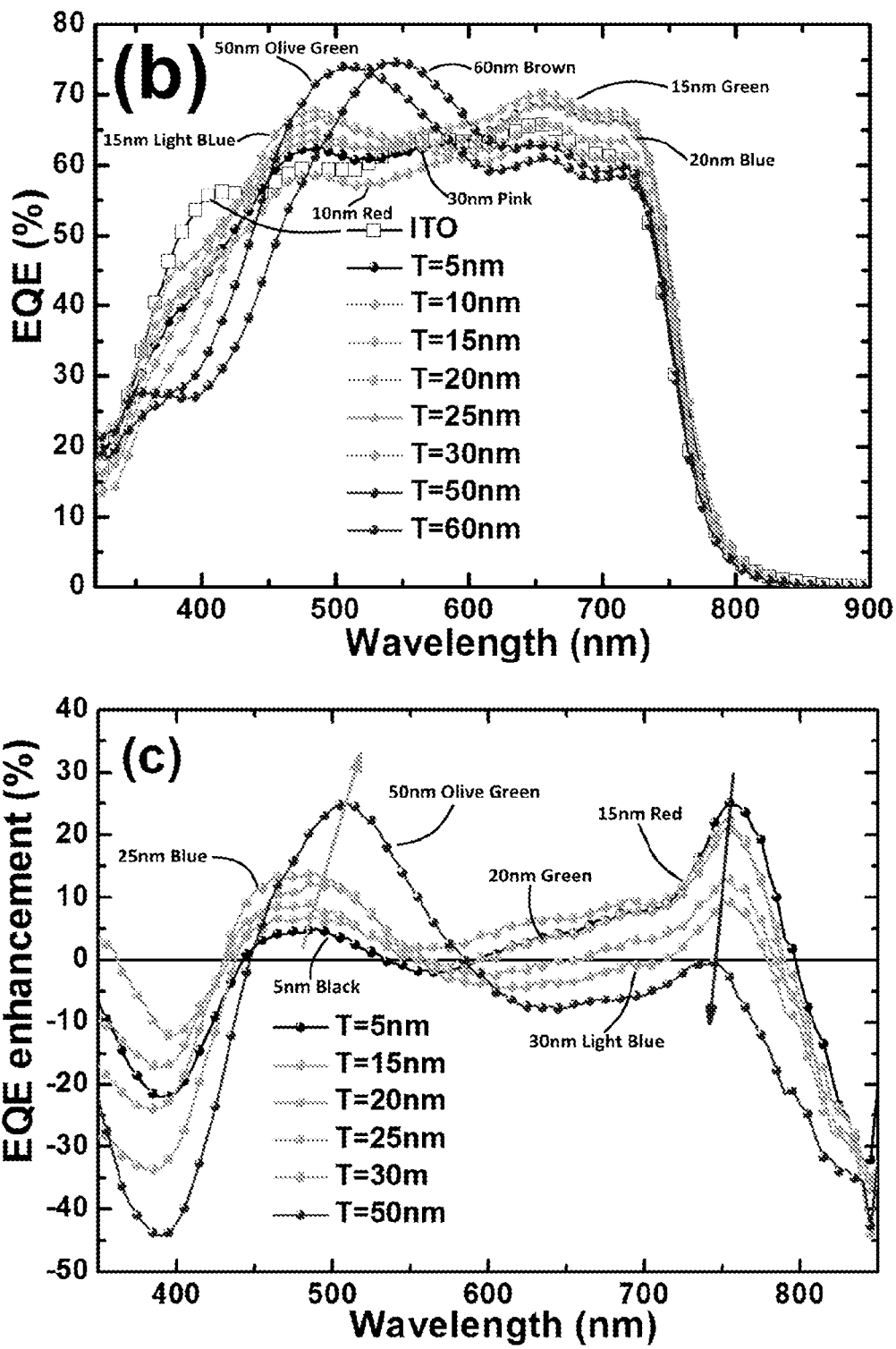
Figure 33D:
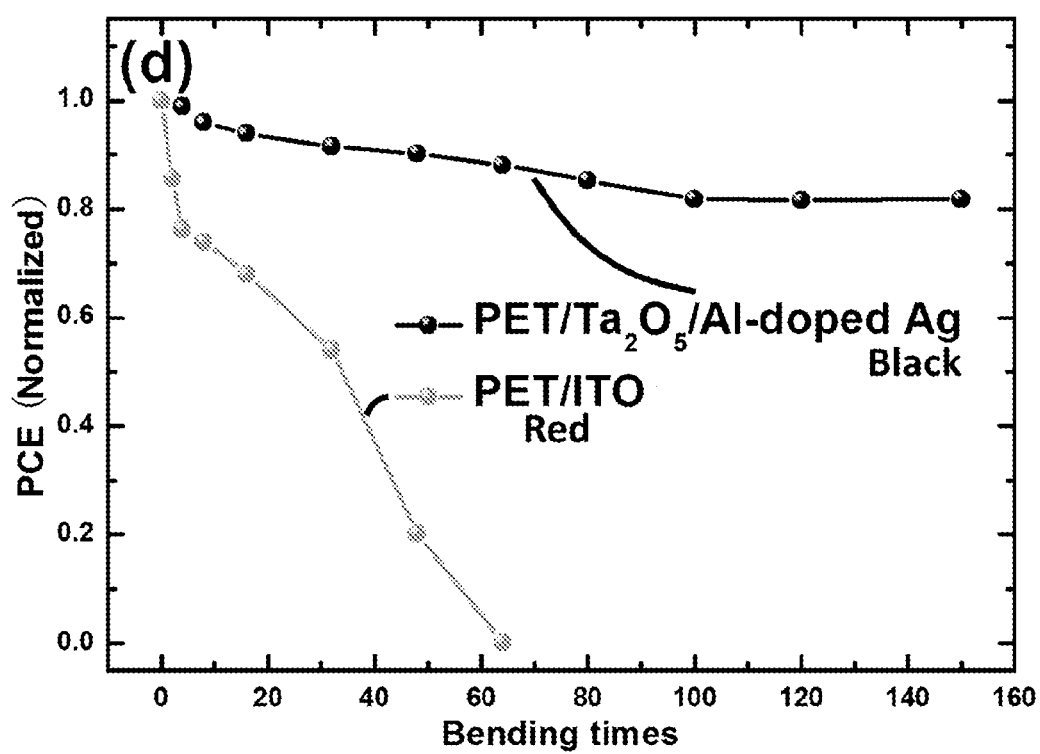

FIGS. 33(a)-33(d). FIG. 33(a) shows J-V characteristics and FIG. 33(b) shows EQE spectra of a comparative organic photovoltaic (OPV) devices comprising ITO or $Ta_2O_5$ (at thicknesses of 5 nm, 10 nm, 15 nm, 20 nm, 25 nm, 30 nm, 50 nm and 60 nm)/Al-doped Ag (7 nm) electrodes. FIG. 33(c) shows EQE enhancement of $Ta_2O_5$ (at thicknesses of 5, 15, 20, 25, 30, and 50 nm)/Al-doped Ag (7 nm) based OPV devices as compared to an ITO OPV. FIG. 33(d) shows bendability tests of the devices with electrodes of either PET/ITO or PET/$Ta_2O_5$ (15 nm)/Al-doped Ag (7 nm) with bending times.

FIGS. 34(a)-34(d). Simulation of the optical field intensity ($|E|^2$) distribution versus position and wavelength in FIG. 34(a) an ITO-based OPV device, FIG. 34(b) a Ta$_2$O$_5$ (5 nm)/Al-doped Ag (7 nm) based OPV device, FIG. 34(c) Ta$_2$O$_5$ (15 nm)/Al-doped Ag (7 nm) based OPV device, and FIG. 34(d) Ta$_2$O$_5$ (50 nm)/Al-doped Ag (7 nm) based OPV device.

Figure 35:
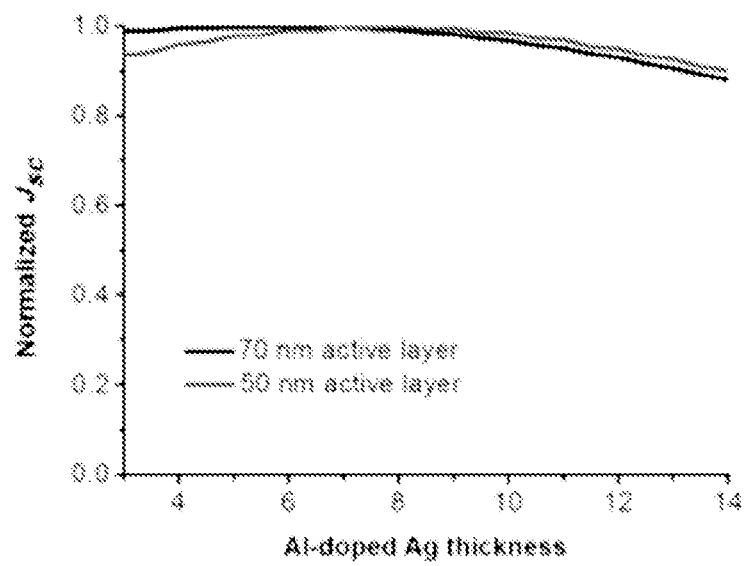

FIG. 35 is a simulated J$_{sc}$ of for OPV devices with varying thickness of Al-doped Ag layer ranging from 3 nm to 14 nm, where the other layers in the OPV stack assembly are fixed.

Figures 36A, 36B, 36C, 36D:
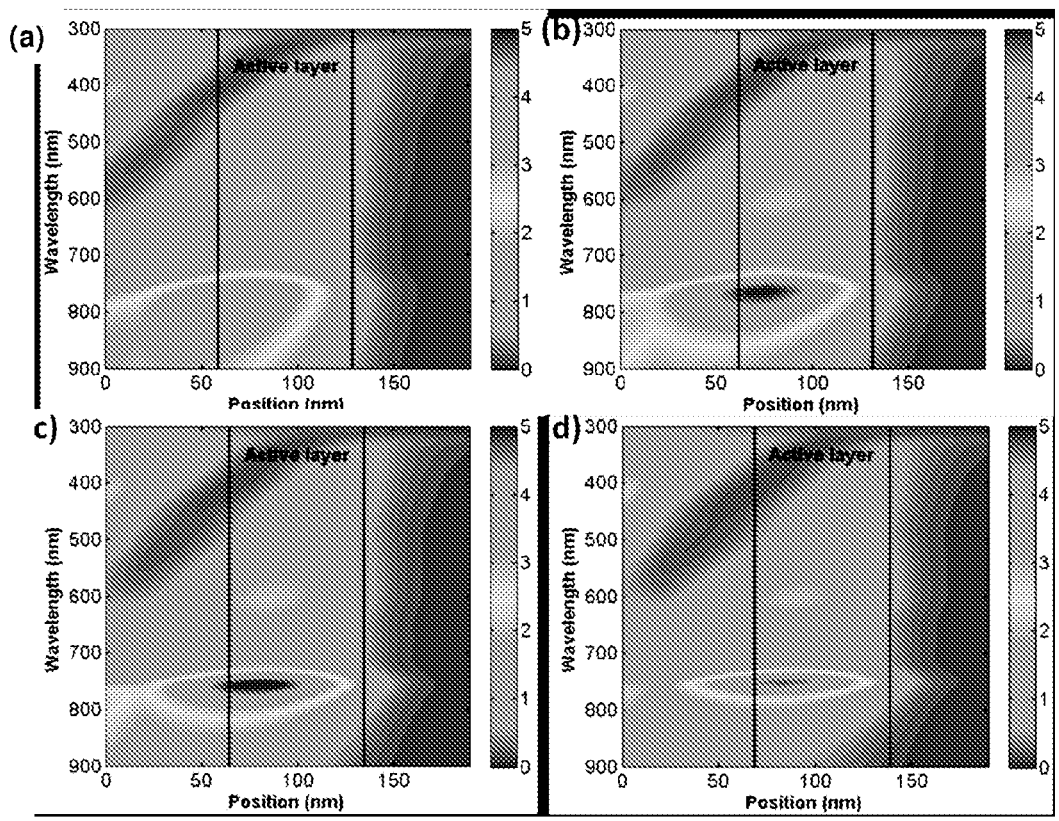

FIGS. 36(a)-36(d) show a simulation of the optical field intensity ($|E|^2$) distribution versus position and wavelength with varying Al-doped Ag electrode thicknesses at 4 nm (FIG. 36(a)), 7 nm (FIG. 36(b)), 10 nm (FIG. 36(c)) and 14 nm (FIG. 36(d)), while the Ta$_2$O$_5$/ZnO/PBDTTT-C-T/MoO$_3$/Ag layer thicknesses are fixed at 15 nm/40 nm/70 nm/10 nm/100 nm, respectively.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

It should be understood for any recitation of a method, composition, device, or system that "comprises" certain steps, ingredients, or features, that in certain alternative variations, it is also contemplated that such a method, composition, device, or system may also "consist essentially of" the enumerated steps, ingredients, or features, so that any other steps, ingredients, or features that would materially alter the basic and novel characteristics of the invention are excluded therefrom.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters.

In addition, disclosure of ranges includes disclosure of all values and further divided ranges within the entire range, including endpoints and sub-ranges given for the ranges.

Example embodiments will now be described more fully with reference to the accompanying Thin metal films have many applications in optoelectronics and nano-photonics. Among them, silver (Ag) is widely used due to its excellent conductivity (the highest among all metals) and low optical loss in the visible band; and can be exploited for transparent conductor application, among many other applications. However thin Ag film is difficult to obtain and mostly forms discontinuous film during or after the deposition.

In accordance with the present disclosure, methods are provided that form film comprising silver that is thin or ultra-thin and smooth. Such a film comprising silver, desirably exhibits low optical loss and low electrical resistance. Such films can be made easily without the application of any seeding layer or need for specific limited fabrication conditions. Moreover, the thin films of various aspects of the present disclosure have dramatically improved long term and high temperature stability as compared to conventional films comprising silver (Ag).

In certain aspects, the present disclosure provides an electrically conductive thin film comprising silver (Ag) at greater than or equal to about 80 atomic % of the total film composition. As used herein, the terms "composition" and "material" are used interchangeably to refer broadly to a substance containing at least the preferred chemical compound(s), but which may also comprise additional substances or compounds, including impurities. The thin film composition further comprises a conductive metal, distinct from Ag. In certain variations, the distinct electrically conductive metal may comprise aluminum (Al), titanium (Ti), nickel (Ni), chromium (Cr), gold (Au), magnesium (Mg), tantalum (Ta), germanium (Ge), or combinations thereof. In certain preferred variations, the conductive metal is aluminum (Al).

In alternative variations, the present disclosure also contemplates new electrically conductive, smooth, thin films comprising highly conductive elements such as gold (Au) or copper (Cu). In certain variations, the electrically conductive films may comprise one of these alternative highly conductive elements at greater than or equal to about 80 atomic % of the total composition of the thin film, as well as a distinct second conductive metal present at greater than 0 atomic % to less than or equal to about 20 atomic % of the total composition of the thin film. In certain variations, the distinct second conductive metal may comprise aluminum (Al), titanium (Ti), nickel (Ni), chromium (Cr), gold (Au), magnesium (Mg), tantalum (Ta), germanium (Ge), or combinations thereof. Such films may have a thickness of less than or equal to about 50 nm and a smooth surface. Thus, in alternative aspects, the discussion of the preferred highly conductive silver compound may be understood to also apply to other highly conductive elements, like gold and copper.

The conductive metal may be present at greater than 0 atomic % to less than or equal to about 20 atomic % of the total film composition. While not limiting the present teachings to any particular theory, it is believed that including minor amounts of a conductive metal material, such as aluminum, enhances the nuclei density of films on oxide surface due to much larger bond strength of Al—O bonds than Ag—O bonds. The presence of Al in Ag films also causes the inward diffusion of O from the ambient atmosphere and the outward diffusion of Al, thus forming a capping layer containing Al—O bonds with high stability over the Al-doped Ag inner layer. As a result, the Al-doped Ag films have a sub-nanometer RMS roughness. Further, the ultrasmooth surface morphology of Al-doped Ag films is very stable at both room temperature and elevated temperature. However, inclusion of amounts of the conductive metal, such as aluminum, in excess of 20 atomic % may detrimentally diminish optical loss, electrical conductivity, and/or transparency of the silver-based film.

In certain variations, the conductive metal is optionally present at greater than or equal to about 1 atomic % to less than or equal to about 25 atomic % of the total film composition, while the silver may be present at greater than or equal to about 75 atomic % to less than or equal to about 99 atomic % of the total film composition. In certain variations, the conductive metal is optionally present at greater than or equal to about 1 atomic % to less than or equal to about 15 atomic % of the total film composition, while the silver may be present at greater than or equal to about 85 atomic % to less than or equal to about 99 atomic % of the total film composition. In other variations, the conductive metal is optionally present at greater than or equal to about 2 atomic % and less than or equal to about 10 atomic % of the total film composition, while the silver may be present at greater than or equal to about 90 atomic % to less than or equal to about 98 atomic % of the total film composition.

In certain aspects, "thin" film means that the film has a thickness of less than or equal to about 100 nm, optionally less than or equal to about 50 nm, optionally less than or equal to about 45 nm, optionally less than or equal to about 40 nm, optionally less than or equal to about 35 nm, optionally less than or equal to about 30 nm, optionally less than or equal to about 25 nm, optionally less than or equal to about 20 nm, optionally less than or equal to about 15 nm, optionally less than or equal to about 10 nm, optionally less than or equal to about 9 nm, optionally less than or equal to about 8 nm, optionally less than or equal to about 7 nm, and in certain aspects, optionally less than or equal to about 6 nm. In certain aspects, a thickness of the film is "ultra-thin" and may less than or equal to about 25 nm. In certain variations, the film has a thickness of greater than or equal to about 2 nm and less than or equal to about 20 nm; optionally greater than or equal to about 3 nm to less than or equal to about 20 nm. In certain variations, the ultra-thin film has a thickness of less than or equal to about 5 nm and optionally less than or equal to about 4 nm.

Furthermore, in various aspects, the thin films comprising Ag and the conductive metal have a smooth surface. By a "smooth" surface, it is meant that a root mean squared (RMS) of measured surface roughness (e.g., from peaks to valleys) is less than or equal to about 25% of the total film thickness, optionally less than or equal to about 20% of the total film thickness, optionally less than or equal to about 15% of the total film thickness, optionally less than or equal to about 14% of the total film thickness, optionally less than or equal to about 13% of the total film thickness, optionally less than or equal to about 12% of the total film thickness, optionally less than or equal to about 11% of the total film thickness, optionally less than or equal to about 10% of the total film thickness, optionally less than or equal to about 9% of the total film thickness, optionally less than or equal to about 8% of the total film thickness, optionally less than or equal to about 7% of the total film thickness, optionally less than or equal to about 6% of the total film thickness, and in certain variations, optionally less than or equal to about 5% of the total film thickness.

As appreciated by those of skill in the art, ascertaining smoothness of a film is relative and depends on an overall thickness of the film, where greater amounts of root mean squared (RMS) surface roughness can still considered to be smooth if a film is thicker. In certain variations, a smooth surface of the film comprising silver and the conductive metal has a surface roughness of less than or equal to about 1 nm root mean squared (RMS), where an overall thickness of the film is at least about 10 nm. In other variations, a smooth surface has a surface roughness of less than or equal to about 0.5 nm root mean squared (RMS), where an overall thickness of the film is at least about 10 nm.

The electrically conductive thin films of the present disclosure that comprise Ag and a second electrically conductive metal, like Al, may have a sheet resistance of less than or equal to about 100 Ohm/square, optionally less than or equal to about 75 Ohm/square, optionally less than or equal to about 50 Ohm/square, optionally less than or equal to about 40 Ohm/square, optionally less than or equal to about 30 Ohm/square, optionally less than or equal to about 25 Ohm/square, optionally less than or equal to about 20 Ohm/square, optionally less than or equal to about 15 Ohm/square, optionally less than or equal to about 10 Ohm/square, optionally less than or equal to about 5 Ohm/square, optionally less than or equal to about 4 Ohm/square, optionally less than or equal to about 3 Ohm/square, optionally less than or equal to about 2 Ohm/square, and optionally less than or equal to about 1 Ohm/square.

The electrically conductive thin films of the present disclosure are capable of transmitting select portions of the electromagnetic spectrum and thus are transparent or semi-transparent. Transparency may generally encompass semi-transparency, and can be understood generally to mean that greater than or equal to about 40% of a predetermined target wavelength or range of wavelengths (which may be polarized or non-polarized) of light/energy pass through the electrically conductive thin film. In certain variations, greater than or equal to about 50% of a target wavelength (or range of wavelengths) passes through the thin film, optionally greater than or equal to about 60%, optionally greater than or equal to about 70%, optionally greater than or equal to about 75%, optionally greater than or equal to about 80%, optionally greater than or equal to about 85%, optionally greater than or equal to about 90%, optionally greater than or equal to about 95%, and in certain variations, optionally greater than or equal to about 97% of target wavelength(s) pass through the electrically conductive thin films of the present disclosure.

In certain aspects, the electrically conductive thin films reflect certain select portions of the electromagnetic spectrum and thus are reflective or semi-reflective. Reflectivity may generally encompass semi-reflectivity, and can be understood generally to mean that greater than or equal to about 50% of a predetermined target wavelength or range of wavelengths (which may be polarized or non-polarized) of light/energy are reflected from a surface and therefore do not pass through the electrically conductive thin film. In certain variations, greater than or equal to about 60% of a target wavelength (or range of wavelengths) reflected from the thin film, optionally greater than or equal to about 70%, optionally greater than or equal to about 75%, optionally greater than or equal to about 80%, optionally greater than or equal to about 85%, optionally greater than or equal to about 90%, optionally greater than or equal to about 95%, and in certain variations, optionally greater than or equal to about 97% of target wavelength(s) is reflected by the electrically conductive thin films of the present disclosure.

In certain variations, the electrically conductive thin films are transparent to electromagnetic waves in the ultraviolet light (UV) range and/or the visible light range, while being reflective to electromagnetic waves in the infrared radiation (IR) range. By transparent, it is meant that the electrically conductive thin film is transmissive for a target range of wavelengths of electromagnetic energy, for example, in the visible and ultraviolet wavelength ranges. By reflective, it is meant that the electrically conductive thin film reflects a significant portion of a predetermined range of wavelengths of electromagnetic energy, for example, in the infrared spectrum ranges.

In certain aspects, the electrically conductive thin films comprising silver and an electrically conductive metal, like aluminum, are flexible (e.g., capable of bending without mechanical failure).

In various aspects, the electrically conductive thin films of the present disclosure may be used in a variety of optical and photonic applications. For example, the thin films may be used as transparent electrodes, for example, replacing current transparent conductors, like indium tin oxide (ITO), in a variety of applications. The electrically conductive thin films may be used as components in light emitting devices, like diodes (LEDs) including organic LEDs and gallium nitride LEDs, photovoltaic cells, including organic photovoltaic cells, flat panel displays, liquid crystal displays (LCD), projection displays (such as using digital mirror technology, or liquid crystal on silicon (LCoS), touch screens, eye-wear displays, a transparent or see-through display, windows or displays, smart switchable windows or other devices, for example, those using electrochromic or phase change materials, complementary metal-oxide-semiconductor (CMOS) image sensors, IR imagers or IR shields, resonators, plasmonic waveguides, such as on-chip plasmonic waveguides, or as optical metamaterials and metasurfaces (e.g., to enhance the emission rate of fluorophores). Metamaterials based on thin Ag films have enabled promising applications in super resolution imaging, enhanced spontaneous emission decay rate, and engineered thermal radiation, among others. In certain aspects, an assembly including a thin electrically conducting film forms a metamaterial having predetermined optical and electrical properties, which may be selected and implemented as is known in the art.

In certain applications, such as transparent electrodes, thin films should be semi-transparent and have good electrical conductivity. As noted above, films comprising pure silver (Ag) follow a 3D island growth mode, which not only limits the film conductivity, but also causes light absorption and scattering loss due to excitation of plasmon resonances. Optically transparent conductors are essential components for the operation of most optoelectronic devices. The most commonly used transparent conductor, indium tin oxide (ITO), suffers from poor mechanical flexibility and insufficient conductance for large-area devices, as well as rising costs due to limited indium supplies and the increasing demand for displays and related electronics market. To meet this challenge, many potential alternative transparent electrodes have been developed, including graphene, carbon nanotubes, highly conductive polymers, patterned metal grids, metal nanostructures, and nanowires. Carbon-based materials improve the mechanical flexibility of the electrode; however, their low conductivity largely limits their electronic performance. Transparent metal mesh structures and metal nanowire networks either require patterning or complex synthesis procedures. Moreover, both platforms only provide global conductivity, being totally non-conductive between the wires, and therefore cannot be used directly as transparent electrodes for light-emitting diodes (LEDs) and photovoltaics (PVs) unless an additional conducting layer is added. Many practical applications, including large-area flexible organic photovoltaics (OPVs), still call for easily-fabricated high-performance transparent conductors.

The thin, low-loss, continuous metal films of the present disclosure are formed by using a simple deposition method and thus are ideal for such applications (e.g., such films can be integrated into semi-transparent smart windows and tandem structures), but conventionally transmittance has been limited due to the thickness required to achieve the desired conductivity. Further, the thin electrically conductive films of the present disclosure may be used as a single layer, rather than necessarily requiring stacks of distinct materials. However, the electrically conductive films may be incorporated into stacks or assemblies, as desired.

Figure 1A:
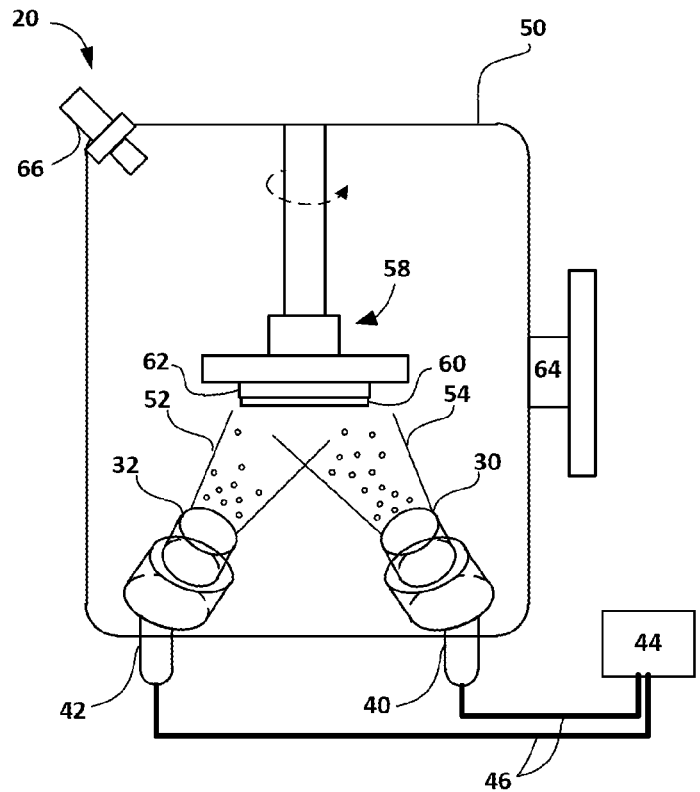

Therefore, thin and smooth films comprising Ag according to certain aspects of the present teachings are particularly suitable for use in metamaterials and transparent conductors, by way of non-limiting example. The ultra-thin and smooth films comprising Ag according to various aspects of the present disclosure have low optical loss, as well as low electrical resistance. Such films can be made easily without the application of any seeding layer, only involving co-deposition of small amounts of a conductive metal, like Al, during Ag deposition (FIG. 1(a)), as will be described in greater detail below.

The present disclosure contemplates methods of making an electrically conductive thin film. Such a method may include co-depositing silver (Ag) and a conductive metal onto a substrate. In alternative variations, the disclosure also contemplates co-depositing gold (Au) or copper (Cu) and a conductive metal onto a substrate to form an electrically conductive thin film. In certain variations, the conductive metal is selected from the group consisting of: aluminum (Al), titanium (Ti), nickel (Ni), chromium (Cr), gold (Au), magnesium (Mg), tantalum (Ta), germanium (Ge), and combinations thereof. By co-depositing, it is meant that at least a portion of the silver and a portion of the aluminum or other conductive metal are concurrently deposited and directed toward the substrate. In certain preferred aspects, the co-depositing is of silver (Ag) and aluminum (Al) to form an electrically conductive thin film. As described further below and while not limiting the present disclosure to any particular theories, the presence of a small amount of the aluminum on the substrate is believed to modify the mechanism and morphology of the film as the silver is deposited, reducing formation of the 3D islands. The co-depositing forms a continuous thin film comprising silver (Ag) at greater than or equal to about 80 atomic %, while the conductive metal, such as aluminum (Al), is present at greater than 0 atomic % to less than or equal to about 20 atomic % of the total deposited thin film composition. In certain preferred aspects, the conductive metal co-deposited with silver is aluminum. The deposited thin film has a thickness of less than or equal to about 50 nm and a smooth surface.

In certain variations, the silver-based thin film can be synthesized on a substrate by physical vapor deposition (PVD), chemical vapor deposition (CVD), atomic layer deposition (ALD), or other known conventional processes to apply or deposit such films to solid materials, such as wet chemistry or sol-gel techniques. In certain variations, the co-depositing is via a physical vapor deposition (PVD) process. The co-depositing may be via a PVD sputtering process, such as magnetron sputtering, or thermal evaporation, electron beam evaporation and other variable processes.

In such processes, for example, in the magnetron sputtering device 20 shown in FIG. 1(*a*), precursor material targets, such as first metal target 30 (e.g., Ag target) and second metal target 32 (e.g., Al target), are bombarded by gas ions (such as argon ions, Ar+) from a first sputter gun 40 and a second sputter gun 42 respectively, in a vacuum chamber 50. The first and second sputter guns are respectively connected via conduits 46 to a power source 44, such as a DC power source. The ions dislodge (sputter) material from the first and second metal target(s) 30, 32 to form a first material stream 52 and a second material stream 54 in the high vacuum chamber 50. The sputtered first and second material streams 52, 54 are focused with a magnetron 58 and condensed onto the receiving substrate 62 to form a film or coating 60, as further described below. As shown in FIG. 1(*a*), the substrate 62 is rotatable to provide even coverage of the first metal (e.g., Ag) and the second metal (e.g., Al) during the co-depositing. Further, as shown, the first sputter gun 40 that bombards the first metal target 30 may have a fixed or steady amount of power, so that the flow rate of sputtering remains relatively constant, while the second sputter gun 42 may have a variable power to adjust the rate of sputtering of the second metal during the process to permit adjustment of the amount of the second metal present in the deposited film or coating 60. Thus, in one example, the first sputter gun 40 may have a fixed power level of 300 W, while the second sputter gun 42 has variable power. The vacuum chamber 50 also has a viewing window 64 and a gauge 66 for monitoring the deposition process.

In alternative processes, such as CVD or thermal CVD process, precursors are reacted at predetermined at temperature ranges and directed towards the substrate. CVD deposition can also be plasma-assisted. The deposited silver-based thin film may have any of the compositions or characteristics described above. For example, the deposited electrically conductive thin film may have a sheet resistance of less than or equal to about 5 Ohm/square or any of the values previously discussed above. In certain aspects, the continuous electrically conductive deposited film may be ultra-thin and have a thickness of greater than or equal to about 5 nm and less than or equal to about 20 nm. As noted above, in certain variations, the conductive metal, such as aluminum, is present at greater than or equal to about 1 atomic % to less than or equal to about 15 atomic % in the deposited film. On other variations, the conductive metal, such as aluminum, is present at greater than or equal to about 2 atomic % to less than or equal to about 10 atomic % in the deposited film. Moreover, the continuous electrically conductive deposited film has a smooth surface, as described above.

In certain aspects, the methods of the present disclosure involve co-deposition of small amounts of Al or other conductive metal during Ag deposition to form a film. The methods enable simple processing that is highly scalable to industrial and commercial manufacturing.

In other variations, the methods may further comprise annealing the deposited film after the co-depositing process or heating the substrate during the deposition. The annealing may include exposing the deposited film to a heat source so as to elevate the temperature of the film. In certain aspects, for the annealing process, the film may be exposed to temperatures below the melting points of either the silver or the conductive metal. Silver has a melting point of about 961° C., while aluminum has a melting point of about 660° C. In certain aspects, the material may be exposed to less than or equal to about 600° C., and optionally less than or equal to about 500° C., optionally less than or equal to about 400° C., optionally less than or equal to about 300° C., optionally less than or equal to about 200° C., and for certain substrates having the conductive metal film thereon like plastic or polymers, optionally less than or equal to about 100° C. The annealing may be conducted in an inert atmosphere, such as in nitrogen ($N_2$) gas, or in air. The amount of time for conducting the annealing process depends upon the temperature, where higher temperatures require less time.

In certain aspects, the time for annealing may range from greater than or equal to about 5 minutes to less than or equal to about 30 minutes and optionally greater than or equal to about 10 minutes to less than or equal to about 20 minutes. Annealing improves the deposited film's optical loss, especially for wavelengths in the visible range, making the silver-based film comprising the conductive material more like pure silver, while still retaining the desirable electrical conductivity, smoothness, transparency, and other desired characteristics. As discussed below, experimental results suggest that high temperature annealing makes the doped film itself more conductive, and that such an annealed film is robust against exposure to high temperatures and thus provides greater stability. In certain variations, the annealing may be done in a nitrogen ($N_2$) environment at about 150° C. for 15 min, which results in an observed drop in sheet resistance as discussed below.

In other aspects, the methods may further comprise applying additional materials onto a substrate prior to co-depositing the silver and conductive metal. In other variations, one or more additional material layers or films may be formed over the electrically conductive thin film comprising silver and conductive metal. In one example, an electron transporting and hole blocking layer is formed on the continuous thin film, which can assist with improving optical performance (e.g., transmission of select wavelengths of light). Thus, the electron transporting and hole blocking layer may be applied by spin coating of a material, such as ZnO, onto the electrically conductive thin film (e.g., at a thickness of about 45 nm). Importantly, in certain aspects, the methods of the present disclosure do not require any wetting layers between the silver-based thin film and the substrate on which it is applied, so that the co-depositing is directly onto the substrate without any wetting or tie layers there between. However, layers may be applied between the substrate and electrically conductive silver-based thin film, including wetting or tie layers, as desired.

In certain aspects, the present disclosure provides an assembly comprising a substrate and an electrically conductive thin film comprising silver (Ag) at greater than or equal to about 80 atomic % of the total composition of the thin film and a conductive metal selected from a group consisting of: aluminum (Al), titanium (Ti), nickel (Ni), and combinations thereof, present at greater than 0 atomic % and less than or equal to about 20 atomic % of the total composition of the thin film, according to any of the variations described above. In certain preferred variations, the conductive metal comprises aluminum (Al). The electrically conductive thin film is disposed directly on the substrate without any wetting or buffer layers there between.

In certain variations, the electrically conductive thin film is disposed on adjacent to an optical material, such as a dielectric material, or a two-dimensional material, such as graphene. Suitable optical or dielectric materials may include metal oxides, like $Ta_2O_5$, ZnO, $TiO_2$, $TeO_2$, $WO_3$, $HfO_2$, $Al_2O_3$, $SiO_2$, $VO_2$, $V_2O_5$, $GeO_2$, SiO, $ZrO_2$, $Y_2O_3$, $Yb_2O_3$ or other dielectric materials, like $Si_3N_4$, $MgF_2$, AlN, $MoO_3$, ZnSe, ZnS, ZnTe, ITO, AZO, IGZO, or wide bandgap semiconductors (e.g., GaN when used in the visible range) and combinations thereof. In other variations, a thin and stable Ag-doped film in accordance with certain aspects of the present disclosure can be used a layer of ITO to improve the electrical conductivity and block IR light, while improving the stability of windows utilizing electrochromic or phase change materials. The electrically conductive thin film may thus form a part of an assembly or stack of layers. In certain variations, the electrically conductive thin film defines a first side and a second opposite side, so that the substrate is adjacent to the first side and an electron transporting and hole blocking layer is disposed on the second side. As described further below, in certain embodiments, such an electron transporting and hole blocking layer may comprise ZnO, which can further improve transmission and optical properties of the electrically conductive silver-based thin film. Certain material coatings can improve the electrochemical stability of the thin metal film. In certain aspects, the assembly further comprises a photovoltaic active material, which may be disposed adjacent to the electron transporting and hole blocking layer. In certain variations, the active material may be a dielectric material, such as $PBDTTT-C-T:PC_{70}BM$, by way of non-limiting example. Thus, the assembly may form part of a photovoltaic cell and the electrically conductive thin film may serve as a transparent conductive electrode (TCE). In other aspects, the electrically conductive thin film may define a first side and a second opposite side, where the substrate is adjacent to the first side and a dielectric material is disposed on a second side. In certain variations, such a dielectric material may be tantalum pentoxide ($Ta_2O_5$). In such variations, the assembly may form a metamaterial.

In other aspects, the electrically conductive thin film may be disposed adjacent to a two-dimensional (2-D) material, such as graphene (e.g., doped graphene), molybdenum disulfide ($MoS_2$), titanium oxide ($TiO_2$), 2-D semiconductors, 2-D semimetals, and the like. Such 2-D materials can be used to change work function and other optical properties of the adjacent electrically conductive thin film. In certain aspects, such a 2-D material may be disposed adjacent to the electrically conductive thin film to tune electrical properties, for example, the chemical potential (or Fermi energy) of graphene layer, to form Schottky contact/barriers and the like.

Ultra-thin electrically conductive films comprising Ag and Al having a thickness of about 6 nm have been made by the techniques according to the present disclosure. It appears that the incorporation of a small amount of Al into an Ag film suppresses the 3D island growth of Ag and facilitates the formation of a smooth, continuous, ultra-thin film, as discussed above. Such films are referred to as "silver-based films," "Al-doped Ag" or simply "doped Ag" films throughout, but as noted above, instead of Al, in alternative embodiments, the electrically conductive metal may be Ti or Ni, and thus the ensuing discussion is applicable to such alternative variations, as well.

In one of the many potential applications, the inventive electrically conductive silver-based thin films (e.g., Al-doped Ag films) are used as transparent conductors (e.g., to visible light). The doped Ag film is highly transparent and conductive. In addition, its ultra-smooth surface largely eliminates the possibility of shorting issues in organic thin film optoelectronics. Organic photovoltaics (OPVs) fabricated on electrodes formed of such Al-doped Ag films show enhanced power conversion efficiency (PCEs) due to light trapping inside a photoactive layer of the OPV. Moreover, devices made using such thin films exhibit significantly improved bending capability and stability than conventional ITO-based electrodes. Thus, the present disclosure provides a novel approach for forming an ultra-thin and smooth electrically conductive silver-based film with low loss and good conductivity, without need for forming any sublayers or wetting layers prior to deposition.

Ag is known to follow the Volmer-Weber growth mode, where the deposited Ag atoms initially form isolated islands on a substrate. As the deposition continues, these islands grow and eventually connect to form a semi-continuous/conductive film. The critical thickness leading to a conductive film is defined as the percolation threshold, which is typically between 10 and 20 nm. However, the film roughness is large, with a root-mean-square (RMS) roughness value of 6 nm for a 15 nm thick Ag film. With conventional techniques, by adding a wetting layer, like germanium (Ge), optimizing the deposition conditions, and cooling down the substrate, it is possible to reduce the percolation threshold to around 10 nm or slightly lower.

Figure 1B:
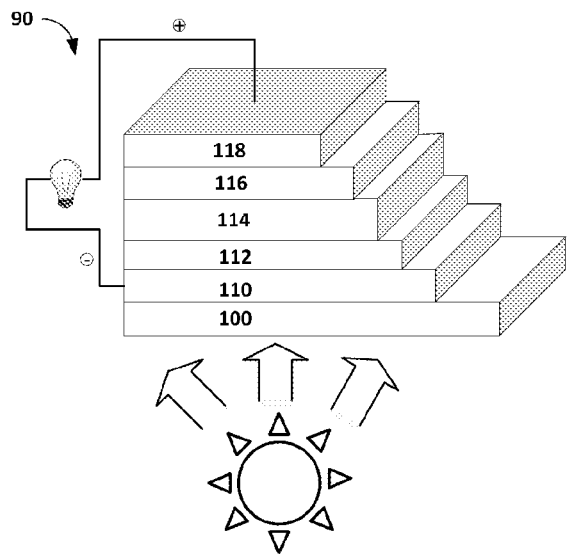
Figure 1C:
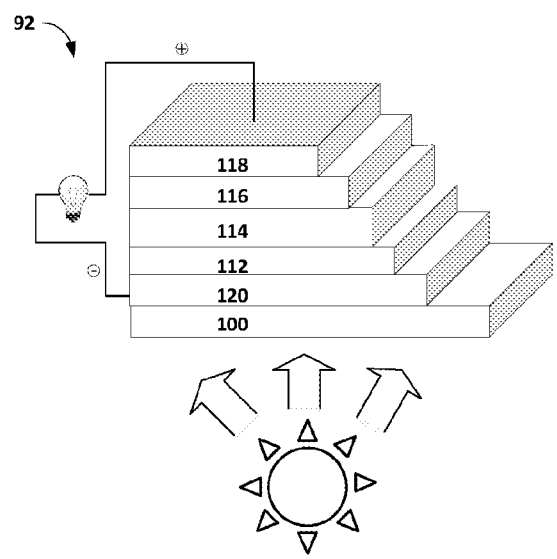

FIGS. 1(b) and 1(c) are a comparison of a conventional OPV stack 90 (FIG. 1(b)) and an inventive OPV stack 92 incorporating an electrically conductive silver-based thin film used an electrode (FIG. 1(c)) according to certain aspects of the present disclosure. To the extent that components are the same in the conventional OPV stack 90 and the inventive OPV stack 92, they share the same reference numbers. A substrate 100 has a conventional transparent electrode 110 disposed thereon, such as an indium tin oxide (ITO) electrode. A first intermediate layer 112 is disposed on the transparent electrode 110. The first intermediate layer 112 may work as an electron transporting and hole blocking layer. An active layer 114 (e.g., photoactive layer) is disposed thereon and may comprise PBDTTT-C-T:$PC_{70}BM$ as the active dielectric material. The active layer 114 forms a bulk heterojunction for the light absorption and photocurrent generation. A second intermediate layer 116 is disposed on an opposite side of the active layer 114. The second intermediate layer 116 may comprise molybdenum trioxide ($MoO_3$) or other charge transporting materials. A second electrode 118 having an opposite polarity from the transparent electrode 110 is disposed over the second intermediate layer 116. As shown, when ambient light is directed towards the OPV stack 90, electricity is generated by the OPV device. In the OPV stack 92 of FIG. 1(c), a transparent electrode 120 comprises an embodiment of an electrically conductive, smooth, ultra-thin film comprising silver and a second electrically conductive metal, such as aluminum (e.g., an Al-doped Ag electrode), according to certain aspects of the present teachings.

Remarkably, by introducing only a small amount of Al into Ag via a simple co-sputtering process (FIG. 1a), a percolation threshold of the resultant film can be reduced to very small dimensions (e.g., about 5 to 6 nm or less). Except for the early onset of continuous film formation, the Al-doped Ag film according to the present disclosure has a smooth surface morphology with a significantly reduced RMS roughness, for example, of less than 1 nm as discussed above.

EXAMPLES

Film deposition: Pure Ag films or Al-doped Ag films are sputtered on fused silica substrates by a DC magnetron sputter tool (Kurt J. Lesker Co. Lab) with Argon gas at room temperature (see magnetron sputtering set-up in FIG. 1(a)). Before being loaded into the chamber, the fused silica substrates are carefully cleaned with acetone and isopropyl alcohol (IPA). The chamber base pressure is pumped down to about $1\times10^{-6}$ Torr before sputtering. In the deposition, the Argon gas pressure is 4.5 mTorr and the substrate holder is rotated at 10 rpm. For the pure Ag films, a pure Ag target is sputtered. For the Al-doped Ag film, two pure Ag and Al targets are co-sputtered to create the ultra-thin Al-doped Ag film.

By varying target source power, the composition of the film is controlled. In this experiment, the Ag target power is fixed at 300 W, while the Al target power is adjusted to 100, 150, 200, 300, and 400 W. Varying Al power changes the Al-doped Ag film composition accordingly. The calibrated Ag deposition rate at 300 W is about 0.9 nm $s^{-1}$ and Al deposition rate at 200 W is about 0.06 nm $s^{-1}$. These slow deposition rates allow accurate control of the film thickness. Films with different compositions are prepared and studied. The films discussed herein are fabricated with 300 W Ag and 200 W Al target power for better conductivity and transparency compared with other combinations.

Film characterization: The thicknesses of Al-doped Ag films are calculated based on the calibrated deposition rate, being subsequently confirmed by spectroscopic ellipsometry measurement (J. A. Woollam M-2000). The sheet resistance is measured by Miller FPP-5000 4-Point Probe. The absorption, reflection, and transmittance spectra are recorded using UV-VIS-NIR spectrometer. For transmission measurement, the spectrum from a bare fused silica substrate is taken as the reference. For reflection, the spectrum is normalized to that from a thick (opaque) Ag minor. A thick Ag film absorbed a small amount of incident light and the reflection is not 100%, but this method gives reasonable results. Scanning electron microscopy (SEM) (Hitachi SU8000) and tapping mode atomic force microscopy (AFM) (Veeco NanoMan) are used to characterize the surface topography of films on fused silica substrate. X-ray photoelectron spectroscopy (XPS) (Kratos Axis Ultra XPS) is employed to determine the Al-doped Ag film composition.

Fabrication organic photovoltaic devices. Control devices are fabricated on ITO coated glass substrates with a sheet resistance of 12 $\Omega sq^{-1}$. The substrates are cleaned in an ultrasonic bath with acetone and isopropyl alcohol for 10 minutes. The ITO surface is cleaned by oxygen plasma for 100 seconds.

After sputtering, both the ultra-thin Al-doped Ag films prepared in accordance with certain aspects of the present teachings and the comparative control ITO substrate are transferred into a glove box filled with $N_2$ for ZnO coating. ZnO sol gel solution is prepared as reported and is spin-coated on top of ITO and Al-doped Ag films, followed by baking at 70° C. for 5 min. Then ZnO sol gel coated substrates are taken out of glove box and baked at 150° C. for 15 min in air, forming a 45 nm ZnO layer. After baking, the substrates are transferred into the glove box again for polymer active layer deposition. A blend solution made of poly[4,8-bis-(2-ethylhexyloxy)-benzo[1,2b:4,5b0]dithio-phene-2,6-diyl-alt-4-(2-ethylhexyloxy)-thieno-[3,4b]thio-phene-2,6-diyl](PBDTTT-C-T) (Solarmer) and [6,6]-phenyl C71-butyric acid methyl ester ($PC_{70}BM$) (American Dye Sources Inc.) with a weight ratio of 1:1.5 in chlorobenzene (25 mg mL−1) with 3 vol. % 1,8-diiodooctane (DIO, Sigma-Aldrich) is spin-coated onto ITO and Al-doped Ag substrates to form an active layer (90 nm). Subsequently, $MoO_3$ (6 nm) and Ag (100 nm) are evaporated sequentially ($1\times10^{-6}$ mbar) (Kurt J. Lesker). The final cells have an isolated electrode with a diameter of 1 mm. The device architecture is shown in FIG. 1(b) (control ITO electrode 110) or FIG. 1(c) (inventive Al-doped Ag film electrode 120). The inverted devices have a structure of ITO or ultra-thin Al-doped Ag/ZnO/PBDTTT-C-T:$PC_{70}BM$/$MoO_3$/Ag.

Device characterization. The current density-voltage (J-V) characteristics are measured using a Keithley 2400 system while illuminating the solar cells with AM 1.5 G simulated sunlight generated by an Oriel Solar Simulator at an irradiation intensity of 100 mW/$cm^2$. The incident power intensity at one sun (100 mW $cm^{-2}$) is calibrated using a Si reference cell. The devices are measured in the atmosphere without any encapsulation. The EQE measurement is performed in a nitrogen glove box and EQE spectra are obtained using light from a 200 Hz-chopped and monochromated Xenon-lamp, calibrated against a silicon solar cell.

Figures 2A, 2B, 2C, 2D:
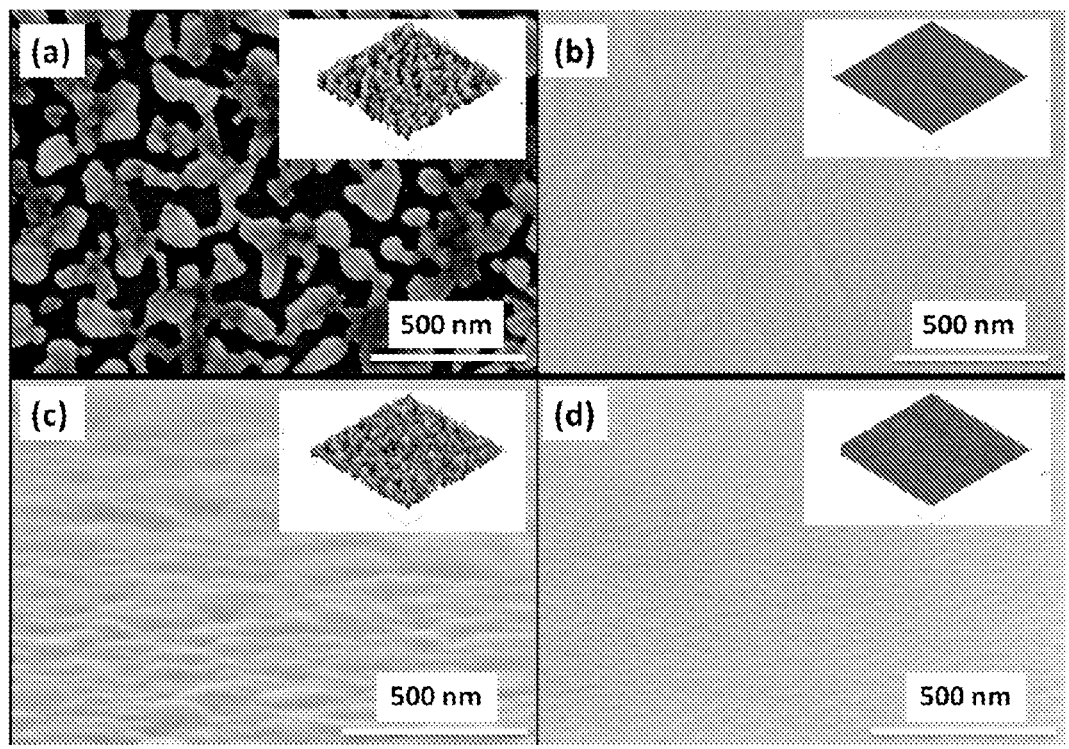
Figures 3A, 3B:
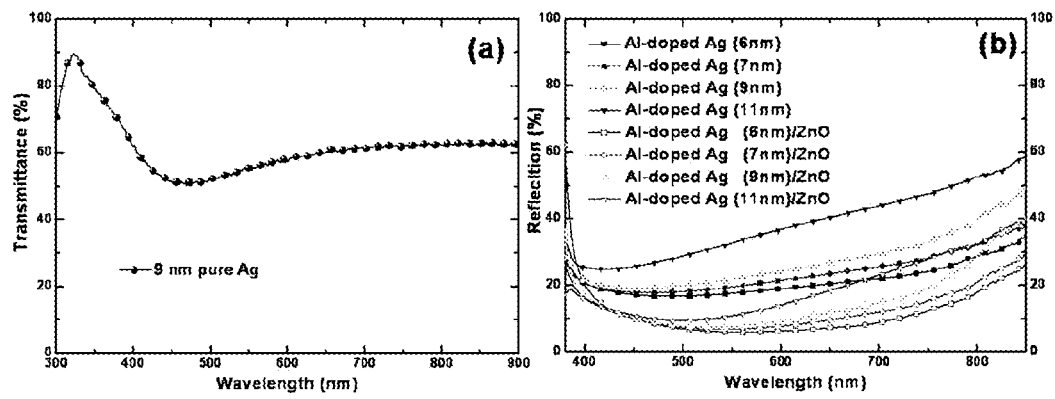
Figure 4A:
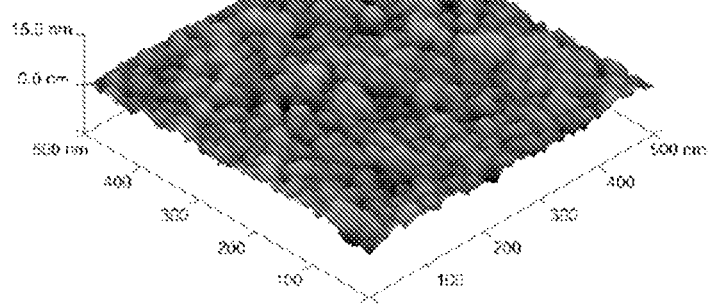
Figure 4B:
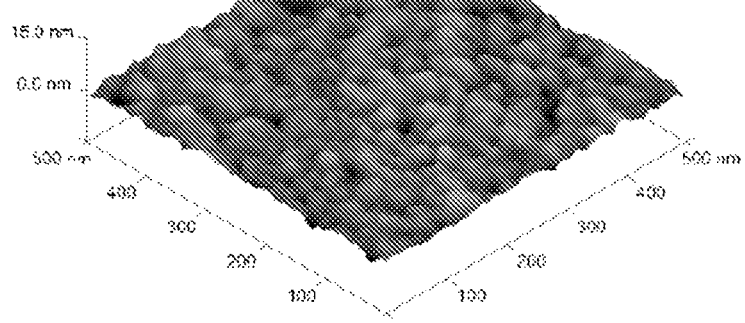
Figure 4C:
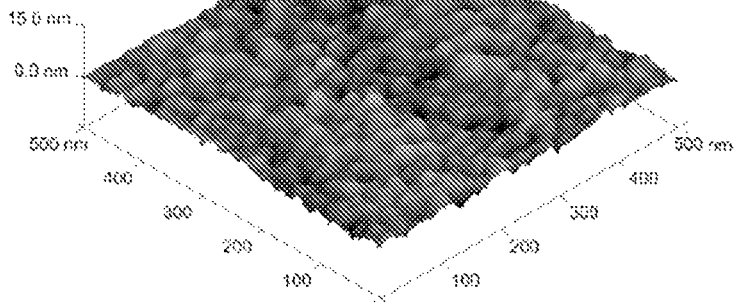
Figure 4D:
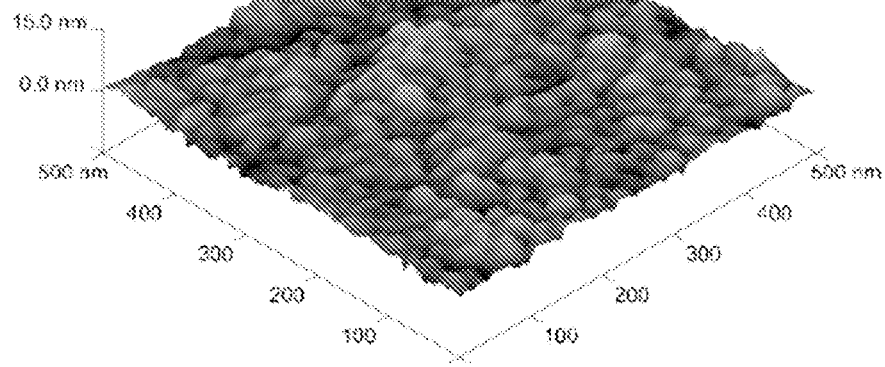

Scanning electron microscopy (SEM) characterization shows drastically different film morphology between a pure Ag sputtered film at a thickness of 9 nm (FIG. 2(a)) and an Al-doped Ag film having a thickness of 9 nm (FIG. 2(b)) deposited by co-sputtering Ag and Al. The insets in each figure are their corresponding tapping mode AFM images. All films are deposited on fused silica substrates. The source power of the Ag target is held at 300 W and that of Al is 200 W, translating into a deposition rate of about 0.9 nm s$^{-1}$ and about 0.06 nm s$^{-1}$, respectively. The grain or island-like morphology in FIG. 2(a) is typical of pure thin Ag film. The islands are connected at some local regions, but lack long-range connections. As a consequence, the 9 nm pure Ag film is not electrically conductive. The localized surface plasmon resonance excitation of these islands leads to extra optical scattering loss of the thin film, and its corresponding transmittance spectrum is shown in FIG. 3(a). In sharp contrast, the 9 nm Al-doped Ag film is very uniform and smooth. Obtaining SEM pictures of ultra-thin and smooth films is very difficult due to their lack of discernible defects or topographies; therefore, other characterizations such as atomic force microscopy (AFM), spectroscopic ellipsometry, and transmittance measurement are performed to investigate the thin films' properties.

The insets in FIGS. 2(a)-2(b) show the AFM images of 9 nm pure Ag and Al-doped Ag films, respectively. The 9 nm pure Ag film has an RMS roughness of 10.8 nm. In sharp contrast, the roughness of Al-doped Ag films is over one order of magnitude lower, with RMS of 0.86 nm. Thus, the RMS roughness of the pure Ag film is 12 times higher than the 9 nm Al-doped Ag film (0.86 nm). The 100 nm pure Ag film has an RMS roughness of 3.38 nm and R$_{max}$ of 28.3 nm, 3 times as those of 100 nm Al-doped Ag film (1.10 nm and 9.95 nm).

Figure 5:
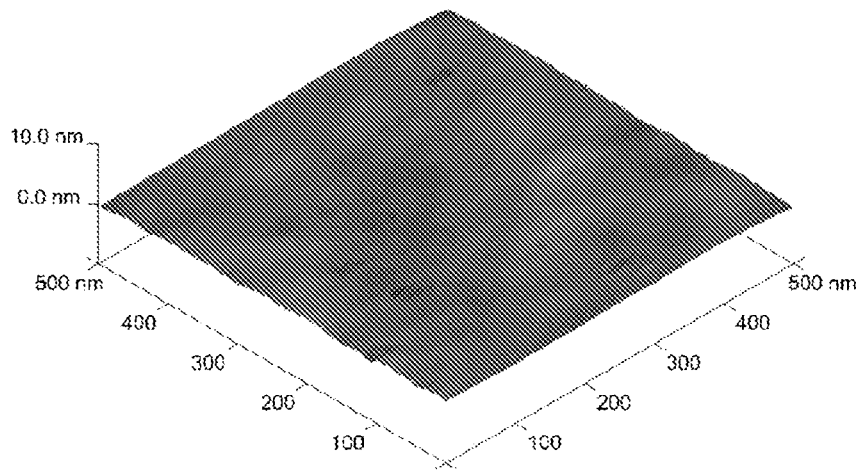
Figures 7A, 7B:
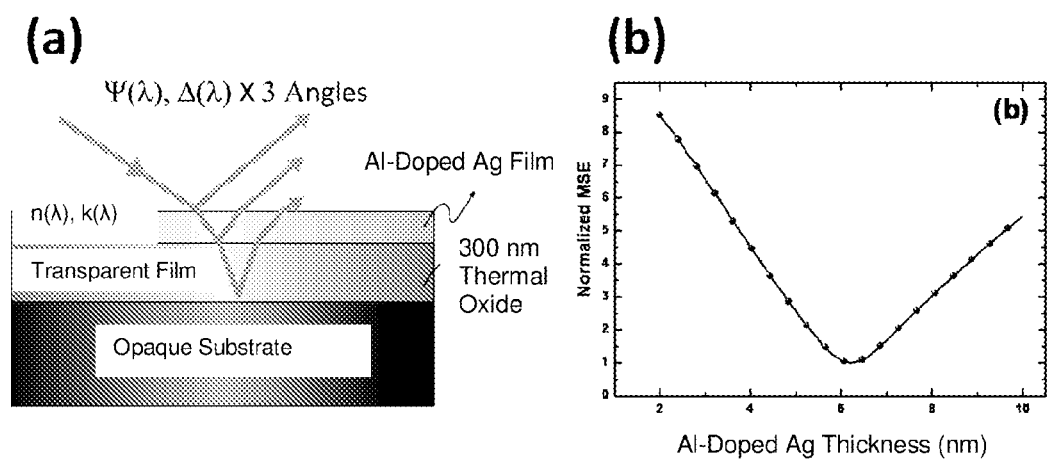
Figures 8A, 8B:
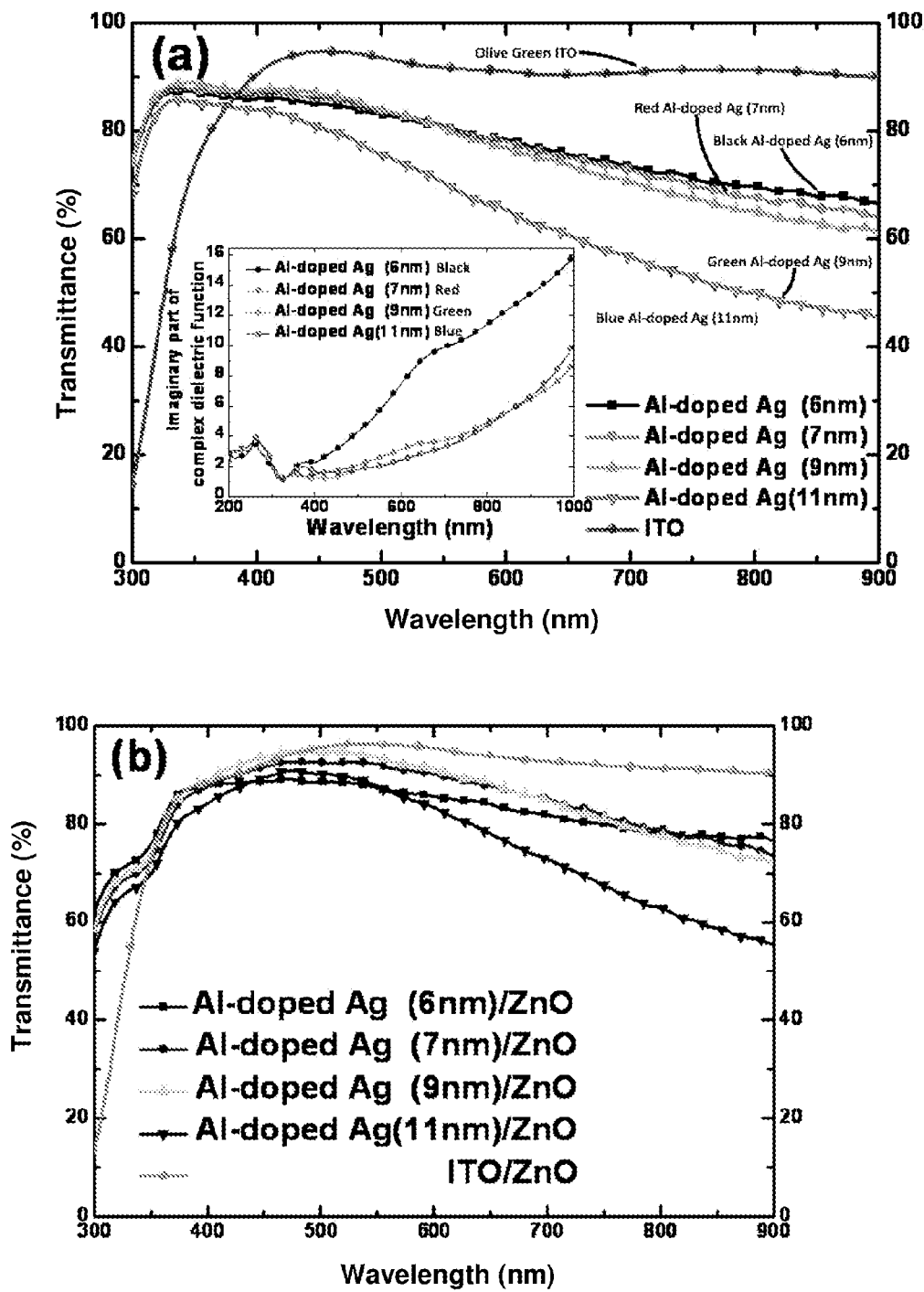

For the Al-doped Ag films, the one with 6 nm thickness has a slightly higher roughness (0.82 nm) than that with 7 nm one (0.78 nm). This is anticipated, since 6 nm is believed to be near the percolation threshold for the formation of a thin, continuous film. The initial stage of film could be more defective in its morphology compared to a thicker one, leading to its slightly higher roughness. Meanwhile, this higher roughness introduces additional optical loss, which is verified by the ellipsometry measurement as shown in the inset of FIG. 8(a). Beyond the percolation threshold at 6 nm, the roughness of the Al-doped Ag film decreases slightly when approaching 7 nm. Afterwards, the roughness increases gradually as film thickness increases to 9 nm (0.86 nm) and 11 nm (1.00 nm). Detailed AFM images of Al-doped Ag films with different thicknesses are shown in FIGS. 4(a)-4(d), with RMS roughness less than 1 nm, with the AFM image of the fused silica substrate shown in FIG. 5. In FIG. 5, the bare fused silica substrate has RMS roughness is 0.195 nm and R$_{max}$ is 1.81 nm. The result indicates that fused silica surface is relatively smooth; therefore, the effect of substrate surface roughness on film roughness is negligible. More specifically, FIGS. 4(a)-4(d) show tapping-mode AFM images of Al-doped Ag films having thicknesses of FIG. 4(a) 6 nm, FIG. 4(b) 7 nm, FIG. 4(c) 9 nm, and FIG. 4(d) 11 nm, showing the RMS roughness of 0.815 nm, 0.782 nm, 0.859 nm, and 1.00 nm, respectively. All films are deposited on fused silica substrates.

Moreover, the smooth surface morphology of the Al-doped Ag film also pertains to large film thickness. As shown in the insets of FIGS. 2(c)-2(d), for a 100 nm thick film, the Al-doped Ag film has a lower roughness than the pure Ag film (1.1 nm as compared to 3.6 nm). This is also demonstrated by SEM images taken at a 20 degree tilted angle shown in FIGS. 2(c)-2(d), showing drastically different morphologies.

Figure 6:
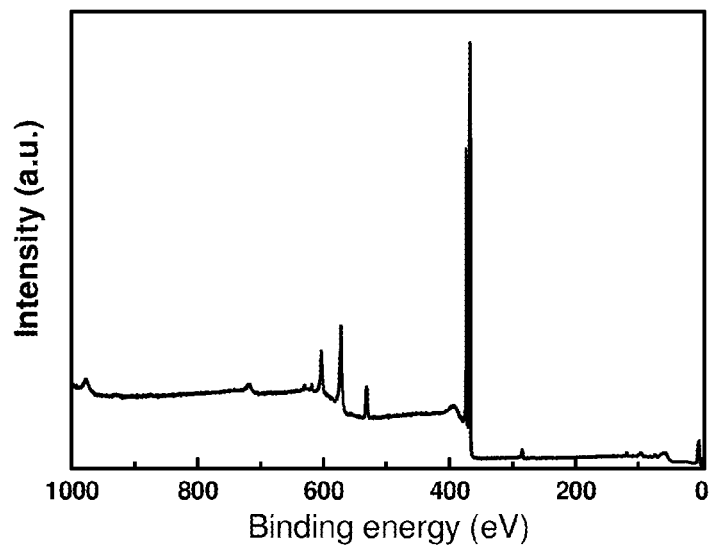

The Al incorporation into the Al-doped Ag film is about 10% atomic concentration in films deposited under a "300 W Ag and 200 W Al" magnetron sputtering power combination (referring to the power for respective sputter guns of Ag and Al), which is evidenced by X-ray photoelectron spectroscopy (XPS) measurements (FIG. 6). Al and Ag have almost identical atomic radii (1.44 Å for Ag and 1.43 A for Al) and the same crystalline structure (face centered cubic). Therefore, adding a small percentage of Al atoms into Ag film does not significantly affect the electrical and optical properties of the film. The film properties are thus similar to those of pure Ag film, but with the advantages of being ultra-thin and ultra-smooth.

Spectroscopic ellipsometry measurement is a reliable technique to accurately determine the thickness of ultra-thin films and their corresponding optical properties. In general ellipsometry measurement, there is a correlation between thickness and optical constants in thin absorbing films, as the reflection/absorption depends on both the film's thickness and its optical coefficients. To break this correlation and precisely determine the film thickness/optical constants, the "interference enhancement" method is implemented by depositing the metal film on the silicon substrate with a 300 nm thermal oxide layer on top. The measurement procedure is elaborated in FIG. 7(a).

In ellipsometer measurement, Ψ(λ) and Δ(λ) are measured at three different angles. They are related to the intensity and phase change of the S and P polarized light after reflection upon the sample. Afterwards, Ψ(λ) and Δ(λ) are used to fit the optical constants (n and k) and the thickness d of the film. In a thin absorbing film scenario, the fitting is not unique, as the change of reflection intensity can come from either the absorption coefficient of the film or the film thickness. To break up this correlation, a thin transparent layer (SiO$_2$ in this measurement) is put beneath the absorbing film. It provides extra reflected light and thus additional information for later data fitting. Using this "interference enhancement" method, both the film optical constants and thickness can be uniquely determined. FIG. 7(b) shows the normalized fitting error with Al-doped Ag thickness for the 6 nm case. There is minimum/converging fitting error at 6 nm, direct evidence of the ultra-thin feature of the inventive Al-doped Ag film. Therefore, experimentally confirmation of the 6 nm film thickness is consistent with the nominal thickness based on deposition rate calibration.

The ellipsometry data confirms the 6 nm film thickness, which is consistent with the nominal thickness based on the calibration of the Ag and Al deposition rate. The imaginary part of permittivity is a parameter signifying the optical loss of the film, and its values with varying film thickness are shown in the inset of FIG. 8(a). It is worth noting that a huge drop of the imaginary permittivity occurs for Al-doped Ag film thickness from 6 nm to 7 nm, corroborating the film roughness change described earlier. These results verify that 6 nm is the percolation threshold for Al-doped Ag film deposition, with further evidence presented later from electrical measurement.

FIGS. 8(a)-8(d) show the transmittance spectra of Al-doped Ag films with different thicknesses. Al-doped Ag films (FIG. 8(a)) and Al-doped Ag/ZnO films (FIG. 8(a)) with different thickness (6, 7, 9, and 11 nm) are respectively shown, in which ITO and ITO/ZnO films are shown as well.

Figure 8C:
Figure 8D:
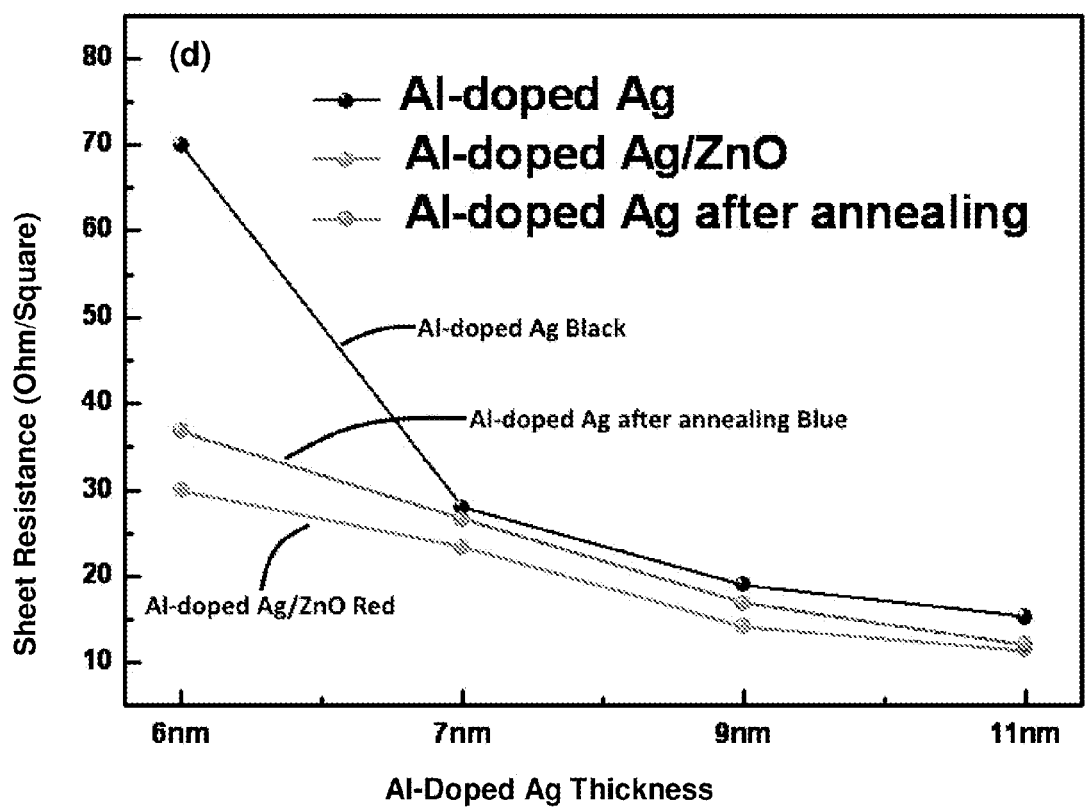

A photograph in FIG. 8(c) shows ITO/ZnO and FIG. 8(d) shows 7 nm Al-doped Ag/ZnO transparent conductors in front of a colored logo. The inset of in FIG. 8(a) compares the dependence of the imaginary part of the complex dielectric function on the wavelength for Al-doped Ag films with different thickness (6, 7, 9, and 11 nm). FIG. 8(d) shows sheet resistance versus Al-doped Ag film thickness (black: Al-doped Ag film; red: Al-doped Ag/ZnO film; blue: Al-doped Ag film after annealing in $N_2$ environment).

Figures 9A, 9B:
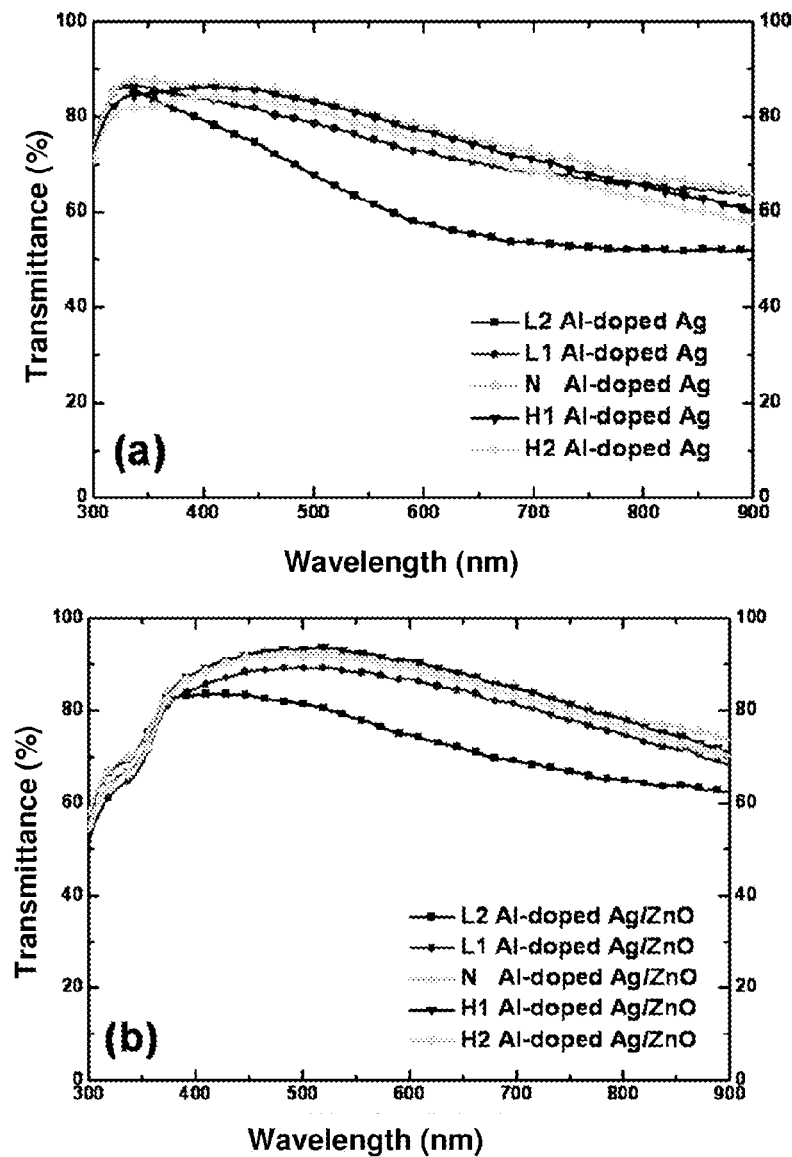

All of these films are highly transparent, with an 80% transmission at 550 nm (7 nm Al-doped Ag). A small transmittance shoulder is located at around 320 nm, close to the Ag bulk plasma frequency. As expected, an intrinsic property of a thin Ag film is that it becomes slightly transparent around its plasma frequency. Towards the UV end, the inter-band absorption becomes significant and the transmittance drops abruptly. At longer wavelengths, similar to other metals, the film approaches a perfect conductor and its reflection increases towards the infrared regime (FIG. 3(b)). As a consequence, film transmittance gradually drops, but still maintains a relatively high value (e.g. 65% at 900 nm for 7 nm Al-doped Ag). As a comparison, the transmittance of 9 nm pure Ag film, plotted in FIG. 3(a), is significantly lower than that of 9 nm Al-doped Ag film (55% versus 80% at 550 nm). There is a broad dip at around 450 nm, which results from the absorption of the cracks and voids constituting the film. Unlike a thicker Ag metal film described by the Drude model, the transmittance does not drop with the increase of the wavelength, which can again be attributed to the separate islands within the discontinuous film. The transmittance of the Al-doped Ag film varies with thickness as well, and is relatively high even at the percolation threshold of 6 nm due to its thin thickness. As film thickness increases, the transmittance drops, which is consistent with Beer's absorption law. The transmission spectra of 7 nm films (and films with ZnO coatings) with different Al doping concentrations are studied, as shown in FIGS. 9(a)-9(b). The Ag target power is fixed at 300 W, while the Al target power is adjusted to 100, 150, 200, 300, and 400 W. The calibrated Al deposition rates for magnetron sputtering are at 200 W and 400 W are 0.06 nm s$^{-1}$ and 0.15 nm s$^{-1}$, respectively. As stated before, the "300 W Ag and 200 W Al" appears to be an optimal power condition found from empirical results (corresponding to 0.9 nm s$^{-1}$ and 0.06 nm s$^{-1}$ deposition rate for Ag and Al), which are discussed below.

FIGS. 9(a) and 9(b) show transmittance spectra of a 7 nm Al-doped Ag films (FIG. 9(a)) and a 7 nm Al-doped Ag/ZnO films (FIG. 9(b)) with different Al doping concentrations. The Al doping concentrations are ordered from lowest to highest, with sample films denoted as L2, L1, N, H1, and H2, in which N refers to the film deposited under the optimal power condition corresponding to approximately 10% aluminum atomic concentration. The L2 film has a lower transmittance than the other four, which is expected since its Al doping is the lowest, making the film closer to a lossy Ag film. It is interesting to note that even such a small amount of Al has already promoted continuous Ag film formation. L1, N, H1, and H2 films have similar transmittance, with N and H1 films having slightly higher values than L1 and H2 films.

The effect of Al-doping concentration on the properties of Ag films is two-sided. On one hand, doping Al greatly reduces the RMS roughness of the Ag film and promotes continuous film formation, improving its optical transmittance and electrical conductivity. Insufficient doping would not fully promote continuous film formation, as indicated in the case of L2. On the other hand, excess Al doping could introduce defects in the film, leading to optical loss. These defects can also act as scattering sites for the free electrons in the film. Therefore, excess Al doping is detrimental (e.g., H2). In these examples, it appears that the "0.9 nm s$^{-1}$ and 0.06 nm s$^{-1}$ rate" combination exhibits an optimal performance.

In certain aspects, the present disclosure includes use of electrically conductive thin films having a high UV transparency. ITO has been the transparent conductor of choice in most industrial applications, including in GaN LED lighting. However, while ITO remains fairly transparent at blue wavelength, its transparency drops sharply at UV range (e.g., below 300 nm, see FIG. 8(a)). FIG. 8(a) shows a comparison of transparency of ITO and Al-doped Ag at visible and UV ranges. In comparison, Al-doped thin Ag films prepared in accordance with certain aspects of the present disclosure have transparency of about 70% at 300 nm. Therefore, such films are particularly desirable for use in applications like GaN based LED to emit efficiently in the UV range.

The ultra-thin and ultra-smooth Al-doped Ag film contemplated by the present teachings thus satisfies the requirements of a desirable transparent electrode by its simple fabrication process, nearly-flat transmission spectrum, easy device integration, and robustness. It is notable that surface roughness of electrodes is detrimental to the reliability of organic optoelectronic devices, originating from irregularities of the electrode itself or tiny particles adsorbed on top of its surface. Because the entire device's thickness is only on the order of 100 nm, a rough surface could easily result in electrical shorts between its electrodes, especially for large-area devices. Devices with rough electrodes are prone to exhibit low efficiency due to the current shunt paths, which produce higher dark current. This fabricated smooth Al-doped Ag film according to certain embodiments of the present disclosure is of significance in providing a simple solution to overcome this problem.

Thus ultra-thin Al-doped Ag films according to certain embodiments of the present disclosure have high transparency while retaining good electrical conductivity. Its transmittance is greater than 80% until approximately 500 nm, dropping at longer wavelengths. This behavior is typical of continuous metal films, where there is increased reflection from the film at longer wavelengths. The increased reflection from the thin film, together with the top Ag anode as shown in the OPV device structure in FIGS. 1(b) and 1(c), can be advantageously utilized to form other structures, such as a Fabry-Perot optical cavity to improve the optical absorption of the thin organic active layer. This strategy can increase the PCE of the OPV, especially when considering the higher photon flux of the solar spectrum in the longer wavelength region (600-800 nm). Similar to the case of dielectric/Ag/dielectric transparent conductors, it is also found that adding a thin dielectric layer can further increase film transparency. For example, when 20 nm $SiO_2$ is added on a 7 nm doped Ag film as a protection layer, the film transmittance increases by approximately 10%. This feature can be explained by the thin dielectric layer functioning as an anti-reflection coating. This property is also useful for the OPV device application detailed below.

Figure 10:
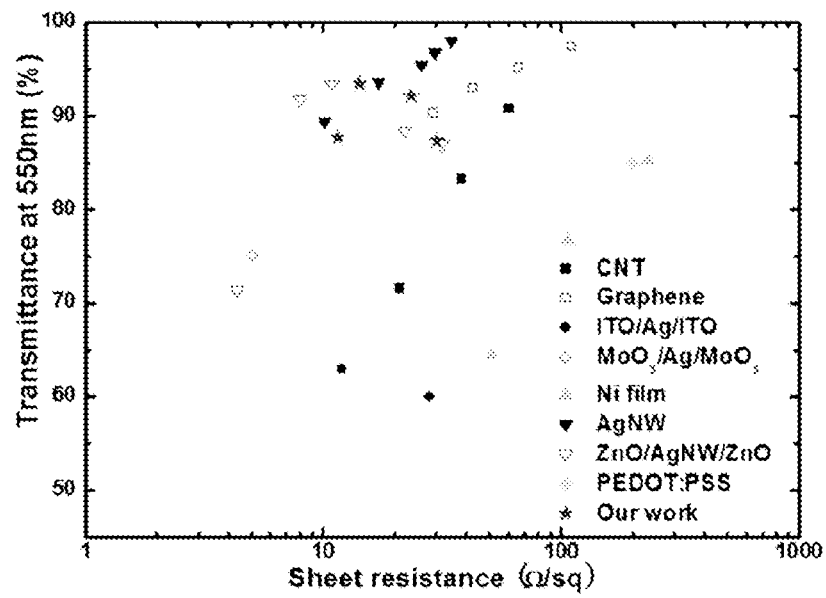

In the inverted OPV structure shown in FIGS. 1(b)-1(c), 45 nm ZnO (layer 112) is spin-coated onto the Al-doped Ag film to work as an electron transporting and hole blocking layer. Similar to adding a thin $SiO_2$ layer, the overall transmittance of this structure is further increased to above 80% from 400 to 800 nm in the case of a 7 nm-thick electrode, exhibiting a transmittance of 92% at 550 nm as shown in FIG. 9(b). This can be explained with the fact that the ZnO layer is believe to work as an anti-reflection layer (FIG. 3(b)). The properties of these deposited films are compared to other reported works in terms of transmittance at 550 nm versus sheet resistance (FIG. 10), with the ZnO-coated Al doped Ag film showing similar or superior performance. FIG. 10 has a comparison of optical transmittance (at 550 nm) versus sheet resistance for an embodiment of the Al-doped Ag/ZnO according to the present disclosure as compared to carbon nanotubes (CNT), graphene, a stack of ITO/Ag/ITO, a stack of $MoO_3$/Ag/$MoO_3$, nickel thin films, silver nanowires (AgNW), a stack of ZnO/AgNW/ZnO, and PEDOT:PSS. Because the ZnO layer thickness needs to meet other requirements for the OPV device operation, no further optimization of ZnO thickness is carried out at this stage to achieve the maximum transmittance.

The sheet resistances of Al-doped Ag (Al-doped Ag/ZnO) films with different Ag layer thicknesses of 6, 7, 9, and 11 nm are 70 (30), 28 (23.4), 19 (14.2), and 15.3 (11.5) $\Omega sq^{-1}$, respectively (FIG. 8(d)). The Ag film conductivity improves as its thickness increases. Notably, there is a significant drop in the sheet resistance from 6 nm to 7 nm film, which further supports findings that around 6 nm appears to be a percolation threshold. The conductivity of the film is further improved after ZnO coating applied to the Al-doped Ag film, which is partially attributed to the baking treatment for converting ZnO sol gel to ZnO crystalline film (discussed further below).

Figures 11A, 11B:
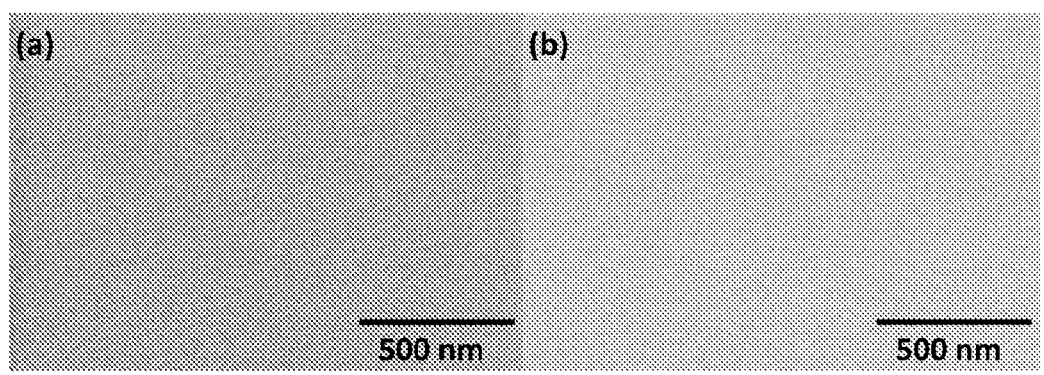

To prove this, post-annealing treatment to Al-doped Ag films in a nitrogen ($N_2$) environment is done at 150° C. for 15 minutes (the same temperature and time as that for baking ZnO sol gel film), resulting in an observed drop in sheet resistance as shown in FIG. 8(d). Meanwhile, the SEM images for 9 nm Al-doped Ag film before and after the annealing treatment have been taken, as shown in FIGS. 11(a)-11(b), and exhibit no discernible change in morphology. These results imply that high temperature annealing makes the doped film itself more conductive, and that this film is robust against high temperature treatment. It is notable that in this annealing process, film oxidation is prevented by the ZnO sol gel encapsulation. Generally, the defects and scattering sites in the thin films that affect the free electron motion can be reduced by annealing, explaining the improved conductivity of the film. Moreover, the sheet resistances of Al-doped Ag (Al-doped Ag/ZnO) films with different Al concentrations of L2, L1, N, H1, and H2 are also measured, which are 28.3 (22.3), 27 (21.6), 28 (23.4), 28.5 (23.9), and 29.2 (24.1) $\Omega sq^{-1}$, respectively (Table 1).

Summary of the main photovoltaic parameters of the devices with ITO and Al-doped Ag films with different thickness as electrode.

TABLE 1

| | Transmittance @ 550 nm (%) | | Sheet resistance ($\Omega$/sq) | |
|---|---|---|---|---|
| Al-doped Ag | Before ZnO | After ZnO | Before ZnO | After ZnO |
| L2 | 62.2 | 78.3 | 28.3 | 22.3 |
| L1 | 75.4 | 88.2 | 27.0 | 21.6 |
| N | 81.0 | 92.2 | 28.0 | 23.4 |
| H1 | 80.2 | 92.5 | 28.5 | 23.9 |
| H2 | 78.0 | 90.9 | 29.2 | 24.1 |

Figures 12A, 12B:
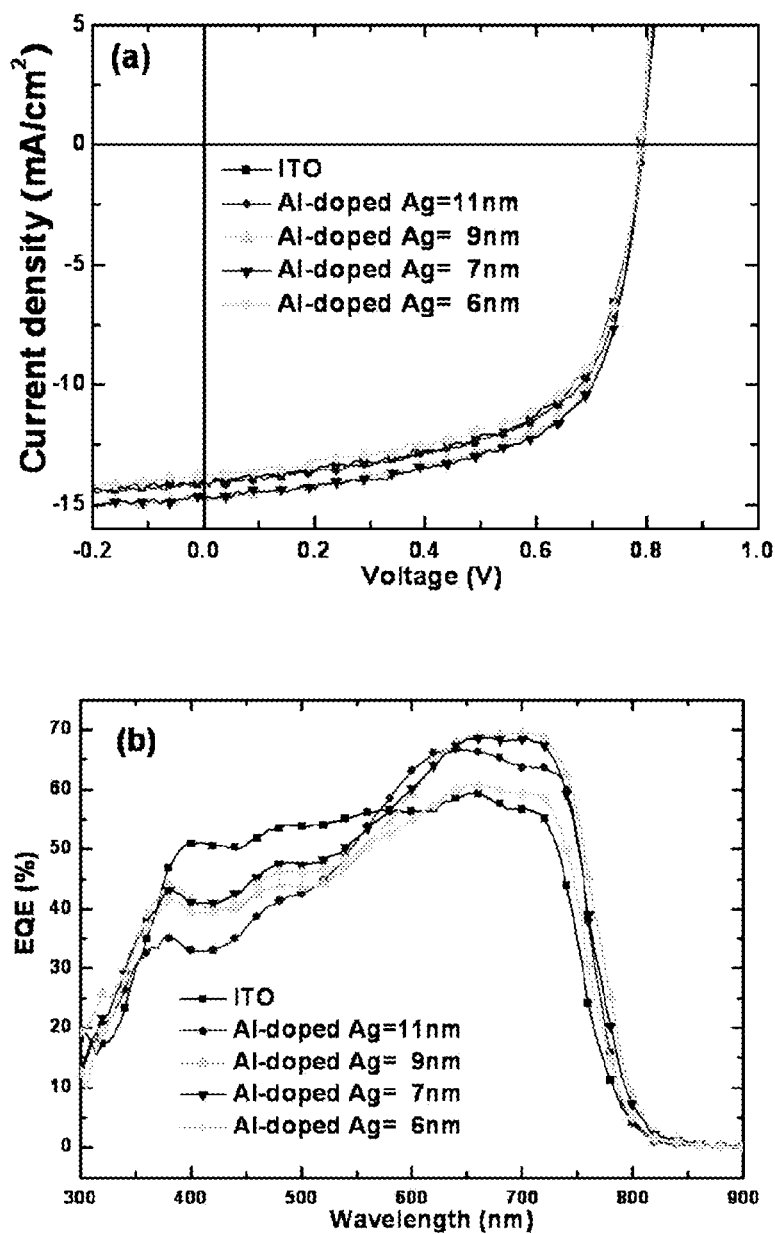

FIG. 12(a) shows J-V characteristics of OPVs incorporating conventional ITO based films or ultra-thin Al-doped Ag-based films as transparent electrodes, while FIG. 12(b) shows external quantum efficiencies (EQEs) of OPVs incorporating ITO based and ultra-thin Al-doped Ag transparent electrodes. Al-doped Ag films are deposited with different thickness to evaluate their feasibility as the transparent electrode in OPVs, and their performance is compared to OPVs made with ITO electrodes, while keeping other device layers identical. Al-doped Ag films having a thickness of 11 nm, 9 nm, 7 nm, and 6 nm are compared with ITO when used in OPVs as transparent electrodes. Table 2 shows a summary of the main photovoltaic parameters of the devices with ITO and Al-doped Ag films with different thickness as electrode.

TABLE 2

| | $J_{sc}$ [mA cm$^{-2}$] | $V_{oc}$ [V] | FF [%] | PCE [%] | $R_s$ [$\Omega \cdot cm^2$] | $R_{sh}$ [$\Omega \cdot cm^2$] |
|---|---|---|---|---|---|---|
| ITO | 14.00 | 0.80 | 61.3 | 6.87 | 4.0 | 462.9 |
| Al-doped Ag-11 nm | 14.03 | 0.80 | 62.0 | 6.95 | 3.9 | 460.0 |
| Al-doped Ag-9 nm | 14.7 | 0.80 | 62.5 | 7.35 | 3.3 | 498.2 |
| Al-doped Ag-7 nm | 14.76 | 0.80 | 63.0 | 7.44 | 3.0 | 512.5 |
| Al-doped Ag-6 nm | 13.71 | 0.80 | 61.3 | 6.72 | 3.4 | 368.0 |

Figures 13A, 13B, 13C, 13D:
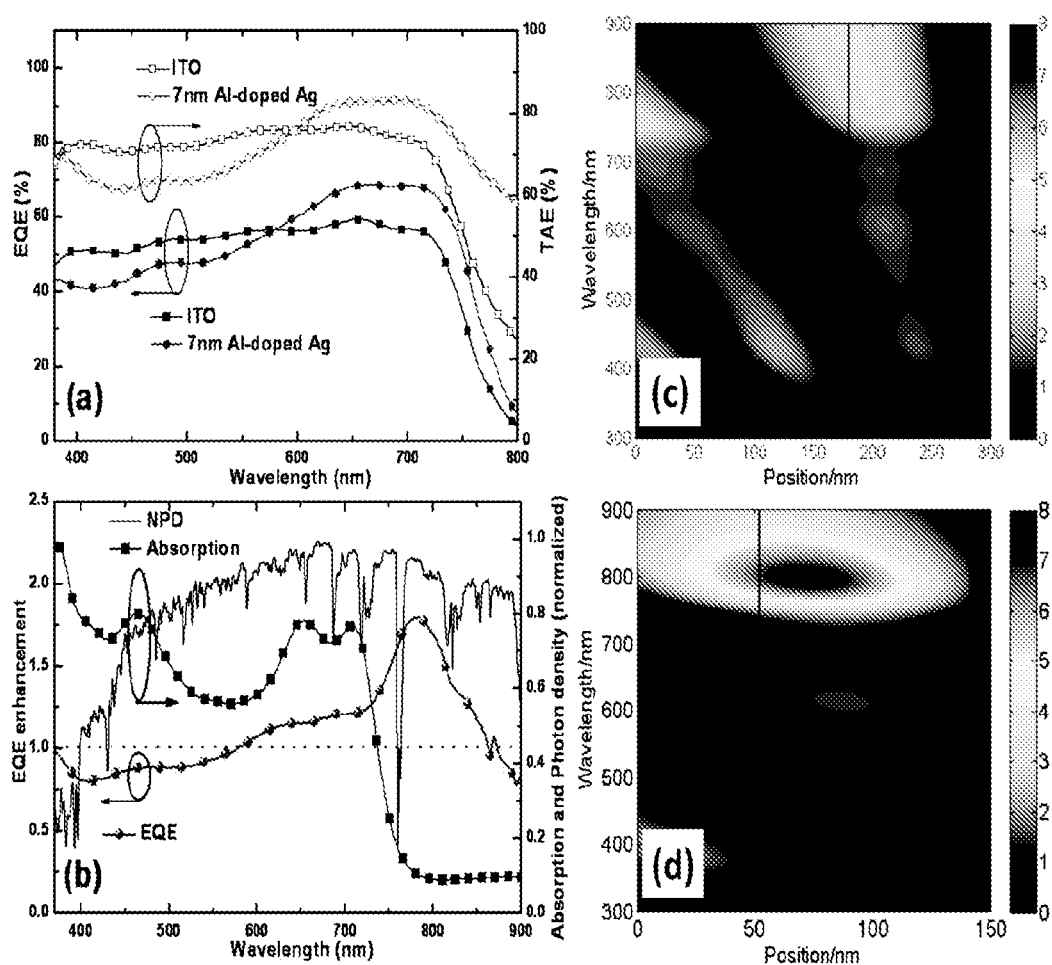

The device geometry using ITO and ultra-thin Al-doped Ag electrodes is shown in FIGS. 1(b) and 1(c), respectively electrode 110 or electrode 120. The active layer 114 comprises PBDTTT-C-T:$PC_{70}BM$ and forms the bulk heterojunction for the light absorption and photocurrent generation. This blended organic active layer exhibits broad and strong absorption from 350 to 750 nm as shown in FIG. 13(b). It is substantial that this doped Ag film does not require any surface treatment for making the OPV device. FIG. 13(a) shows the comparison of the J-V characteristics of the devices whose electrode is either ITO or ultra-thin Al-doped Ag films of different thicknesses (co-sputtered by Ag source power at 300 W and Al source power at 200 W). The summary of the main photovoltaic parameters of the devices with ITO or Al-doped Ag electrode films of different thicknesses is tabulated in Table 2.

An ITO-based device has a PCE of 6.87% with a short-circuit current density ($J_{sc}$)=14.00 mA cm$^{-2}$, open-circuit voltage ($V_{oc}$)=0.80 V, and fill factor (FF)=61.3%. Devices built using Al-doped Ag films of various thicknesses as transparent cathodes produce consistently better efficiency than those made produced with ITO electrodes. Note that the device made with 6 nm Al-doped Ag has similar performance to ITO-based devices. It is believed that certain variations made in accordance with the present teachings demonstrate the thinnest Ag film produced without any wetting layer, especially advantageous for use as electrodes in OPVs. With the decrease of film thickness from 11 nm to 7 nm, $J_{sc}$ and FF increase, producing a maximum PCE of 7.44% at 7 nm. However, further decrease of Al-doped Ag thickness to 6 nm lowers the $J_{sc}$ and decreases PCE to 6.72%. The identical measured $V_{oc}$'s of 0.8 V imply that favorable Ohmic contacts are formed at both anode and cathode electrodes for either ITO or Al-doped Ag film by the use of interfacial metal oxide layers, $MoO_3$ and ZnO. Therefore the $V_{oc}$ is essentially determined by the difference between the highest occupied molecular orbital (HOMO) of PBDTTT-C-T and the lowest unoccupied molecular orbital (LUMO) of $PC_{70}BM$. Meanwhile, the FFs of ITO and Al-doped Ag based devices are comparable, due to the good contacts of ITO or Al-doped Ag with a ZnO layer, resulting in similar series resistances as shown in Table 2. Therefore, it can be concluded that the increase in the PCE of the Al-doped Ag based devices primarily originates from the enhancement of $J_{sc}$.

FIGS. 13(a)-13(d) also show the external quantum efficiencies (EQEs) of the devices with ITO and ultra-thin Al-doped Ag films with different thicknesses as electrodes. An OPV incorporating a conventional ITO electrode and OPV incorporating a 7 nm thick Al-doped Ag film electrode in accordance with certain aspects of the present disclosure have EQE and TAE enhancements in FIGS. 13(a)-13(b), as well as the normalized absorption spectrum of an active layer (PBDTTT-C-T:PC$_{70}$BM) and normalized photon density of AM1.5G solar light. Simulation of the optical field intensity ($|E|^2$) distribution versus position and wavelength is shown in FIG. 13(c) for an ITO based device and FIG. 13(d) for a 7 nm Al-doped Ag based OPV device according to certain aspects of the present disclosure, where the enhanced optical field in the active layer around 800 nm is responsible for the measured EQE enhancement at the same wavelength range shown in FIG. 13(b).

Their spectral responses reflect the capability of these devices in converting photons to electrons at certain wavelengths, where the $J_{sc}$ can be obtained from the integral of the product of the EQE and incident light from the solar simulator with AM 1.5G solar spectrum. The spectral response of devices incorporating the Al-doped Ag based films is different from that of ITO based device, in which the former exhibit significant enhancement in long wavelength range, while the ITO based device has a fairly flat response.

In order to understand the origin of the photocurrent enhancement, the EQE and total absorption efficiency (TAE=1−R, where R is the measured reflection from the device) are plotted and compared in FIG. 13(a), as well as relative TAE and EQE enhancement (ratio of 7 nm doped-Ag based device over ITO based device) in FIG. 13(b). The 7 nm Al-doped Ag based OPV device shows a reduced EQE in the range from 370 to 580 nm due to lower transparency of the doped Ag film than that of ITO. However, the EQE enhancement from 580 to 870 nm is evident, contributing to a large increase in the photocurrent. Quantitatively, for a 7 nm Al-doped Ag based device, the reduction in $J_{sc}$ due to the decrease of EQE in the range of 370-580 nm is estimated to be 0.6 mA cm$^{-2}$. Meanwhile, the enhancement in $J_{sc}$ contributed by the increase of EQE in the range of 580-870 nm is estimated to be 1.4 mA cm$^{-2}$, which produces a total enhanced $J_{sc}$ of 0.8 mA cm$^{-2}$. These results closely match the measured J-17 characteristics, because of the high photon density of AM1.5G solar light in this range.

To further investigate the origin of the EQE enhancement in the Al-doped Ag based devices, simulations and investigations of the optical field intensity ($|E|^2$) distribution versus position and wavelength were performed for ITO and 7 nm Al-doped Ag based devices (shown in FIGS. 13(c)-13(d), since light absorption and photocurrent generation in the active layer is strongly correlated with the optical field intensity. This simulation is based on 1D transfer matrix method. The incident light is incident normally to the glass substrate side and the field intensity $|E|^2$ inside the solar cell is averaged over p and s polarizations and normalized to the incoming field intensity. For the 7 nm Al-doped Ag based device, a resonance cavity is formed in the active layer between the reflective top Ag anode and the semi-transparent Al-doped Ag cathode, exhibiting a spectrum peak located close to the absorption edge of PBDTTT-C-T: PC$_{70}$BM, beyond 750 nm (in the range from 750 to 850 nm). Such a cavity effect, and the resultant increase in the optical field intensity, will lead to more efficient light harvesting as the active material layer itself has low absorption in this region. Even though the benefit of this resonance effect is reduced by the lower EQE at wavelengths below 550 nm (cf the flat EQE spectrum of the ITO device shown in FIG. 13(a)), the higher photon flux at a longer wavelength range (600-800 nm) overcompensates the loss in the lower wavelength range (FIG. 13(a)).

Figures 14A, 14B:
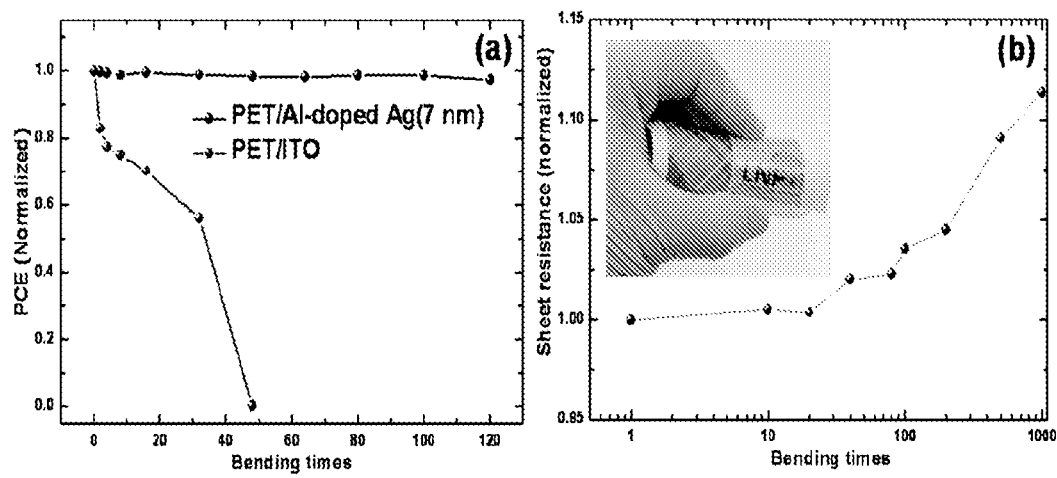
Figure 15:
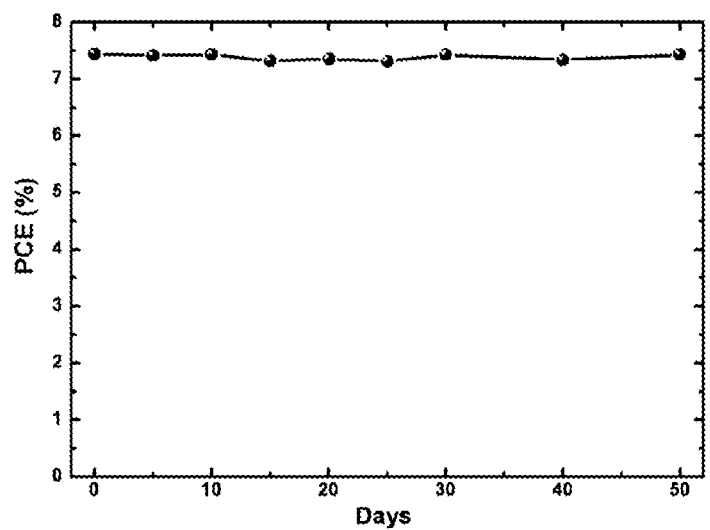

Finally the ultra-thin film deposited on flexible PET film shows excellent mechanical stability as compared with ITO on PET. The ITO based device significantly degraded each time it is bent, and stopped operating altogether after being bent 40 times (FIG. 14(a)). On the contrary, the 7 nm Al-doped Ag based OPV device has much more stable performance even after 120 bending cycles, showing no obvious performance degradation. The film sheet resistance increased by only 10% after being bent 1,000 times (FIG. 14(b)). The robustness of Al-doped Ag film over time is another unique and important feature. The sputtered films are simply kept in atmosphere without protection layers, and no obvious change in color and transparency is observed even after more than 1 month. Long-term stability of the electrode is crucial in practical applications in organic electronics. FIG. 15 shows the dependence of the PCEs of the Al-doped Ag based devices on the storage time. The result indicates that the device with Al-doped Ag film as electrode has stable performance over time.

Figure 26D:
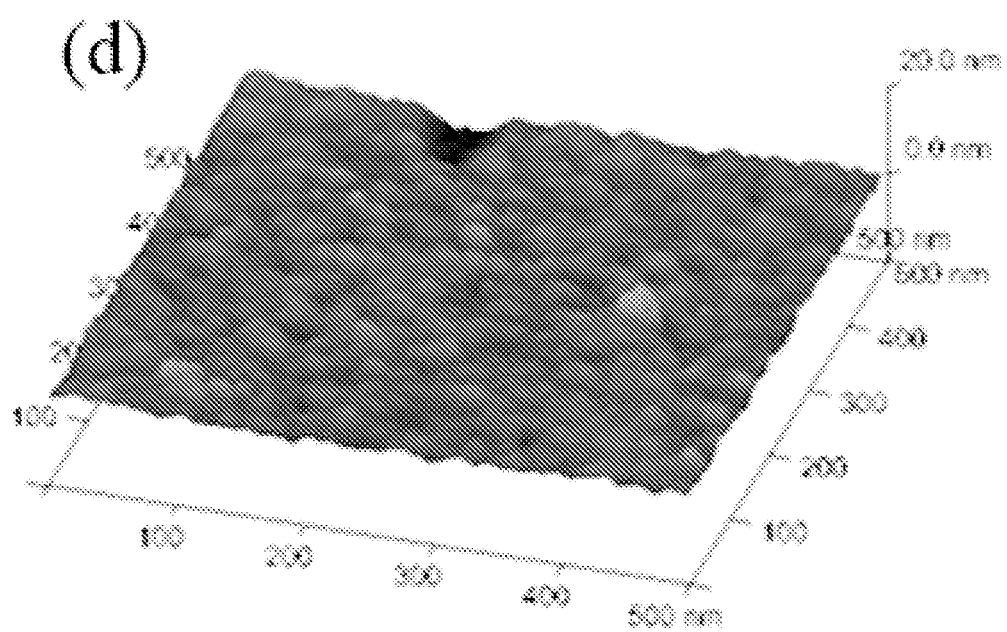

In certain aspects, an Al-doped Ag film prepared in accordance with certain aspects of the present disclosure has significantly improved high temperature thermal stability than pure thin Ag film: it can sustain thermal treatment as high as 500° C. FIG. 26(a) shows an SEM image of Al-doped Ag film as deposited, while FIG. 26(b) shows an SEM image of 500° C. annealed Al-doped Ag film. There is no obvious morphology change between two films, and the annealed film has larger grain size which contributes to its reduced optical loss. This is also confirmed by the AFM study (FIGS. 1c and 1d). The as-deposited film has a RMS roughness of 0.773 nm, while the 500 C annealed film has a value of 0.836 nm.

Figure 16:
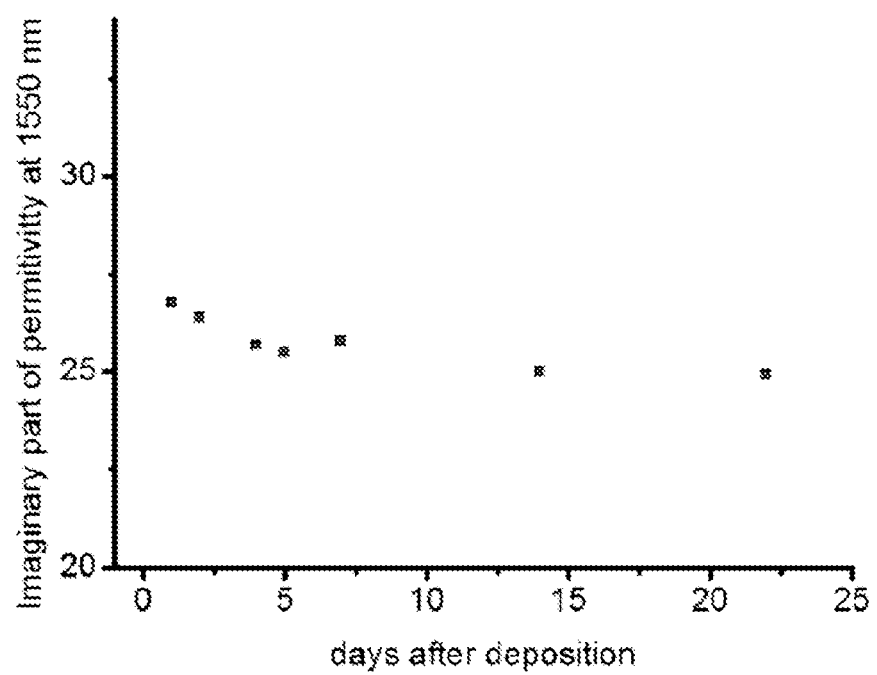

FIG. 16 shows the imaginary part of permittivity at 1550 nm of an aluminum-doped silver film over time. The Al-doped Ag film has good stability after deposition. The film is kept in atmosphere without any special protection (in air) and its optical property is monitored with time. As shown in FIG. 16, its property stays unchanged for at least three weeks and no degradation is observed. The film also shows good thermal stability. The film can withstand 500° C. heating for at least 10 minutes in $N_2$ environment. In contrast, de-wetting happens for pure silver and de-wetting of gold happens at temperatures above than 350° C.

Figure 27:
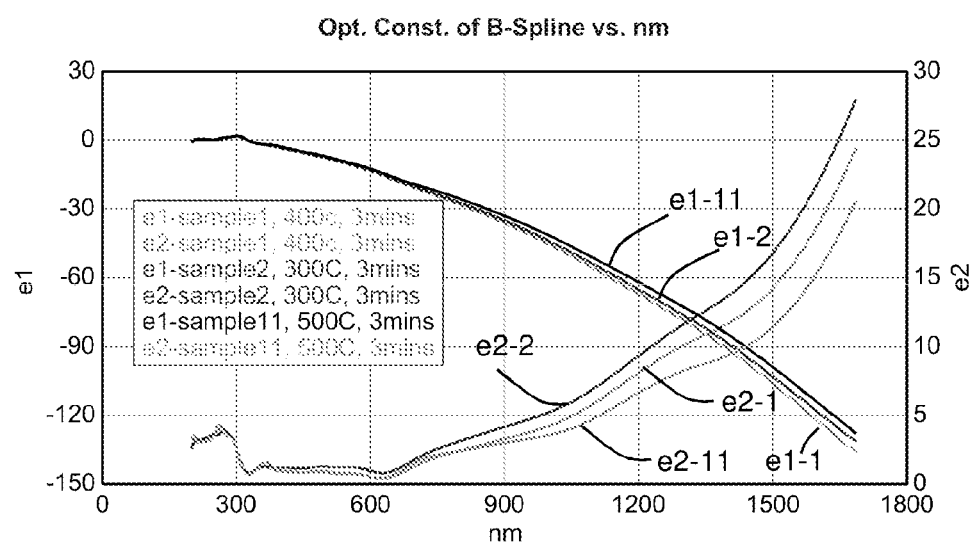
FIG. 27 shows the measured permittivity of Al-doped Ag film under different annealing temperatures.

Another advantage of the annealing treatment is the reduced film optical loss. FIG. 27 shows the measured permittivity of Al-doped Ag film under different annealing temperatures. As can be seen, at a higher annealing temperature, the film optical loss is reduced. It is also worth noticing that under the same annealing temperature, the effect of treatment time on the film property is not evident The results of film loss reduction of films treated for 10 minutes and for just 10 seconds have been observed and the results are similar.

Figure 17:
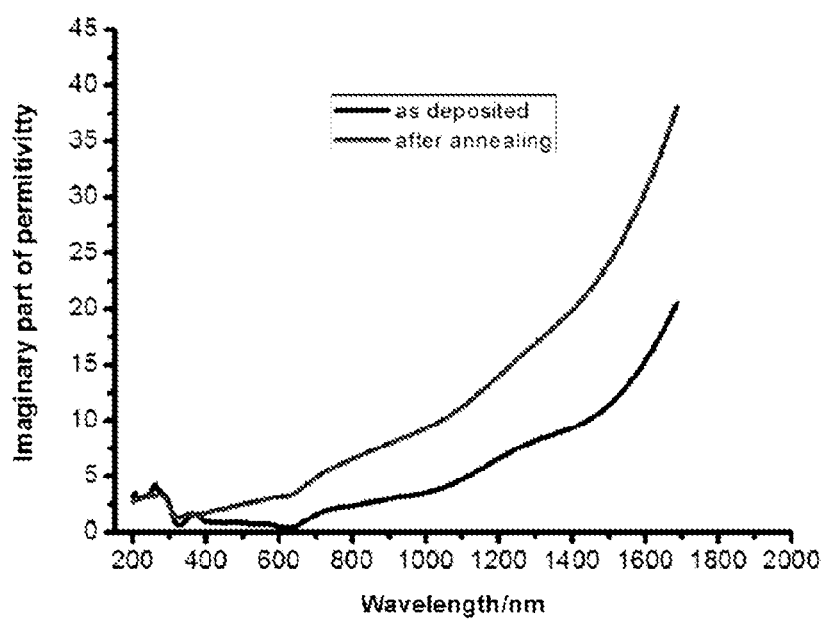

FIG. 17 shows optical property improvement of an aluminum-doped silver film after annealing according to certain aspects of the present disclosure (before and after annealing). Loss (denoted by the imaginary part of permittivity (E2)) is significantly reduced by annealing and approaches that of bulk silver. Film optical property improvement with annealing. Its loss (denoted by the imaginary part of permittivity) is significantly reduced by annealing and gets close to that of bulk silver. This low loss material is particularly advantageous in applications such as long range surface plasmonic waveguide, hyperbolic meta-materials, and the like.

In certain aspects, the present disclosure provides an ultra-thin, smooth, and low-loss Al-doped Ag film without any wetting layer by co-depositing small amount of conductive metals, like aluminum (Al), with silver (Ag). Incorporation of small amount of Al suppresses the island formation of Ag film and facilitates continuous film growth, which reduces the percolation threshold of film thickness down to 6 nm or less, determined by optical, electrical and morphological measurement. Ultra-thin films can be as thin as about 6 nm with roughness below 1 nm and also exhibit excellent mechanical flexibility. The film properties are similar to those of a low-loss pure Ag film, with the additional advantages of being ultra-thin and ultra-smooth. The thin Al-doped Ag films have a much smoother surface, with measured RMS roughness below 1 nm, representing more than one order of magnitude improvement over a thin pure Ag film. Organic photovoltaics using such thin film as transparent electrode show superior efficiency to their ITO counterparts by improved photon management. A smooth electrode reduces the possibility of shorting and is highly desired for the reliability of organic thin film devices. As one of many applications of thin metal films, such thin films have been employed in OPVs as transparent electrodes, producing performance-enhanced devices compared to ITO-based ones. Improvements in performance include the photocurrent enhancement by the strong resonant light trapping effect in the polymer active layer at its absorption spectrum edge, as well as the high photon density of the solar spectrum in this range. The Al-doped Ag thin film electrode shows excellent flexibility and stability compared with its conventional ITO electrode counterpart. Al-doped Ag film is thus an effective alternative to current transparent conducting electrodes because of its simple deposition process, close-to-flat and high transmittance, high conductivity, and friendly device integration.

By way of further applicability, the materials prepared in accordance with the present disclosure may be used as meta-materials. Hyperbolic meta-materials (HMMs) are widely studied artificially engineered structures, and have found promising applications in super-resolution imaging, enhancing spontaneous emission decay rate and engineering thermal radiation. One way to fabricate HMMs is by alternating metal and dielectric layers, where silver (Ag) is commonly chosen for HMMs in the visible light range by its relatively low loss compared to other metals. To approximate such a multilayer stack as an effective medium of homogeneous material, each layer thickness needs to be much smaller than the wavelength. However, it has been challenging to obtain thin and smooth Ag films, as Ag is known to follow Volmer-Weber 3D growth mode during film deposition and tend to form rough or even island-like morphology for thin films.

An ultra-thin Al-doped Ag film used as a meta-material is explored here. A control sample of pure Ag film having a thickness of 9 nm and an example of a 9 nm Al-doped Ag film are used. The 9 nm pure Ag film is discontinuous with large roughness of 10.8 nm as measured by AFM. In sharp contrast, the Al-doped Ag film shows smooth surface morphology with a 0.86 nm roughness.

Figures 18A, 18B, 18C, 18D:
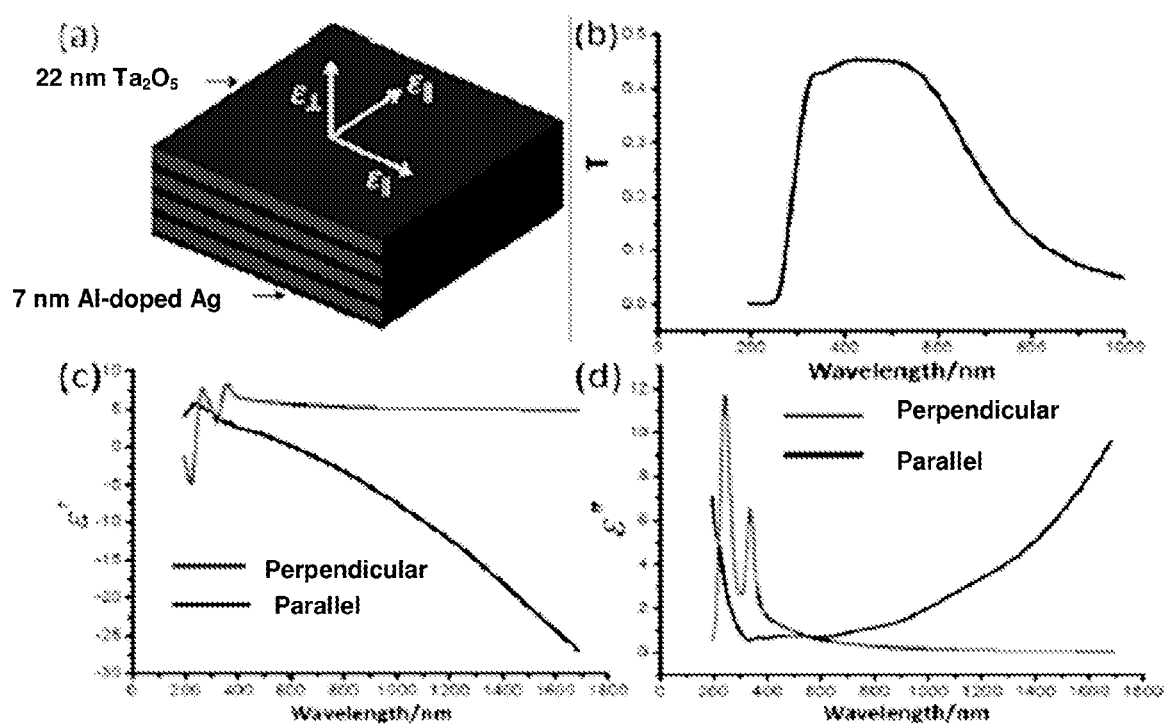

A fabricated HMM structure is shown in FIG. 18(a) composed of four periods, alternating layers of 7 nm Al-doped Ag and 22 nm $Ta_2O_5$, starting with Ag. The measured normal incidence transmission is shown in FIG. 18(b). It has a high amplitude and smooth transmittance across the visible range, which benefits from both the ultrathin thickness and smoothness of the metallic layer. Compared with recent similar structures using thicker Ag and oxide, no oscillations in the transmission spectrum are observed, which proves that the HMM structure behaves close to a homogeneous effective medium.

The structure's optical properties are characterized using spectroscopic ellipsometry. The multi-layer stack has uniaxial anisotropy, with different in-plane (parallel) and out-of-plan (perpendicular) permittivities. The measured permittivities are plotted in FIGS. 18(c)-18(d). In the parallel direction, the epsilon near zero (ENZ) point is around 610 nm, where the effective medium dispersion changes from the ellipsoidal to hyperbolic behavior. In the perpendicular direction, epsilon has a pole near 340 nm. Epsilon near pole (ENP) meta-materials have been proposed as emitters in thermo-photovoltaics.

Thus, wetting-layer-free layers are formed of ultra-thin and smooth Al-doped Ag film with thicknesses of 6 nm or less and roughness of less than 1 nm. Multilayer meta-materials using Al-doped Ag and $Ta_2O_5$ can be treated as effective medium, showing high transmittance and homogeneous response. Anisotropic permittivities are obtained by spectroscopic ellipsometry. Such structures are capable of use in HMMs.

In other aspects, ultrasmooth and thermally-stable Ag-based films on $SiO_2$/Si substrates are fabricated in accordance with certain aspects of the present disclosure by Al-doping. The effect of Al-doping on the surface morphology and stability of ultrathin Ag films at room temperature and elevated temperature is further investigated here. The Al-doped Ag films with Al concentration of 4 atomic % have a sub-nanometer RMS roughness as low as 0.4 nm. The ultrasmooth surface morphology is invariable even after 300° C. annealing in $N_2$. Al-doping enhances the nuclei density of films. Moreover, a capping layer spontaneously formed over the Al-doped Ag films that greatly restrains the surface diffusion and mass transportation of Ag atoms. Therefore, Al-doping endues ultrathin Ag films with highly-stable and ultrasmooth surface morphology.

As noted previously, poor stability of pure Ag films and the associated nanostructures is another barrier for many practical applications. Dewetting occurs spontaneously on various substrates, even at room temperature, especially for Ag films having ultrathin thicknesses. Atomically flat ultrathin Ag films tend to transform to 3D islands for the Ag/dielectric nonwetting system. This dewetting tendency becomes more obvious at elevated temperature. Dewetting has been observed even for 35 nm thick Ag films on $SiO_2$ when the temperature exceeds 102° C. In order to improve the stability of Ag films, adding an adhesion layer is a common strategy. However, the detrimental effects of adhesion layer on the performance of plasmonic devices have been reported and are problematic.

The methods of the present disclosure enable a simple and cost effective approach for fabricating ultrasmooth Ag-based thin films with both a sub-nanometer RMS roughness and high thermal stability. These features are achieved by introducing a small amounts of Al into Ag during co-deposition. In certain aspects, the RMS roughness of 15 nm Al-doped Ag film is as low as 0.4 nm. The RMS roughness and surface morphology of the ultrasmooth film remain essentially unchanged even after annealed at 300° C.

Al-doped Ag films are fabricated by co-sputtering of Ag and Al, as described in the examples above. The concentration of Al may be controlled by varying the sputtering power for Al target while keeping a constant sputtering power of 200 W for the Ag target. The Al-doped Ag films using the sputtering power of 60 W, 95 W, 130 W, 165 W, and 200 W for Al target are respectively denoted as AA-60, AA-95, AA-130, AA-165, AA-200. The deposition rate of Ag is calibrated as 0.6 nm/s at 200 W power, and that of Al is 0.06 nm/s at the same power. The film thickness is controlled by the deposition time. The films for AFM, XPS, and SEM characterization are deposited on $SiO_2$/Si(100) substrates, which are cleaned in acetone and IPA, and dried with nitrogen. Since there is a native oxide layer on the Si wafer, such substrates are referred to as $SiO_2$/Si(100) substrate. The films for optical measurements are deposited on fused silica substrates.

Figure 19A:
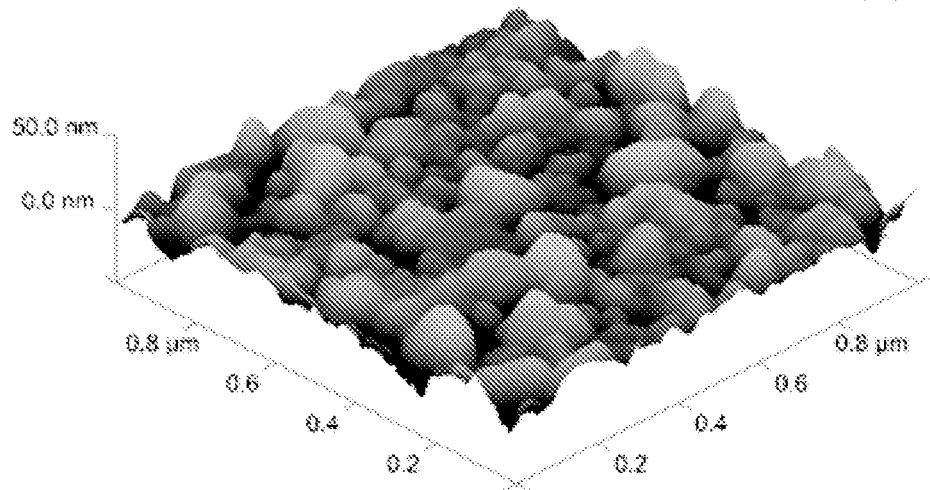
Figure 19B:
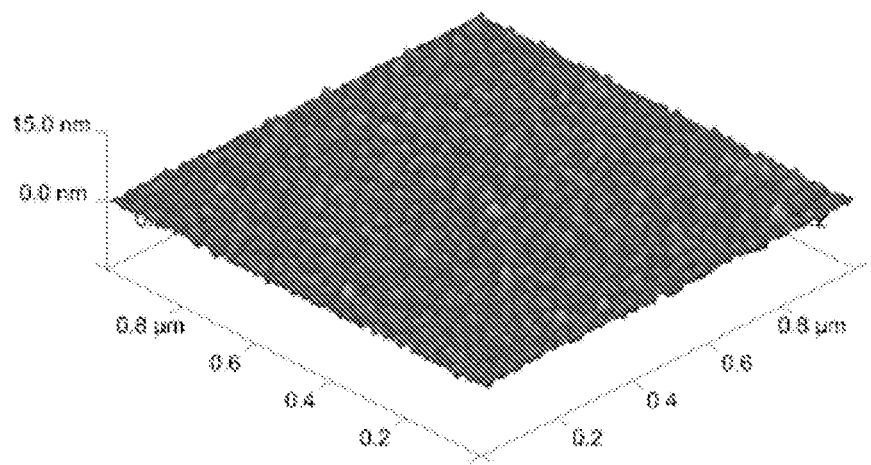
Figure 19C:
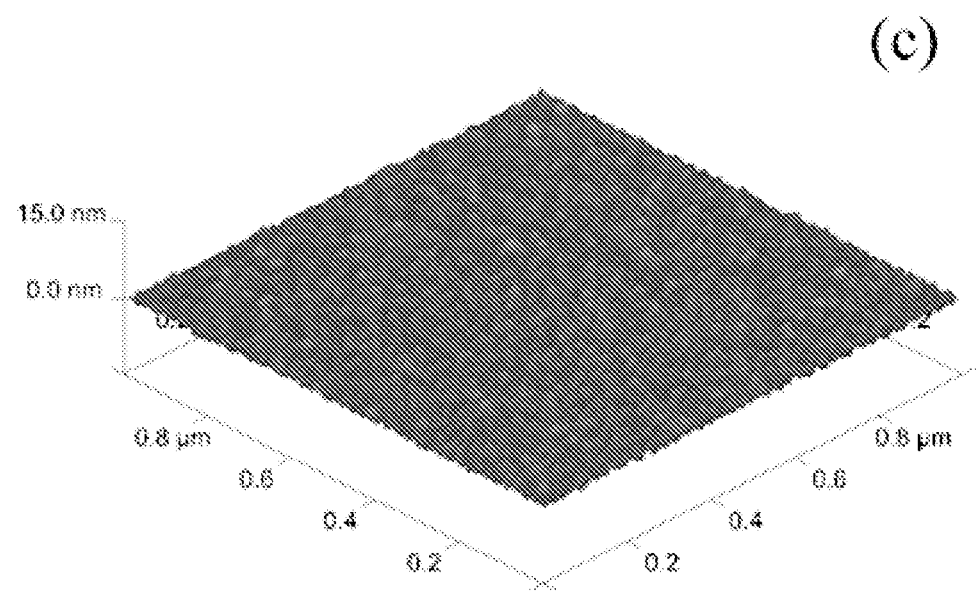
Figure 19D:
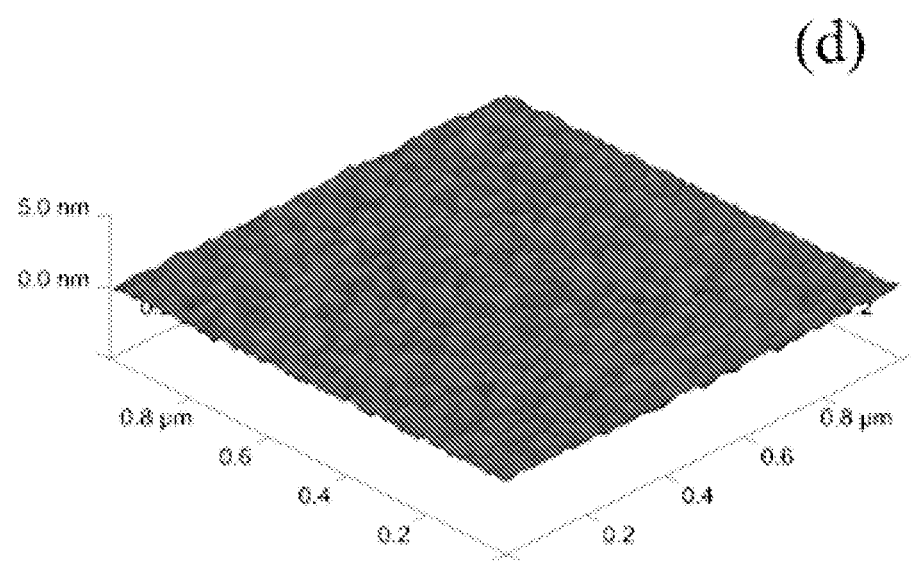

FIGS. 19(a)-19(d) show the AFM images of the surface morphology of 15 nm pure Ag film, 6 nm and 15 nm Al-doped Ag films (referred to herein as AA-130) on $SiO_2$/Si(100) over a scan size of 1 μm×1 μm. Thus, representative surface morphologies by AFM are provided in FIG. 19(a) for a 15 nm pure Ag film on $SiO_2$/Si(100), FIG. 19(b) is a 15 nm Al-doped Ag (AA-130) film on $SiO_2$/Si(100), FIG. 19(c) is a 6 nm AA-130 film on $SiO_2$/Si(100), and FIG. 19(d) is the $SiO_2$/Si(100) substrate. The 15 nm Ag film has an RMS roughness of 6.87 nm, which is about 16 times larger than the 15 nm Al-doped Ag (AA-130) film (0.43 nm). The 6 nm AA-130 film has a RMS roughness of 0.37 nm, and the RMS roughness of a $SiO_2$/Si(100) substrate is 0.10 nm.

As a reference, the surface morphology of a $SiO_2$/Si(100) substrate is shown in FIG. 19(d). The pure Ag film on $SiO_2$/Si(100) is very rough with an RMS roughness of 6.87 nm. In high contrast, the Al-doped Ag film with a thickness of 15 nm is much smoother than pure Ag film, with a RMS roughness of only 0.43 nm (FIG. 19(b)), which is one sixteenth of that of pure Ag film. The height histogram indicates the peak-to-valley height difference and the deviation from the average surface-height value. A peak-to-valley height of the pure Ag film has a wide distribution with the average value of 25.6 nm and the maximum value of 48.9 nm, which is consistent to the measured rough surface morphology. The Al-doped Ag film has a narrow peak-to-valley height distribution with the average value of 3.1 nm and the maximum value of 4.5 nm. FIG. 19(c) also shows a smooth 6 nm Al-doped Ag film with a similar surface roughness. This further demonstrates the ultrasmooth surface morphology of the Al-doped Ag film.

Figures 20A, 20B:
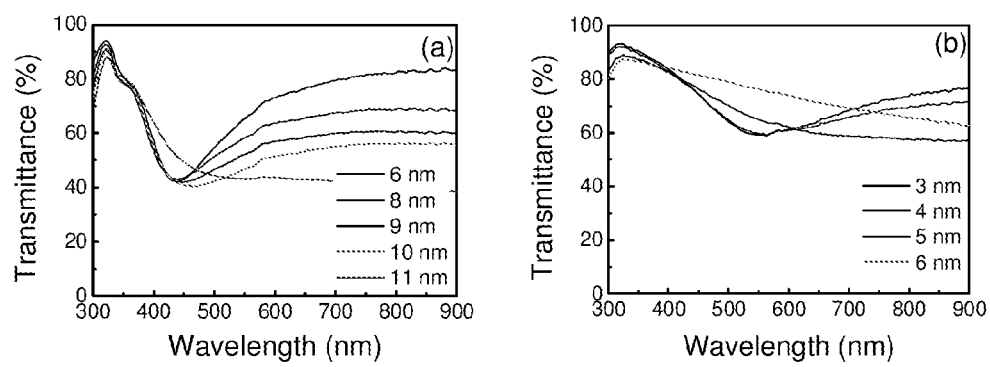

FIG. 20(a) shows transmittance spectra of comparative pure Ag films at thicknesses of 6 nm, 8 nm, 9 nm, 10 nm, and 11 nm. FIG. 20(b) shows Al-doped Ag (AA-130) films according to certain aspects of the present disclosure having thicknesses of 3 nm, 4 nm, 5 nm, and 6 nm. Al-doping not only results in ultrasmooth surface morphology, but also greatly reduces the percolation threshold of forming a continuous film from 11 nm for pure Ag films to 6 nm for Al-doping Ag films, according to the results from electrical measurement and optical measurement. Pure Ag films are electrically non-conductive until the thickness reaches 11 nm. In comparison, the Al-doped Ag (AA-130) film according to certain variations of the present disclosure becomes conductive at a thickness of 6 nm. Moreover, at 6 nm, the surface of Al-doping Ag films remains smooth as shown in FIG. 19(c).

FIGS. 20(a)-20(b) show the transmittance spectra of pure Ag films and Al-doped Ag (AA-130) films with different thicknesses deposited on the fused silica substrates. There is a broad dip for the pure Ag and Al-doped Ag films when the thickness is less than the percolation threshold. This originates from the localized surface plasmon resonance (LSRP) of electrically discontinuous metal island films. Once the thickness of films reaches the percolation threshold and beyond, the reflection increases towards the infrared regime, as is the case of a typical continuous metal film, leading to a gradual decrease in the film transmittance. The 6 nm Al-doped Ag (AA-130) film is highly transparent with the transmission of over 65% in the whole visible range (400 nm to 800 nm). Such ultrathin continuous Al-doped Ag film are particularly suitable for the transparent conductor applications due to the high transmission and electrical conductivity.

Figure 21:
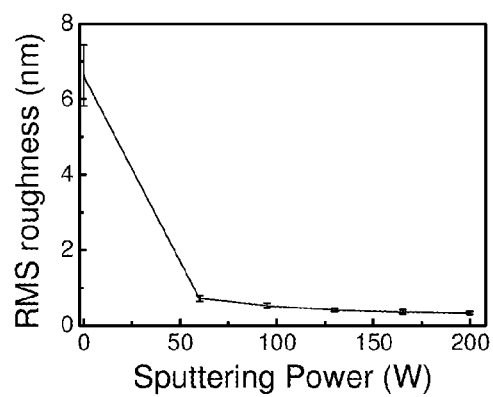

FIG. 21 shows RMS roughness of Al-doped Ag films co-deposited by the different sputtering power of Al target with 200 W power of Ag target. The effect of Al concentration in the film on the surface morphology is evaluated by varying the sputtering power of the Al target. FIG. 21 shows the RMS roughness of the Ag film and Al-doped Ag films deposited with different sputtering power of the Al target. The RMS roughness of Ag film is greatly decreased from 6.5 nm to 0.7 nm even by introducing a small amount of Al using 60 W sputtering power for Al. 60 W is the lowest sputtering power that can sustain a stable glow discharge for the Al target in the current magnetron sputtering system. The RMS roughness is further decreased to about 0.4 nm with increasing the sputtering power of Al target to 130 W. This observation reveals that Al-doping remarkably reduces the roughness of Ag films.

Figure 22:
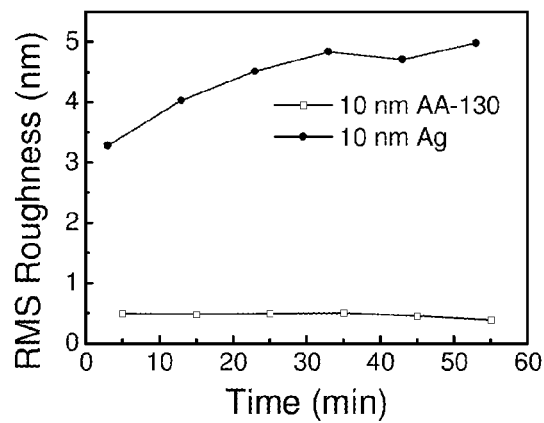

FIG. 22 shows an evolution of RMS roughness of 10 nm pure Ag film and 10 nm an Al-doped Ag film (AA-130) according to certain variations of the present disclosure with time under ambient atmosphere at room temperature. Another interesting observation is that the Al-doped Ag film exhibits drastically improved stability. The effect of Al-doping on the stability of Ag films is evaluated first at room temperature. The RMS roughness for the same region of the 10 nm pure Ag film and AA-130 film under ambient atmosphere at room temperature is characterized by AFM at 5, 15, 25, 35, 45, and 55 minutes respectively after the film deposition, as shown in FIG. 22. The RMS roughness of 10 nm pure Ag film increases from 3.3 nm to 4.8 nm when the aging time extends from 5 minutes to 35 minutes, while there is no obvious change of the RMS roughness for 10 nm AA-130 films even after 55 minutes. This indicates that quick coalescence occurs for 10 nm pure Ag films within 35 minutes, but the surface morphology of 10 nm Al-doped Ag film is very stable under ambient atmosphere at room temperature. The stability difference of the surface morphology between pure Ag films and Al-doped Ag films can be further demonstrated by comparing the 3D AFM surface morphology recorded after 5 minutes with that from 55 minutes. It can be clearly observed that Al-doping greatly improves the stability of the surface morphology of Ag films at room temperature.

The effect of Al-doping on the stability of Ag films is also evaluated at elevated temperature. FIGS. 23(a)-23(d) compare the change of surface morphology of 15 nm pure Ag film and 15 nm Al-doped Ag (AA-130) film after annealing for 15 minutes in a Nitrogen atmosphere at 300° C. Pure Ag films evolved from a rough, but continuous film (FIG. 23(a)) into isolated islands (FIG. 23(b)) after annealing due to dewetting, which is a typical behavior for pure Ag films on a dielectric substrate at elevated temperature. In contrast, 15 nm annealed AA-130 film shows very similar ultrasmooth surface morphology to the as-deposited one (FIG. 23(c) and FIG. 23(d)). AFM images (shown as the insets in FIG. 23(c) and FIG. 23(d)) further demonstrate that there is no obvious difference of the surface morphology and RMS roughness before and after the annealing. These results reveal that Al-doping results in outstandingly thermally-stable and ultrasmooth Ag based films, which provides a promising opportunity for many nanophotonic devices requiring ultrasmooth surface morphology and relatively high-temperature processes.

Figures 24A, 24B, 24C, 24D:
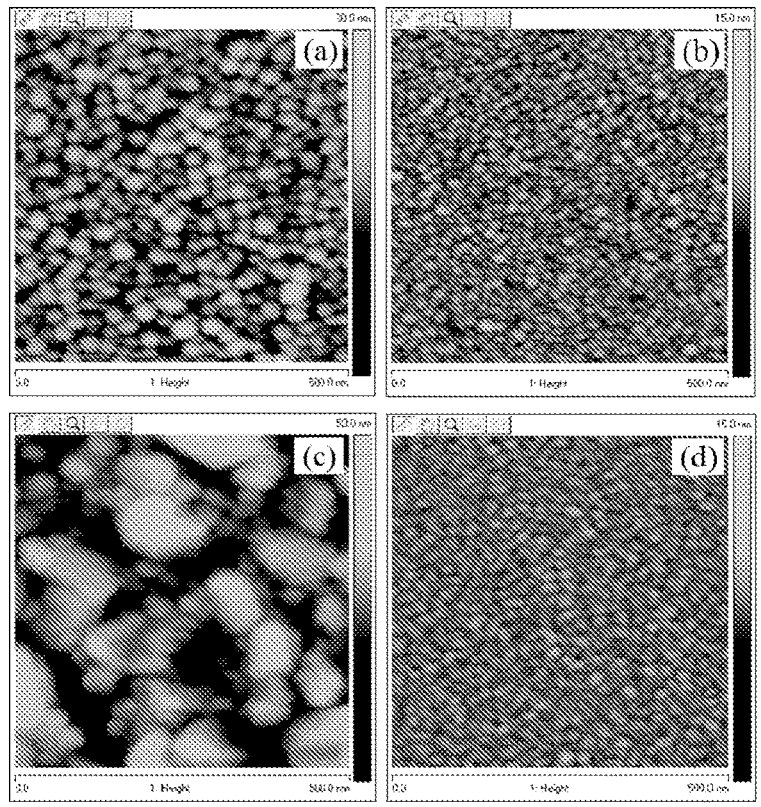

The reason for the ultrasmooth surface morphology and lower percolation threshold of Al-doped Ag films could be due to that a small amount of Al may strongly influence the nucleation and subsequent growth of Ag films on oxide substrate. In order to investigate the effect of Al-doping on the nuclei density of Ag films, the surface morphology of pure Ag and Al-doped Ag (AA-130) films with nominal thickness of 3 nm is measured by AFM. 2D AFM images of FIG. 24(a) 3 nm pure Ag films, FIG. 24(b) 3 nm Al-doped Ag films, FIG. 24(c) 15 nm pure Ag films, and FIG. 24 (d) 15 nm Al-doped Ag films on $SiO_2$/Si(100) substrates. FIGS. 24(a) and 24(b) show that Al-doping results in smaller and denser particles than those in the pure Ag films. This indicates that Al-doping causes the increase of the nuclei density of films. The nuclei density and particle size of metal films are related to the diffusion rate of the metal atoms on the dielectric surface. The metals with smaller diffusion rate on the surface exhibit higher nuclei density and smaller particle size. The diffusion rate of the metal atoms on oxide substrates generally decrease with the increase of metal-oxygen bond strength. The bond strength of Al—O bonds is much larger than that of Ag—O bonds, as a result, the average diffusion distance of Al atoms on the surface of $SiO_2$ is smaller than that of Ag atoms, and that Al atoms are easier to be immobilized on the surface of $SiO_2$ than Ag. Therefore, Al-doping results in an enhanced density of heterogeneous nucleation sites, thus larger nuclei density and smaller particle size.

The effect of Al-doping on the subsequent growth of Ag films is also evaluated by comparing the surface morphologies of the nucleation layer (FIGS. 24(a) and 24(b)) with those of 15 nm thick films for both pure Ag films (FIG. 24(c)) and AA-130 films (FIG. 24(d)), respectively. For pure Ag films, due to the high mobility of Ag atoms the small particles coalesce into larger ones during the film growth from 3 nm to 15 nm, leading to increased RMS roughness. Different from pure Ag films, the particle size of AA-130 films is slightly increased from 15-25 nm to 25-30 nm when the thickness increases from 3 nm to 15 nm. Moreover, the surface morphology became even smoother. These results indicate that the presence of Al in Ag films reduces the surface diffusion and mass transportation of Ag and restrains the Ag particle size expansion during the film growth.

Figures 23A, 23B, 23C, 23D:
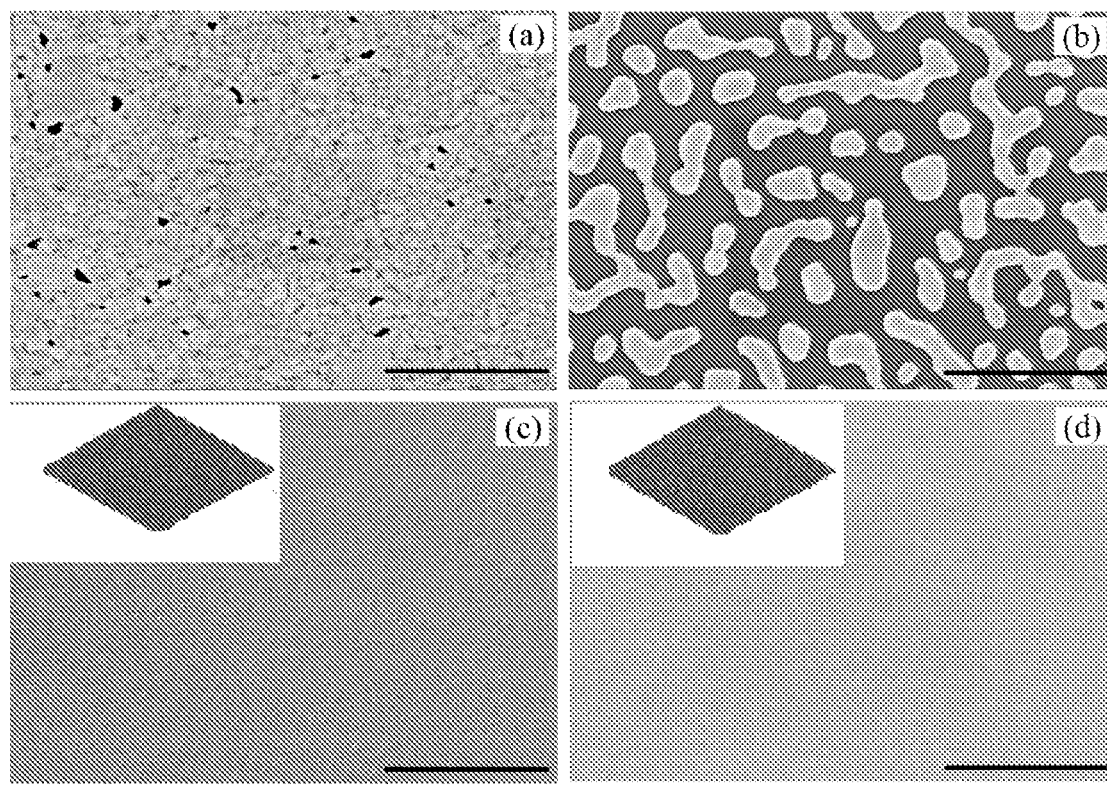

To investigate the mechanism that Al-doping restrains the surface diffusion and mass transportation of Ag, the depth profiling along with the analysis of the chemical states of elements are carried out by XPS. Considering that there are still voids present in the electrically-continuous pure Ag film of 15 nm thickness (as shown in FIG. 23(a)), thicker Ag and Al-doped Ag AA-130 films (50 nm), which can completely cover the surface of the substrate, are used for XPS analysis.

Figures 25A, 25B:
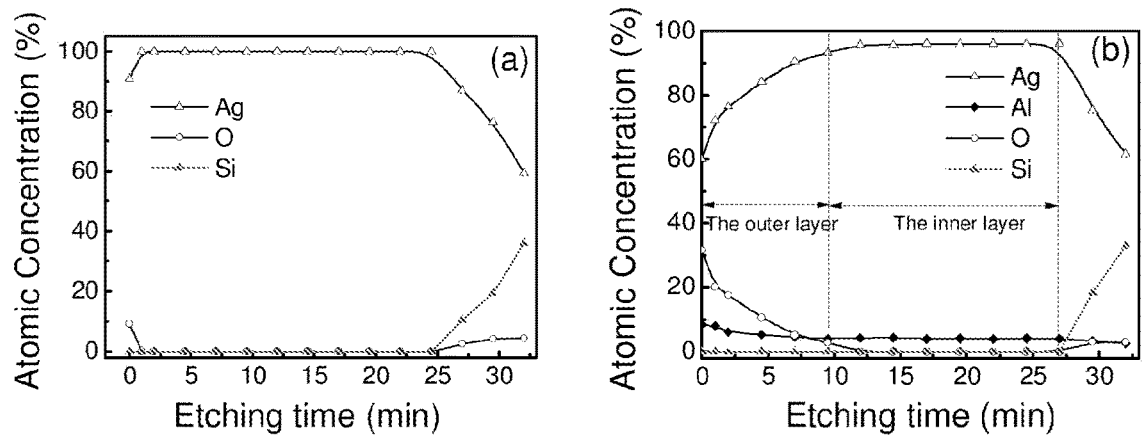

FIGS. 25(a)-25(b) show composition depth profiles of 50 nm pure Ag film (FIG. 25(a)), and ones of 50 nm Al-doped Ag (AA-130) films according to certain aspects of the present disclosure (FIG. 25(b)) by depth XPS characterization of the etched surface from top to the substrate interface. Oxygen is detected only at the surface of the as-prepared sample and when reaching the interface between film and substrate. Close to the interface between the film and substrate, O and Si can be probed after the film etched for 24.5 minutes. For 50 nm AA-130 film, oxygen can be detected from the outer surface of film and throughout the newly-formed surface after 9.5-minute etching as shown in FIG. 25(b). Considering that there is no oxygen produced during sputtering, oxygen in Al-doped Ag films should originate from the ambient atmosphere after deposition. Furthermore, Al-enriching feature can be clearly observed in the outer layer of AA-130 films (FIG. 25(b)). The atomic concentration of Al drops gradually from about 8% for the outermost surface to about 4% for the newly-formed surface after 9.5-minute etching. After that, the atomic concentration of Al is almost constant as 4% in the inner layer. This implies the outward diffusion of Al together with the inward diffusion of oxygen.

It is well-known that Al has much more negative standard heat of formation of oxides than most of metal elements. Therefore, Al tends to be oxidized easily when it is exposed to Oxygen-containing atmosphere. For Al-doped Ag films, oxygen atoms from ambient atmosphere diffused into film and Al atoms in the film diffused outwards, Al—O bonds are spontaneously formed in order to decrease the free energy of film system. As a result, Al-doped Ag films consist of two layers: an outer layer containing Al—O bonds and an inner layer composed of Ag and Al. Al—O bonds in an outer layer can be further demonstrated by analyzing the chemical state of Al. The existence of Al—O bonds with high stability makes the outer layer act as a capping layer on the Al-doped Ag films. The capping layer restrains the surface diffusion and mass transportation of Ag atoms, which empowered the Al-doped Ag film with the high stability of the ultrasmooth surface morphology at room temperature and even at elevated temperature.

Al-doping in a silver film is believed to enhance the nuclei density of films on oxide surface due to much larger bond strength of Al—O bonds than Ag—O bonds. The existence of Al in Ag films is also believed to cause the inward diffusion of O from the ambient atmosphere and the outward diffusion of Al, thus forms a capping layer containing Al—O bonds with high stability over the Al-doped Ag inner layer. As a result, the Al-doped Ag films have a sub-nanometer RMS roughness. More importantly, the ultrasmooth surface morphology of Al-doped Ag films is very stable at both room temperature and elevated temperature. This approach not only provides a novel method for fabricating transparent conductive films by greatly decreasing the thickness percolation threshold of continuous Ag-based films, but also many applications for nanophotonic devices requiring ultrasmooth surface morphology and relatively high-temperature processes.

Figure 28:
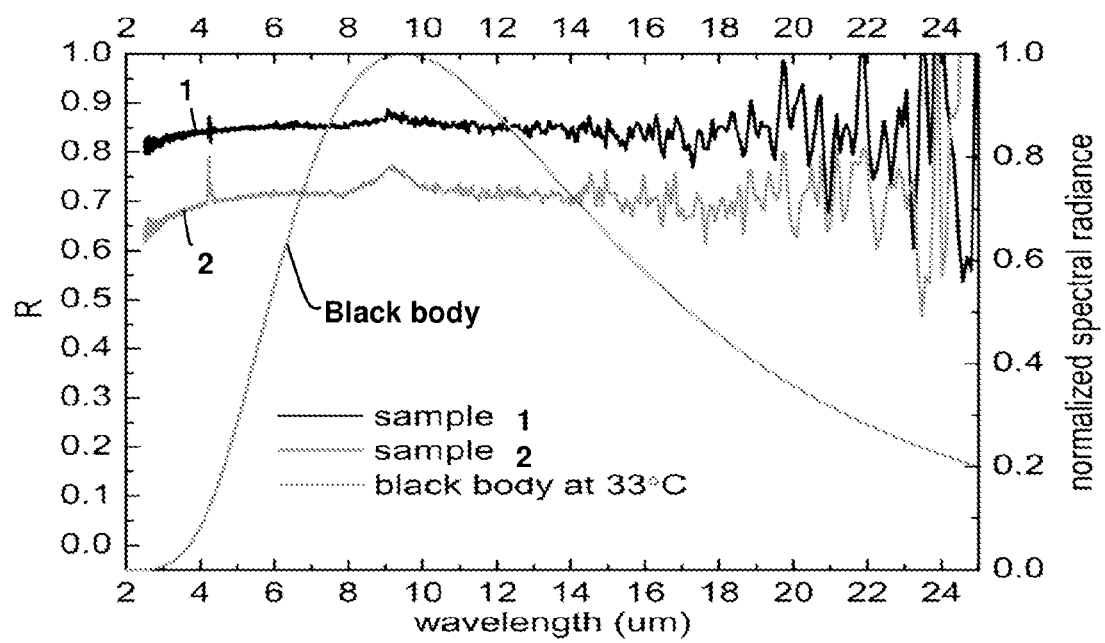
FIG. 28 shows reflectance of an Ag—Al alloy thin film made in accordance with certain aspects of the present disclosure having a normalized spectral radiance of a black body at 33° C. The black curve represents a first film sample (Sample 1) having a thickness of about 10 nm and the red curve represents a second film sample (Sample 2) having a thickness of about 6 nm.

Another unique feature of the electrically conductive thin metal based transparent conductor films prepared according to certain variations of the present disclosure is that they can effectively reflect light in the IR range (FIG. 28). FIG. 28 shows reflectance of wavelengths (micrometers) for a first sample and a second sample of Al-doped Ag alloy thin films prepared in accordance with certain aspects of the present disclosure. FIG. 28 also includes a normalized spectral radiance of a black body at 33° C. The black curve represents the first sample having a thickness of about 10 nm and the red curve represents a second sample having a thickness of about 6 nm. This makes such electrically conductive thin films attractive for window applications. A combination of ITO and a thin and stable Ag-doped film in accordance with certain aspects of the present disclosure can be used to improve the conductivity and block IR light, while improving the stability of windows that use electrochromic or phase change materials.

Organic solar cells (OSCs) or OPVs have been extensively studied, potentially as a future photovoltaic (PV) technology for clean energy production by their low cost, mechanical flexibility, large scale, and light weight. Power conversion efficiencies (PCEs) of OSCs have been boosted to 10% or higher in terms of the enhancement on light harvesting and charge transport making the technology more feasible for widespread implementation. For OSCs, transparent, conductive, and mechanically flexible electrodes are desired; however, the most commonly used Indium Tin Oxide (ITO) transparent electrode fails to provide good performance with regard to mechanical flexibility and good transparency for a broader range of wavelengths. As an alternative, pure silver (Ag) electrodes have been used with such OSCs and have high electrical conductivity and improved mechanical stability as compared to ITO on flexible substrates. Ag usually forms two types of electrodes: nanostructures and planar thin films. Ag nanostructures, such as mesh structures and nanowire networks, can be achieved by complex fabrication processes and they have certain advantages, such as high transmittance and relatively low sheet resistance. However, it is difficult to form defect-free Ag nanostructures over a large area and there is no conductivity between wires unless an additional conductive layer is added.

Compared with nanostructures, planar Ag thin films can be easily grown without defects over a large area and applied to semitransparent windows and tandem architecture. Further, a resonant optical cavity is created between the highly transparent thin Ag film and an opaque back contact metal electrode, thus trapping light inside the active layer and boosting the device efficiency. However, Ag follows a 3D growth mode as discussed previously above. During deposition, Ag atoms first agglomerate into isolated islands, and as the deposition continues, these islands finally connect to each other and form a continuous film. On one hand, a certain threshold of thickness (usually well in excess of 10 nm) is required to form a continuous and conductive Ag film. Though the conductivity is satisfied by a thicker film, the transparency is inevitably compromised. On the other hand, the roughness of a continuous Ag film is large (root-mean-square (RMS) roughness of 6 nm for 15 nm Ag film), resulting in additional light scattering loss. Moreover, because most OSCs have a thickness of around a few hundred nanometers, a rough surface could easily result in electrical shorts between electrodes, especially for large-area devices. To address the issues mentioned above, a wetting layer is usually placed underneath Ag film to promote the formation of continuous film below or around 10 nm.

Thus far, various wetting layers have been demonstrated by either dielectric materials ($MoO_3$, ZnO, $WO_3$, and $TeO_2$) or semiconductors/metals (Ge and Au). Semiconductors and metals are lossy in the visible band, leading to a reduced transparency.

The following experimental data will form a conductive and transparent thin (e.g., in certain embodiments down to 3-4 nm) Ag-based film prepared in accordance with certain aspects of the present disclosure by adding a wetting layer (Ta2O5) underneath the Al-doped Ag film. OSCs built on such thin films are shown to produce a PCE over 7%. In addition, this Ta2O5 layer works at the same time as an optical spacer to tune the optical field distribution in the entire solar cell without the need to change the other layers' geometries, locating the optical cavity resonance inside the active layer. The light harvesting of the active layer is enhanced in a certain range of its absorption spectrum while the absorption in the rest of the spectrum is not sacrificed (improved photon management), leading to enhanced PCEs. Moreover, devices fabricated on Ta2O5/Al-doped Ag electrodes have superior bending capability over ITO-based ones. Thus, assemblies of $Ta_2O_5$/Al-doped Ag films can serve as high-performance electrodes for OSCs with high transparency, low resistance, and improved photon management capability.

Ag tends to grow as isolated islands due to the Volmer-Weber growth mode. As discussed above, an Ag film as thin as 6 nm without any wetting layer can be formed by co-deposition of a small amount of Al during Ag deposition. The doped Al atoms contribute to an enhanced density of nucleation sites on the substrate, which facilitates the growth of continuous thin Ag film with a smooth morphology (e.g., an RMS roughness of 0.82 nm for 6 nm film).

Dielectric materials, such as MoO3 and TeO2, are known to promote continuous Ag film formation. Building on this approach, Ta2O5 is employed in this example as a wetting layer to further reduce the percolation threshold of a continuous Al-doped Ag film.

Film deposition is conducted as follows. The Al-doped Ag films are co-sputtered on fused silica substrates by a DC magnetron sputter tool (Kurt J. Lesker Co.) with Argon gas at room temperature. Before being loaded into the chamber, the fused silica substrates are cleaned with acetone and isopropyl alcohol. The chamber base pressure is pumped down to about $1\times10^{-6}$ Torr before sputtering. In the deposition, the Argon gas pressure was 4.5 mTorr and the substrate holder is rotated. The film is fabricated with 300 W Ag and 200 W Al target power for its better conductivity and transparency. The calibrated Ag deposition rate is 0.9 nm s$^{-1}$ and Al deposition rate is 0.06 nm s$^{-1}$. These slow deposition rates allow accurate control of the film thickness.

Film characterization is conducted as follows. The thicknesses of Al-doped Ag films are calculated based on the calibrated deposition rate, being subsequently confirmed by spectroscopic ellipsometry measurement (J. A. Woollam M-2000). The sheet resistance is measured by Miller FPP-5000 4-Point Probe. The transmittance spectra are recorded using UV-VIS-NIR spectrometer. For transmission measurement, the spectrum from a bare fused silica substrate is taken as the reference. Scanning electron microscopy (SEM) (Hitachi SU8000) and tapping mode atomic force microscopy (AFM) (Veeco NanoMan) are used to characterize the surface topography of films on fused silica substrate.

Control devices are fabricated on ITO coated glass substrates with a sheet resistance of 12 $\Omega sq^{-1}$. The substrates are cleaned in an ultrasonic bath with acetone and isopropyl alcohol for 10 min. The ITO surface was cleaned by oxygen plasma for 100 s. After sputtering, the $Ta_2O_5$/Al-doped Ag films and ITO substrate are transferred into a glove box filled with $N_2$ for ZnO coating. ZnO sol gel solution is prepared as reported and is spin-coated on top of ITO and $Ta_2O_5$/Al-doped Ag films, followed by baking at 70° C. for 5 min. Then ZnO sol gel coated substrates are taken out of glove box and baked at 150° C. for 15 min in air, forming a 40 nm ZnO layer. After baking, the substrates are transferred into the glove box again for polymer active layer deposition. A blend solution made of poly[4,8-bis-(2-ethylhexyloxy)-benzo[1,2b:4,5b0]dithiophene-2,6-diyl-alt-4-(2-ethylhexyloxy)-thieno-[3,4b]thiophene-2,6-diyl](PBDTTT-C-T) (Solarmer) and [6,6]-phenyl C71-butyric acid methyl ester (PC70BM) (American Dye Sources Inc.) with a weight ratio of 1:1.5 in chlorobenzene (25 mg/mL) with 3 vol. % 1,8-diiodoctane (DIO, Sigma-Aldrich) is spin-coated onto ITO and Al-doped Ag substrates to form an active layer. Subsequently, $MoO_3$ (10 nm) and Ag (100 nm) are evaporated sequentially ($1 \times 10^{-6}$ mbar) (Kurt J. Lesker). The final cells have an isolated electrode with a diameter of 1 mm. The device architecture is shown in FIG. 30(d). The inverted devices in this example have a layer assembly structure of ITO/ZnO/PBDTTT-C-T:PC70BM/MoO$_3$/Ag (comparative example) or Ta$_2$O$_5$/Al-doped Ag/ZnO/PBDTTT-C-T:PC70BM/MoO$_3$/Ag (inventive example).

The current density-voltage (J-V) characteristics are measured using a Keithley 2400 system while illuminating the solar cells with AM 1.5 G simulated sunlight generated by an Oriel Solar Simulator at an irradiation intensity of 100 mW/cm$^2$. The incident power intensity at one sun (100 mW cm$^{-2}$) is calibrated using a Si reference cell. The devices are measured in the atmosphere without any encapsulation. The EQE measurement is performed in a nitrogen glove box and EQE spectra are obtained using light from a 200 Hz-chopped and monochromated Xenon-lamp, calibrated against a silicon solar cell.

First, compared with 6 nm Al-doped Ag film formed directly on fused silica substrates, the insertion of a Ta2O5 layer helps further reduce the film percolation threshold down to 4 nm. FIGS. 29(a) and 29(b) show the scanning electron microscopy (SEM) images of 4 nm and 5 nm Al-doped Ag film on Ta2O5 layer (10 nm). The film is continuous and has a uniform morphology, which is further confirmed by the atomic force microscope (AFM) image in FIG. 29(d) (for 4 nm film). The RMS roughness of 4 nm Al-doped Ag on Ta2O5 is as low as 0.76 nm and that of 5 nm Al-doped Ag on Ta2O5 is 0.72 nm. In sharp contrast, 7 nm pure Ag on Ta2O5 shown in FIG. 29(c) is still discontinuous and consists of tiny isolated islands.

FIG. 31(a) shows the transmittance spectra of Ta$_2$O$_5$ (10 nm)/Al-doped Ag films with varying Al-doped Ag layer thicknesses from 4-7 nm. The depositions of all Al-doped Ag films have the calibrated rates of Al at 0.06 nm s$^{-1}$ and Ag at 0.9 nm s$^{-1}$. The films with less than 7 nm Al-doped Ag exhibit flat and averaged 75% transmission in the entire range. It is worthy to note that the 7 nm film has higher transmission than thinner films. This is because thinner films have more defects at an early stage of continuous film formation and thereby larger optical loss coefficient. For the application of such ultrathin film as electrode in OSCs, a 40 nm thick ZnO electron transport layer (ETL) is spin-coated onto Ta$_2$O$_5$ (10 nm)/Al-doped Ag film. Adding a ZnO layer further increases the transmittance of such electrode over 80% in the entire spectrum, especially for 7 nm Al-doped Ag whose transmission is promoted to be 96% at 550 nm (FIG. 31(b)). This is because ZnO acts as an anti-reflection coating. The sheet resistances of Ta$_2$O$_5$ (10 nm)/Al-doped Ag (thicknesses of 4 nm, 5 nm, 6 nm, and 7 nm) are 46.8, 33.8, 30.1, and 23.1 Ω/sq, respectively, rational for the application in OSCs.

FIG. 32(a) shows the J-V characteristics of an OSC device with Ta$_2$O$_5$/Al-doped Ag (4 nm) as an electrode. The device geometry is shown in FIG. 30(d). The device with 4 nm Al-doped Ag has a PCE of 7.12% with a short-circuit current density (Jsc)=14.3 mA/cm$^2$, open-circuit voltage ($V_{oc}$)=0.80 V, and fill factor (FF)=62.2%. Its corresponding EQE spectrum is shown in FIG. 32(b), exhibiting broad spectral response with a peak EQE of 62% at 655 nm. It is believed to be the thinnest Ag layer as an electrode in an efficient OSC. These results indicate that 4 nm Al-doped Ag is continuous and conductive to produce identical $V_{oc}$ with ITO control one and also reasonable FF.

Including a Ta$_2$O$_5$ wetting layer on a substrate reduces the Al-doped Ag film percolation threshold down to a thickness of 4 nm, and such a thin film works as an effective electrode in OSCs. The PCE (in terms of light harvesting) of a given OSC device could be further optimized through resonant cavity light trapping by adjusting the Ta$_2$O$_5$ layer thickness. Although PCE is highly correlated to light absorption, increasing active layer thickness is a straightforward way to increase light absorption, but not always an efficient approach to boost PCE. This is because of the short exciton diffusion length and low carrier mobility in organic semiconductors, which results in high recombination rate of photo-generated charge carriers during transport towards their individual electrode before being extracted. The above physical limitations indicate that a relatively thin photoactive layer is desired, as long as the light absorption efficiency is not compromised at the same time. To achieve this goal, light trapping plays an important role in obtaining strong light absorption without relying on the increase of photoactive layer thickness. By selecting a predetermined Ta$_2$O$_5$ layer thickness, a resonance cavity can be formed between top and bottom electrodes, with enhanced light field located in the active layer. The light harvesting of the active layer could be further enhanced in a certain range of its absorption spectrum, while the absorption in the rest of the spectrum is not sacrificed too much (improved photon management), leading to enhanced PCEs. Because a Ta$_2$O$_5$ layer is an outmost layer of the entire device and only works as an optical spacer rather than a charge transport layer, changing its thickness would not affect the electrical performance in the devices.

Generally, the thickness of semitransparent metal electrode would influence the resonant cavity intensity in the active layer due to its transmission and reflection. Therefore, the Jsc of the devices is simulated by varying the Al-doped Ag thickness and fixed 15 nm Ta$_2$O$_5$ and identical thicknesses of other layers. The Jsc of the device decreases slightly with Al-doped Ag thickness, indicating a negligible effect when Al-doped Ag thickness is lower than 8 nm. Considering that 7 nm Al-doped Ag film (23 Ω/sq) has a smaller sheet resistance than 5 or 6 nm film (>30 Ω/sq), 7 nm Al-doped Ag film is chosen to study the effect of Ta$_2$O$_5$ thickness.

The transmittance spectra of Ta2O5/Al-doped Ag (7 nm) with varying Ta2O5 thickness are shown in FIG. 30(a). It can be seen that the transmittance peak shifts towards longer wavelength with the increase of Ta$_2$O$_5$ thickness from 5 to 30 nm. Beyond the peak, the transmittance gradually decreases as a function of wavelength since the reflection of Al-doped Ag film increases in the near infrared (NIR) range. Coating a ZnO layer (at 45 nm thickness) on top further increases the transmittance, as shown in FIG. 30(b). The transmittance becomes higher and flatter in the range of 400-800 nm. For example, the maximum transmittance is 96% at 550 nm for Ta2O5 (15 nm)/Al-doped Ag (7 nm)/ZnO (40 nm) film. FIG. 30(c) shows the comparison of optical transmittance (at 550 nm) versus sheet resistance for an embodiment according to the present teachings (Ta$_2$O$_5$/Al-doped Ag/ZnO) and other comparative thin Ag films. A Ta$_2$O$_5$/Al-doped Ag/ZnO electrode appears to give better or comparable performance than others.

To evaluate the effect of Ta$_2$O$_5$/Al-doped Ag electrode on resonant light harvesting, bulk heterojunction OSCs are built up on such electrode, consisting of a blend of PBDTTT-C-T and PC$_{70}$BM as a photoactive layer, which has a broad and strong absorption from 350 to 750 nm. For comparison, ITO is used as a control electrode. FIG. 30(d) shows the device geometry using ITO control and Ta$_2$O$_5$/Al-doped Ag electrodes with Ta$_2$O$_5$ thickness varying from 5 to 60 nm. 40 nm ZnO is first coated on all electrodes as an electron transport layer (ETL) and hole blocking layer, and 70 nm PBDTTT-C-T:PC$_{70}$BM layer is subsequently spin-coated with the same solution concentration and spinning speed. Finally, the top electrode is finished with 10 nm MoO$_x$ and 100 nm Ag.

FIG. 33(a) shows the comparison of the J-V characteristics of devices whose electrode is either ITO or Ta$_2$O$_5$/Al-doped Ag (7 nm) with varying thickness of Ta$_2$O$_5$ layer. The summary of the main photovoltaic parameters of comparative OPV devices with electrodes of ITO or Ta$_2$O$_5$/Al-doped Ag (7 nm) with varying thickness of Ta$_2$O$_5$ layer is tabulated in Table 3 that includes a summary of the main photovoltaic parameters of the devices with ITO and Ta2O5/Al-doped Ag (7 nm) with varying thickness of Ta2O5 layer.

TABLE 3

|  | JSC | Voc [V] | FF [%] | PCE [%] |
| --- | --- | --- | --- | --- |
| Ta$_2$O$_5$ = 5 nm | 16.43 | 0.80 | 62.4 | 8.20 |
| Ta$_2$O$_5$ = 10 nm | 16.17 | 0.80 | 64.0 | 8.28 |
| Ta$_2$O$_5$ = 15 nm | 16.92 | 0.80 | 63.3 | 8.57 |
| Ta$_2$O$_5$ = 20 nm | 16.63 | 0.80 | 63.6 | 8.46 |
| Ta$_2$O$_5$ = 25 nm | 16.40 | 0.80 | 64.2 | 8.42 |
| Ta$_2$O$_5$ = 30 nm | 15.75 | 0.80 | 65.5 | 8.25 |
| Ta$_2$O$_5$ = 50 nm | 15.68 | 0.80 | 65.5 | 8.21 |
| Ta$_2$O$_5$ = 60 nm | 15.81 | 0.80 | 65.4 | 8.28 |

The ITO-based device has a PCE of 8.22% with a Jsc=15.54 mA cm$^{-2}$, V$_{oc}$=0.80 V, and FF=66.1%. Devices built on Ta$_2$O$_5$/Al-doped Ag (7 nm) with varying thickness of Ta$_2$O$_5$ layer generate consistently better or comparable efficiency, compared with that made on ITO. With the increase of Ta$_2$O$_5$ thickness from 5 nm to 60 nm, the Jsc increases significantly and the FF decreases slightly, producing a maximum PCE of 8.57% at Ta$_2$O$_5$=15 nm. All devices have identical V$_{oc}$'s of 0.8 V, indicating that no voltage loss is exhibited at both anode and cathode electrode for either ITO or Ta$_2$O$_5$/Al-doped Ag (7 nm) by the use of interfacial metal oxide layers, MoO and ZnO. The FFs of ITO and Ta$_2$O$_5$/Al-doped Ag (7 nm) based devices are comparable, due to the good contacts of ITO or Ta$_2$O$_5$/Al-doped Ag (7 nm) with ZnO layer. Therefore, the increased PCE of Ta$_2$O$_5$/Al-doped Ag based devices is believed to primarily result from the enhancement in Jsc.

FIG. 33(b) shows the external quantum efficiencies (EQEs) of the devices with ITO and Ta$_2$O$_5$/Al-doped Ag (7 nm) with varying thickness of Ta$_2$O$_5$ layer as electrodes. Their spectral responses reflect the capability of converting photons to electrons at a certain wavelength. ITO based device, in which the former exhibits significant enhancement in certain wavelength ranges over ITO based device. Specifically, the EQE enhancements for selected thickness of Ta$_2$O$_5$ layer (thicknesses of 5, 15, 20, 25, 30, and 50 nm) are shown in FIG. 33(c). For all cases except 50 nm Ta$_2$O$_5$, Ta$_2$O$_5$/Al-doped Ag (7 nm) based devices have two enhanced EQE regimes compared to ITO based one. With the increase of Ta$_2$O$_5$ layer thickness, the enhancement at shorter wavelength gets more prominent, while the other one at longer wavelength becomes weaker. It is worth noting that 15 nm Ta$_2$O$_5$ device obtains a consistently enhanced EQE from 430 to 780 nm, leading to the highest photocurrent enhancement and the highest PCE of 8.57% among all devices.

Figures 34A, 34B, 34C, 34D:
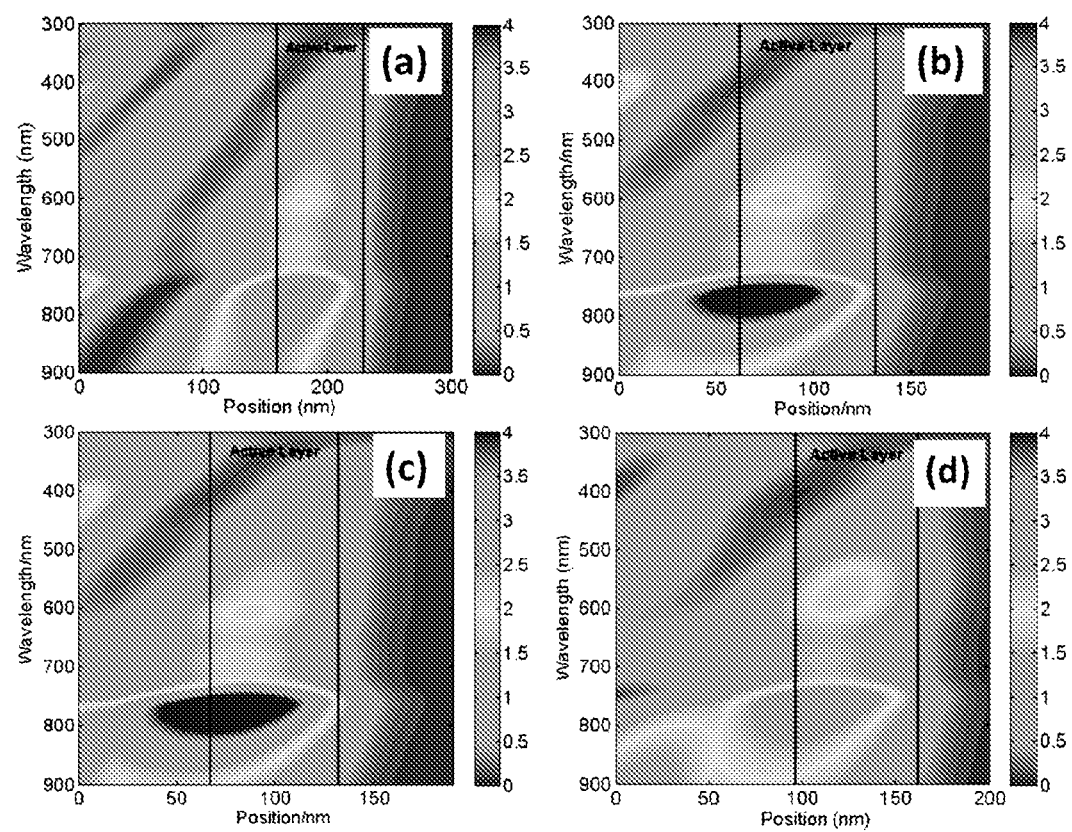

To verify the origin of the EQE enhancement in Ta$_2$O$_5$/Al-doped Ag (7 nm) based devices, the optical field intensity (|E|$^2$) distribution versus position and wavelength is simulated by one dimensional (1D) transfer matrix method, since light absorption and photocurrent generation in the active layer are strongly correlated with the optical field intensity. The light is incident normal to the glass substrate and the optical field intensity |E|$^2$ inside the solar cell is averaged over p and s polarizations and normalized to the incoming field intensity. The field intensity profiles inside the comparative ITO based OPV device and the Ta$_2$O$_5$ (15 nm)/Al-doped Ag (7 nm) based OPV device according to certain aspects of the present disclosure are shown in FIGS. 34(a) and 34(c).

There is a strong field enhancement ranging from 750 to 850 nm in a Ta$_2$O$_5$ (15 nm)/Al-doped Ag (7 nm) based device, and a weak field enhancement between 500 and 650 nm, in agreement with measured EQE enhancement. When the thickness of Ta$_2$O$_5$ layer increases from 5 to 50 nm, the resonance at longer wavelength (750 to 850 nm) gets weaker, while the resonance at shorter wavelength (500 to 650 nm) becomes stronger (FIGS. 33(c)-33(d)). This trend is also consistent with measured EQE. The optical field distribution is modulated by solely varying thickness of Ta$_2$O$_5$ layer, which is at the outmost of the entire device and does not function as a charge transport layer. Therefore, there is no limit in the Ta$_2$O$_5$ layer thickness or any requirement on modification of other layers in the device, making this approach universal and easy-to-apply.

To further demonstrate the general applicability of inventive technology, devices using Ta$_2$O$_5$/Al-doped Ag as electrodes, but with a thinner active layers (e.g., having a thickness of about 50 nm) are also fabricated. Similarly, by adjusting only the Ta$_2$O$_5$ layer thickness, the device performance can be optimized comparable to an ITO control device. The thickness of the semitransparent metal electrode can influence the resonance effect inside the active layer in terms of the enhanced light intensity and spectrum width, thus affecting the solar cell performance. FIGS. 36(a)-36(d) show a simulation of the optical field intensity (|E|$^2$) distribution versus position and wavelength with varying Al-doped Ag electrode thicknesses at 4 nm (FIG. 36(a)), 7 nm (FIG. 36(b)), 10 nm (FIG. 36(c)) and 14 nm (FIG. 36(d)), while the Ta$_2$O$_5$/ZnO/PBDTTT-C-T/MoO$_3$/Ag layer thicknesses are fixed at 15 nm/40 nm/70 nm/10 nm/100 nm, respectively. Varying the Al-doped Ag electrode thickness does not appear to change the resonant wavelength and location inside the device. This is because for the constructive resonance to happen, the light field needs to be in phase at a certain position for a certain wavelength. The optical phase is contributed to both by the propagation phase inside each layer and the reflection phase shift between layers, which are not much affected by varying the Al-doped Ag thickness within a relatively small range. However, varying the metal electrode thickness changes its reflectance/transmittance, thus affecting the enhanced field intensity as well as the spectrum width as shown in FIGS. 36(a)-36(d). For thin electrodes (e.g., thickness of about 4 nm), the resonance has a weak peak intensity, but a broad spectrum. When the electrode gets thicker (e.g., 7 nm and 10 nm), the peak intensity gets higher, but the spectrum width is compromised. If the electrode gets even thicker (e.g., 14 nm), both the peak intensity and spectrum width are reduced and this is believed to be attributable to the relatively high loss of the metal electrode.

To further study this Al-doped Ag electrode thickness on device performance, Jsc of solar cells is simulated with different Al-doped Ag electrode thicknesses while keeping the other layers unchanged. Two devices with different active layer thicknesses (50 nm and 70 nm) are studied, consistent with the experimentally demonstrated examples above. In each case, the $Ta_2O_5$ layer thickness is chosen to be the value corresponding to the maximum EQE (25 nm for 50 nm active layer device and 15 nm for 70 nm active layer device). The normalized Jsc is plotted in FIG. 35. For the 70 nm active layer device, the simulated current stays basically flat for the ultrathin Al-doped Ag films (e.g., less than 8 nm), with a maximum value at 6 nm Al-doped Ag layer thickness and then starts to decrease with the increase of metal electrode thickness. The Jsc of the 50 nm active layer device has a more evident dependence on the Al-doped Ag electrode thickness, with a maximum value with 8 nm thick Al-doped Ag layer. Therefore, a thin, smooth and low loss metal electrode formed in accordance with certain aspects of the present disclosure is advantageous for the resonant light harvesting in organic solar cells.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A device comprising an assembly that comprises:
a substrate; and
an electrically conductive transparent thin film comprising silver (Ag) at greater than or equal to about 90 atomic % of the total composition of the thin film and a conductive metal comprising aluminum (Al) present at greater than 2 atomic % to less than or equal to about 10 atomic % of the total composition of the thin film disposed directly on the substrate, the electrically conductive transparent thin film having a thickness of greater than or equal to about 6 nm to less than or equal to about 11 nm with a smooth surface having a root mean squared (RMS) surface roughness that is less than or equal to about 1 nm, so that the electrically conductive thin film is above a percolation threshold, has a sheet resistance of greater than or equal to about 10 Ohm/square to less than or equal to about 75 Ohm/square, and is transparent to electromagnetic light in a visible spectral range and an ultraviolet spectral range.

2. The device of claim 1, wherein the electrically conductive thin film has a sheet resistance of greater than or equal to about 10 Ohm/square to less than or equal to about 20 Ohm/square.

3. The device of claim 1, wherein the electrically conductive transparent thin film defines a first side and a second opposite side, wherein the substrate is adjacent to the first side and a second material is disposed on the second opposite side, and the second material comprises an electronic charge or ion transporting or blocking layer, a dielectric layer, or a two-dimensional (2-D) semiconductor.

4. The device of claim 3, wherein the second material comprises an electronic charge or ion transporting or blocking layer and the assembly further comprises a photovoltaic active material disposed adjacent to the electronic charge or ion transporting or blocking layer.

5. The device of claim 1, wherein the device is a photovoltaic cell or a light emitting diode and the assembly comprising the electrically conductive transparent thin film is a transparent conductive electrode (TCE) incorporated within the device.

6. The device of claim 1, wherein the electrically conductive transparent thin film defines a first side and a second opposite side, wherein the substrate is adjacent to the first side and a dielectric material is disposed on the second opposite side so that the assembly forms a metamaterial with predetermined optical and electrical properties.

7. The device of claim 1, wherein the electrically conductive transparent thin film defines an electrode.

8. The device of claim 7, wherein the electrically conductive thin film is reflective to electromagnetic light having a wavelength in an infrared spectral range.

9. The device of claim 7, wherein the device is a light emitting diode, a transparent or see-through display, a window that reflects infrared light, or a smart switchable window that incorporates the electrode.

10. The device of claim 1, wherein the electrically conductive transparent thin film reflects infrared light.

11. The device of claim 1, wherein the electrically conductive transparent thin film defines a first side and a second opposite side, wherein the substrate is adjacent to the first side of the electrically conductive thin film and a second material is adjacent to the second opposite side of the electrically conductive thin film.

12. The device of claim 11, wherein the second material comprises a dielectric material.

13. The device of claim 1, wherein the electrically conductive transparent thin film is annealed.

14. A method of making an assembly comprising an electrically conductive thin film for a device, the method comprising:
co-depositing silver (Ag) and a conductive metal comprising aluminum (Al) directly onto a substrate to form a continuous thin film comprising silver (Ag) at greater than or equal to about 90 atomic % of the total composition of the thin film and the conductive metal at greater than 2 atomic % to less than or equal to about 10 atomic % of the total composition of the thin film, wherein the thin film has a thickness of greater than or equal to about 6 nm to less than or equal to about 11, is electrically conductive having a sheet resistance of greater than or equal to about 10 Ohm/square to less than or equal to about 75 Ohm/square, has a smooth surface with a root mean squared (RMS) surface roughness that is less than or equal to about 1 nm so that the thin film is above a percolation threshold and is transparent to electromagnetic light in a visible spectral range and an ultraviolet spectral range.

15. The method of claim 14, wherein the co-depositing is via a physical vapor deposition (PVD) process or a sputtering process.

16. The method of claim 14, further comprising applying an electron transporting and hole blocking layer or a hole-transporting and electron-blocking layer onto the continuous thin film or applying a dielectric metal oxide material or a two-dimensional semiconductor material onto the continuous thin film.

17. A device comprising an assembly that comprises:
a substrate; and
an electrically conductive transparent thin film consisting essentially of silver (Ag) at greater than or equal to about 90 atomic % of the total composition of the thin film and aluminum (Al) present at greater than 2 atomic % to less than or equal to about 10 atomic % of the total composition of the electrically conductive transparent thin film disposed directly on the substrate and having a thickness of greater than or equal to about 6 nm to less than or equal to about 11 nm and a smooth surface with a root mean squared (RMS) surface roughness that is less than or equal to about 1 nm, so that the electrically conductive thin film is above a percolation threshold, has a sheet resistance of greater than or equal to about 10 Ohm/square to less than or equal to about 75 Ohm/square, and is transparent to electromagnetic light in a visible spectral range and an ultraviolet spectral range.

18. The device of claim 17, wherein the electrically conductive thin film has a sheet resistance of greater than or equal to about 10 Ohm/square to less than or equal to about 20 Ohm/square.

19. The device of claim 17, wherein the electrically conductive transparent thin film is annealed.

20. A device comprising an assembly that comprises:
a substrate; and
an electrically conductive transparent thin film comprising silver (Ag) at greater than or equal to about 90 atomic % of the total composition of the thin film and a conductive metal comprising aluminum (Al) present at greater than 2 atomic % to less than or equal to about 10 atomic % of the total composition of the thin film disposed directly on the substrate, the electrically conductive transparent thin film having a thickness of greater than or equal to about 6 nm to less than or equal to about 11 nm with a smooth surface having a root mean squared (RMS) surface roughness that is less than or equal to about 1 nm, so that the electrically conductive thin film is above a percolation threshold, has a sheet resistance of greater than or equal to about 30 Ohm/square to less than or equal to about 75 Ohm/square, and is transparent to electromagnetic light in a visible spectral range and an ultraviolet spectral range.

21. The device of claim 20, wherein the electrically conductive transparent thin film is annealed.

* * * * *